US 11,776,925 B2

(12) United States Patent
Simsek-Ege

(10) Patent No.: US 11,776,925 B2
(45) Date of Patent: Oct. 3, 2023

(54) METHODS OF FORMING MICROELECTRONIC DEVICES, AND RELATED MICROELECTRONIC DEVICES AND ELECTRONIC SYSTEMS

(71) Applicant: Micron Technology, Inc., Boise, ID (US)

(72) Inventor: Fatma Arzum Simsek-Ege, Boise, ID (US)

(73) Assignee: Micron Technology, Inc., Boise, ID (US)

(*) Notice: Subject to any disclaimer, the term of this patent is extended or adjusted under 35 U.S.C. 154(b) by 24 days.

(21) Appl. No.: 17/364,429

(22) Filed: Jun. 30, 2021

(65) Prior Publication Data
US 2023/0005855 A1    Jan. 5, 2023

(51) Int. Cl.
H01L 25/065    (2023.01)
H01L 25/18    (2023.01)
(Continued)

(52) U.S. Cl.
CPC .......... *H01L 24/08* (2013.01); *G11C 11/4085* (2013.01); *G11C 11/4091* (2013.01); *H01L 24/80* (2013.01); *H01L 25/0657* (2013.01); *H01L 25/18* (2013.01); *H01L 25/50* (2013.01); *H01L 2224/08145* (2013.01);
(Continued)

(58) Field of Classification Search
CPC ..... H01L 24/08; H01L 24/80; H01L 25/0657; H01L 25/18; H01L 25/50; H01L 2224/08145; H01L 2224/80896; H01L 2924/1431; H01L 2924/1436
See application file for complete search history.

(56) References Cited

U.S. PATENT DOCUMENTS 5,953,630 A    9/1999    Maeda et al.
8,067,286 B2    11/2011    Parekh et al.
(Continued)

FOREIGN PATENT DOCUMENTS

CN    112614853 A    4/2021
CN    112802855 A    5/2021
(Continued)

*Primary Examiner* — Thanh Y. Tran
(74) *Attorney, Agent, or Firm* — TraskBritt

(57) ABSTRACT

A method of forming a microelectronic device comprises forming a first microelectronic device structure comprising a first semiconductor structure, control logic circuitry at least partially overlying the first semiconductive structure, first back-end-of-line (BEOL) structures over and in electrical communication with the control logic circuitry, and first isolation material covering the control logic circuitry and the first BEOL structures. A second microelectronic device structure is bonded over the first BEOL structures to form a first assembly. The first assembly is vertically inverted. A third microelectronic device structure comprising a second semiconductor structure is bonded over the vertically inverted first assembly to form a second assembly. Memory cells comprising portions of the second semiconductor structure are formed after forming the second assembly. Second BEOL structures are formed over the memory cells. Microelectronic devices, electronic systems, and additional methods are also described.

30 Claims, 26 Drawing Sheets

(51) Int. Cl.
  *H01L 23/00* (2006.01)
  *H01L 25/00* (2006.01)
  *G11C 11/4091* (2006.01)
  *G11C 11/408* (2006.01)

(52) U.S. Cl.
  CPC ............... *H01L 2224/80896* (2013.01); *H01L 2924/1431* (2013.01); *H01L 2924/1436* (2013.01)

(56) References Cited

U.S. PATENT DOCUMENTS

| | | | |
|---|---|---|---|
| 8,153,499 B2 | 4/2012 | Or-Bach et al. |
| 8,184,471 B2 | 5/2012 | Woo et al. |
| 8,546,188 B2 | 10/2013 | Liu et al. |
| 8,716,116 B2 | 5/2014 | Parekh et al. |
| 9,543,433 B2 | 1/2017 | Anathan et al. |
| 10,510,738 B2 | 12/2019 | Kim et al. |
| 11,114,335 B1 | 9/2021 | Lu |
| 11,557,572 B2 | 1/2023 | Huang |
| 11,562,985 B2 | 1/2023 | Liu et al. |
| 2002/0127846 A1 | 9/2002 | Burrell et al. |
| 2009/0108318 A1 | 4/2009 | Yoon et al. |
| 2009/0168482 A1 | 7/2009 | Park et al. |
| 2010/0155932 A1 | 6/2010 | Gambino et al. |
| 2010/0230724 A1 | 9/2010 | Sinha et al. |
| 2014/0117420 A1 | 5/2014 | Chen et al. |
| 2019/0043836 A1 | 2/2019 | Fastow et al. |
| 2019/0074277 A1 | 3/2019 | Ramaswamy |
| 2019/0103302 A1 | 4/2019 | Yoon |
| 2019/0104260 A1 | 4/2019 | Izuhara |
| 2019/0164914 A1 | 5/2019 | Hu et al. |
| 2019/0214560 A1 | 7/2019 | Brightsky |
| 2019/0244933 A1 | 8/2019 | Or-Bach et al. |
| 2020/0066730 A1 | 2/2020 | Guo et al. |
| 2020/0083229 A1 | 3/2020 | Kim et al. |
| 2020/0111793 A1 | 4/2020 | Kim et al. |
| 2020/0203272 A1 | 6/2020 | Doebler et al. |
| 2020/0258876 A1 | 8/2020 | Hosoda et al. |
| 2020/0286875 A1 | 9/2020 | Nishida et al. |
| 2020/0328186 A1 | 10/2020 | Liu |
| 2020/0350014 A1 | 11/2020 | Liu |
| 2020/0395328 A1 | 12/2020 | Fastow et al. |
| 2020/0411524 A1 | 12/2020 | Arslan et al. |
| 2021/0036015 A1 | 2/2021 | Lim et al. |
| 2021/0043606 A1 | 2/2021 | Bowers et al. |
| 2021/0118887 A1 | 4/2021 | Kuo |
| 2021/0118890 A1 | 4/2021 | Kim et al. |
| 2021/0143115 A1 | 5/2021 | Wu et al. |
| 2021/0159216 A1 | 5/2021 | Wu et al. |
| 2021/0183996 A1 | 6/2021 | Lee et al. |
| 2021/0217716 A1 | 7/2021 | Wu et al. |
| 2021/0257266 A1 | 8/2021 | Lae |
| 2021/0265295 A1 | 8/2021 | Liu et al. |
| 2021/0296284 A1 | 9/2021 | Sharangpani et al. |
| 2021/0383874 A1 | 12/2021 | Oh et al. |
| 2021/0398967 A1* | 12/2021 | Parekh ............. H01L 27/11582 |
| 2021/0407980 A1 | 12/2021 | Young et al. |
| 2022/0005820 A1 | 1/2022 | Kim et al. |
| 2022/0052010 A1 | 2/2022 | Goda et al. |
| 2022/0077090 A1* | 3/2022 | Setta ....................... H01L 25/50 |
| 2022/0077129 A1 | 3/2022 | Sung et al. |
| 2022/0085048 A1 | 3/2022 | Lee et al. |
| 2022/0123006 A1 | 4/2022 | Ahn et al. |
| 2022/0216239 A1 | 7/2022 | Yoo et al. |
| 2022/0302150 A1 | 9/2022 | Zhang et al. |
| 2022/0328493 A1 | 10/2022 | Wang et al. |
| 2022/0367505 A1 | 11/2022 | Chen et al. |
| 2022/0399309 A1 | 12/2022 | Simsek-Ege |
| 2023/0015040 A1 | 1/2023 | Or-Bach et al. |

FOREIGN PATENT DOCUMENTS

| | | |
|---|---|---|
| CN | 113053435 A | 6/2021 |
| TW | 201523855 A | 6/2015 |
| TW | 202125778 A | 7/2021 |
| WO | 2008063251 A2 | 5/2008 |
| WO | 2020/211272 A1 | 10/2020 |

* cited by examiner

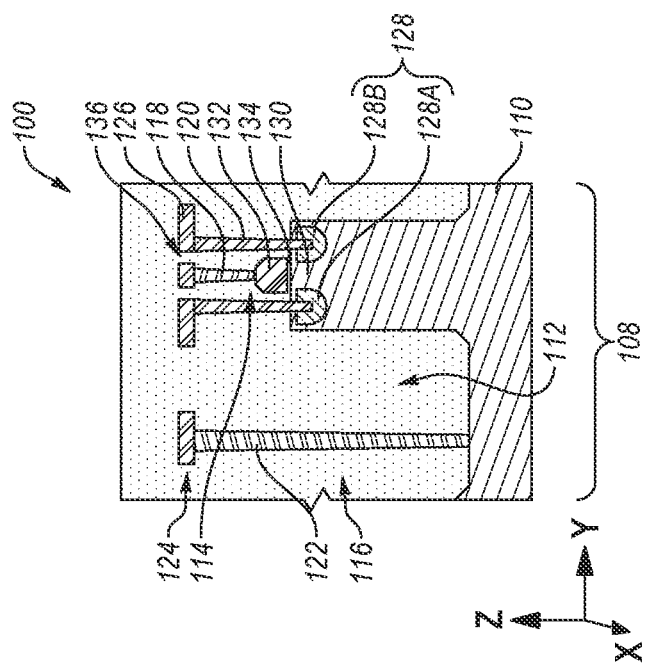
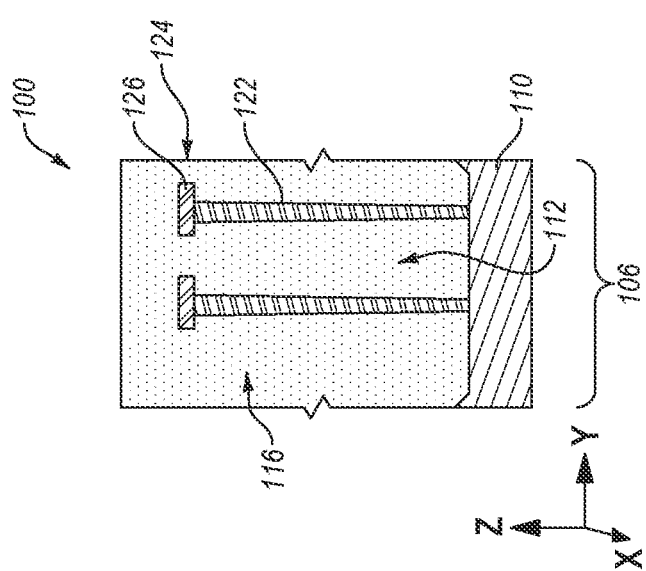
FIG. 2D
FIG. 2C

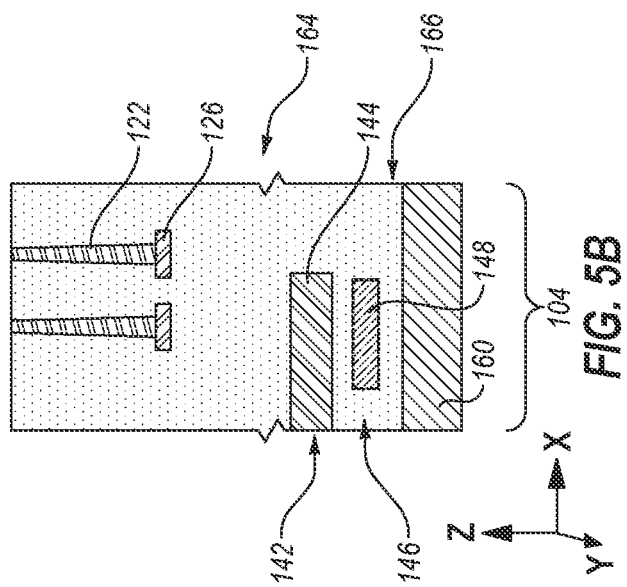
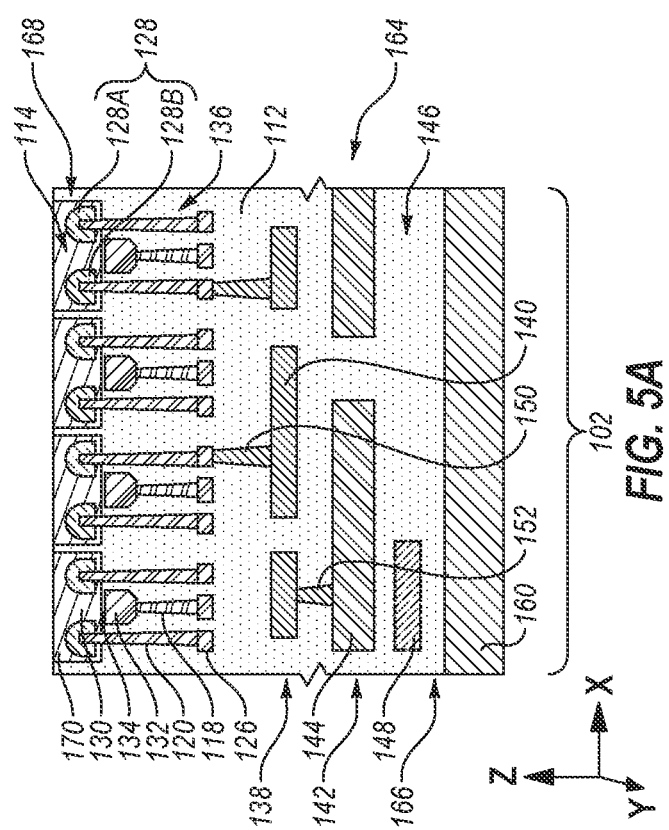
FIG. 5B
FIG. 5A

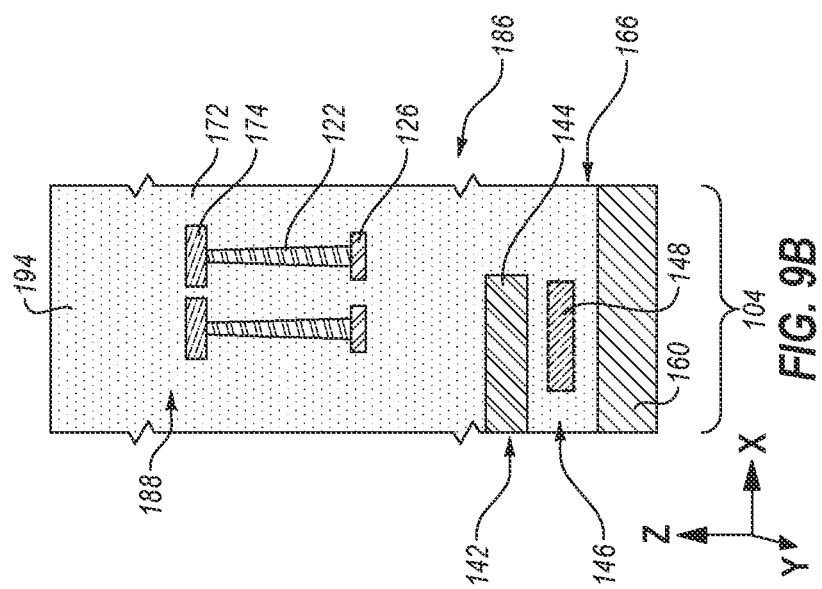
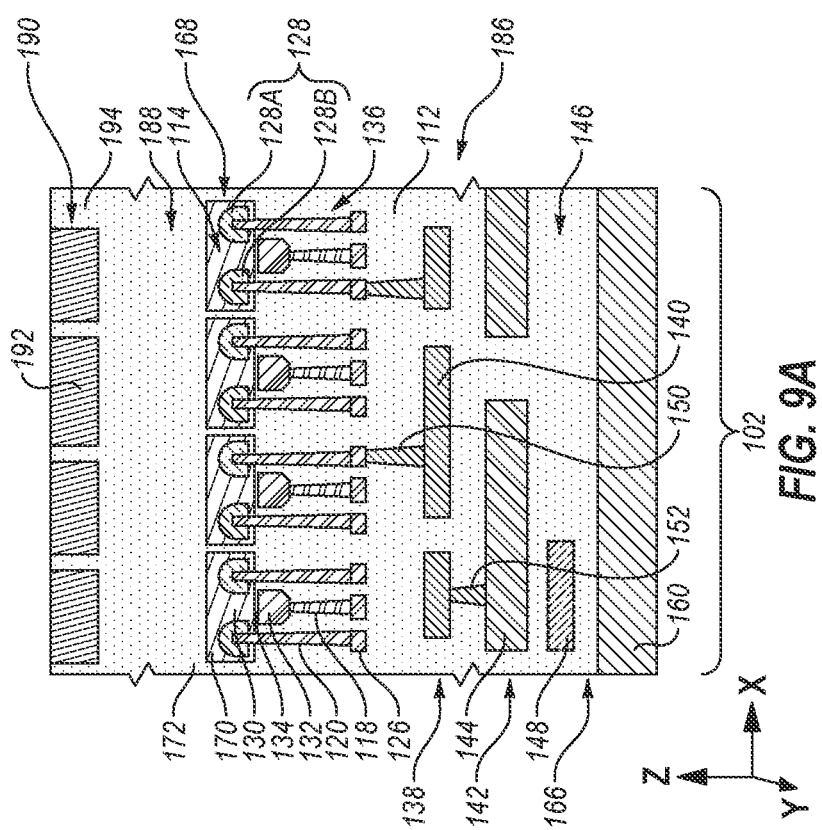

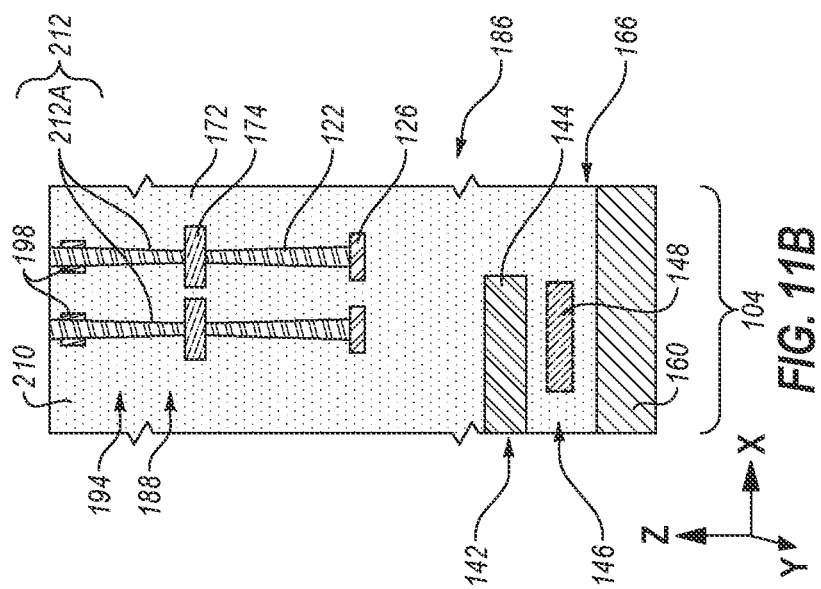
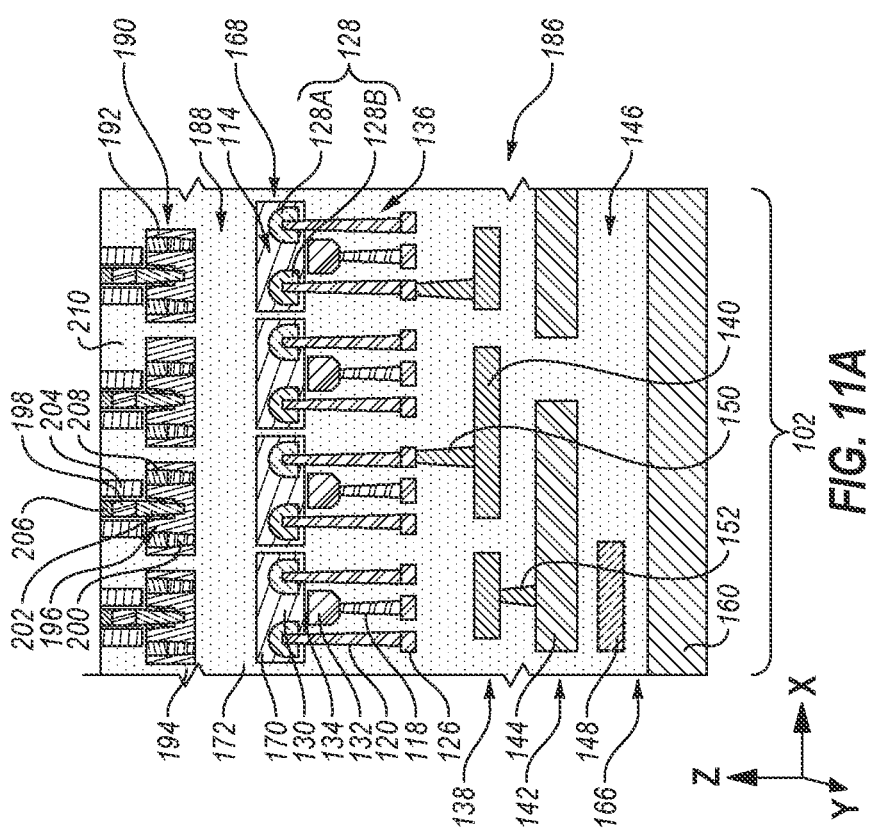
FIG. 11A
FIG. 11B

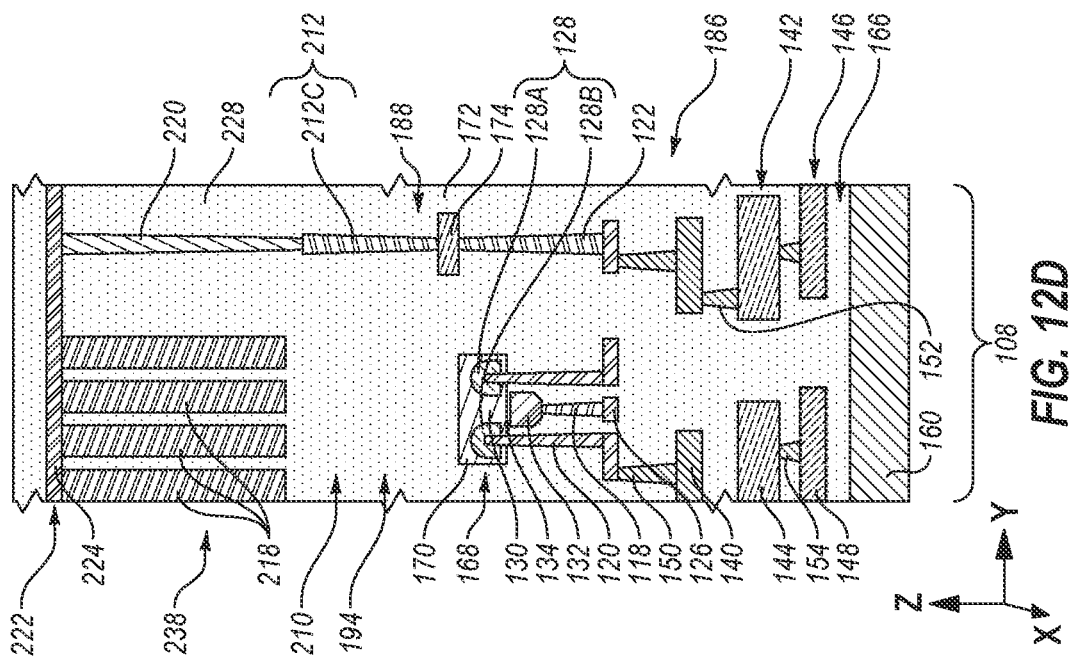
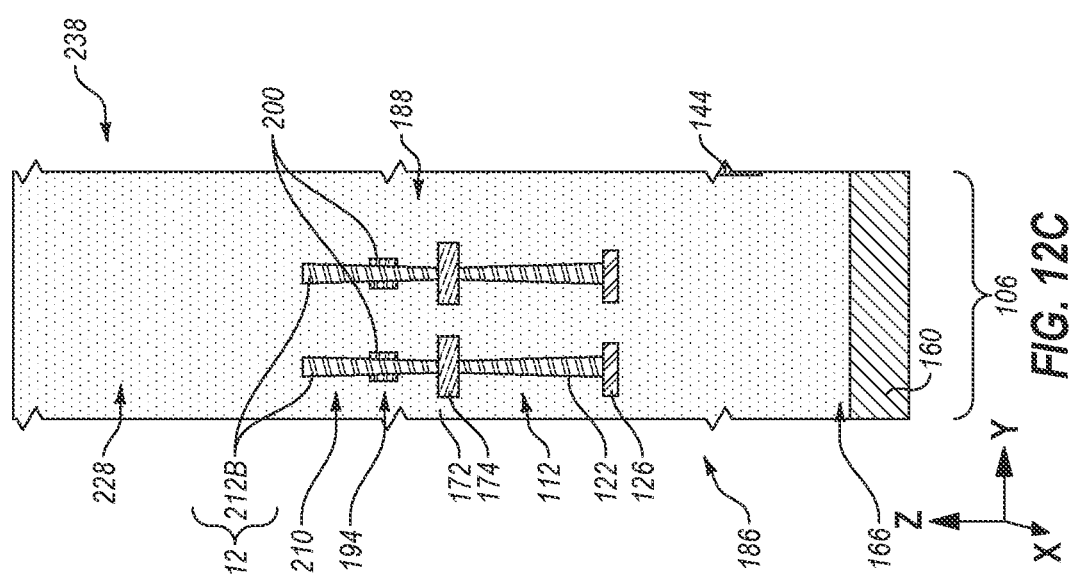

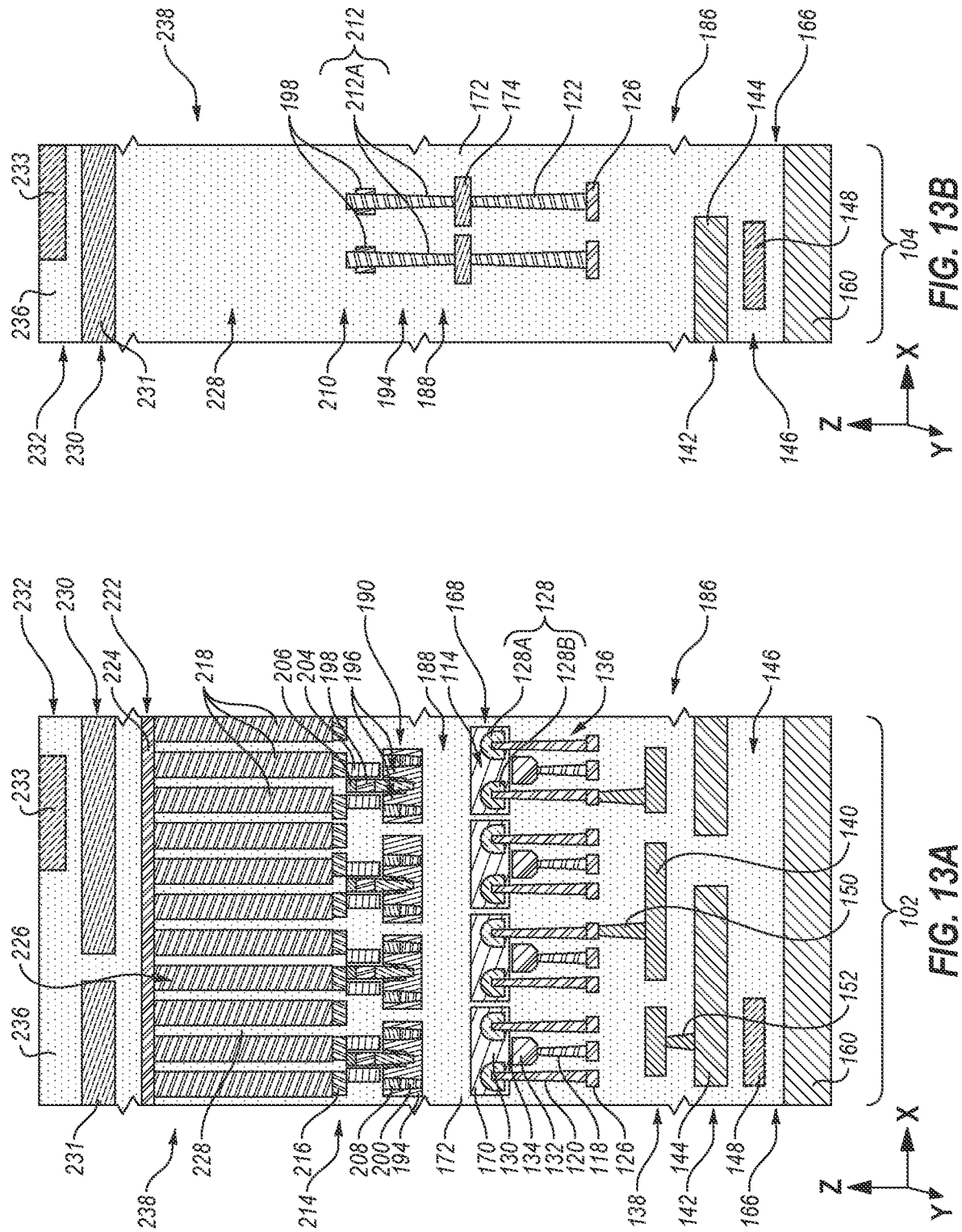

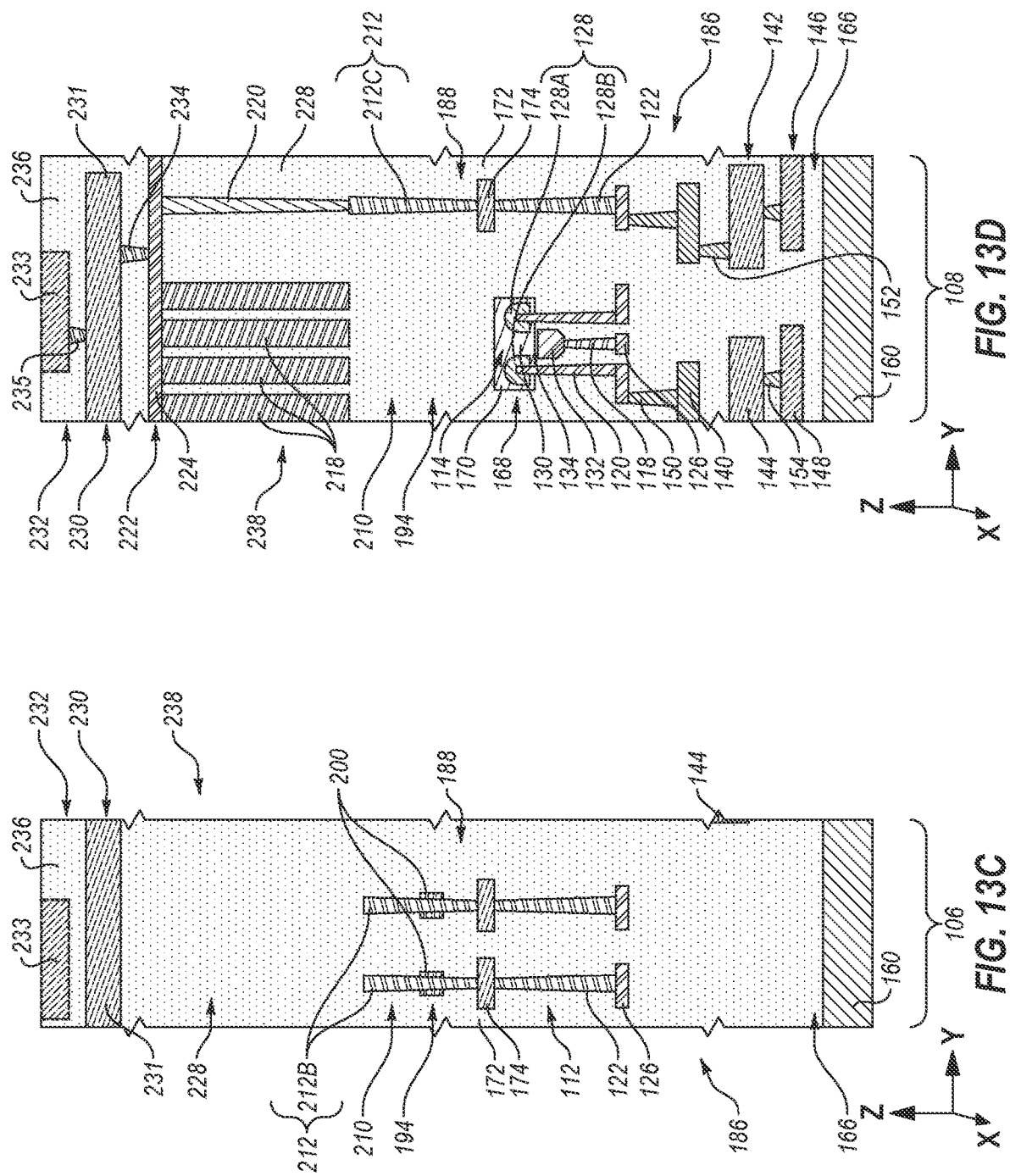

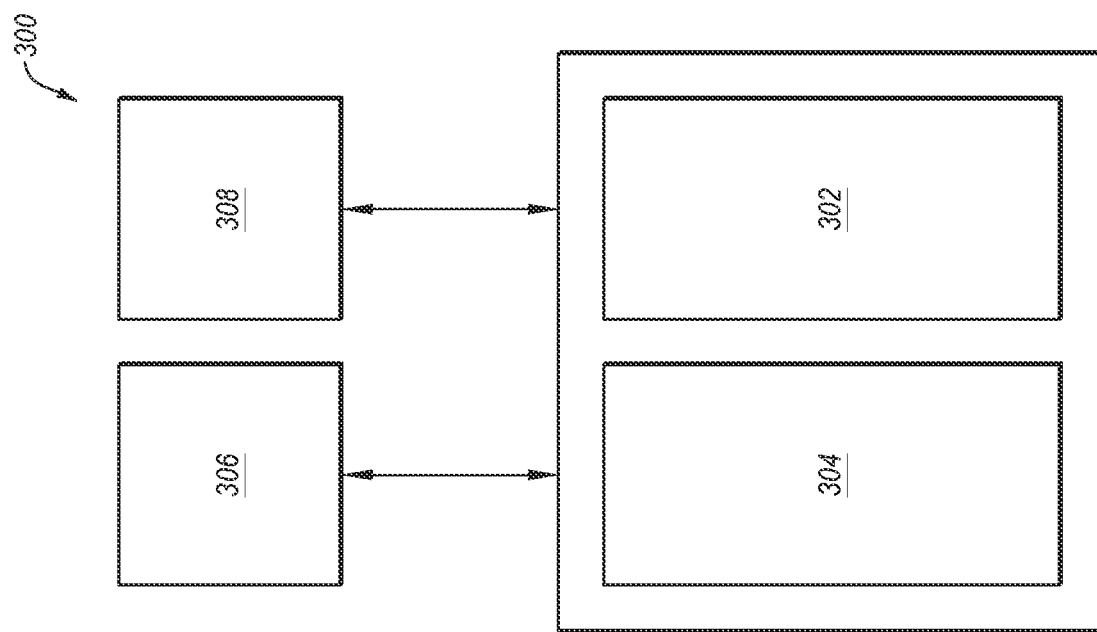

METHODS OF FORMING MICROELECTRONIC DEVICES, AND RELATED MICROELECTRONIC DEVICES AND ELECTRONIC SYSTEMS

CROSS-REFERENCE TO RELATED APPLICATIONS

This application is related to U.S. patent application Ser. No. 17/364,281, filed Jun. 30, 2021, listing Fatma Arzum Simsek-Ege, Kunal R. Parekh, Terrence B. McDaniel, and Beau D. Barry as inventors, for "METHODS OF FORMING MICROELECTRONIC DEVICES, AND RELATED MICROELECTRONIC DEVICES AND ELECTRONIC SYSTEMS." This application is also related to U.S. patent application Ser. No. 17/364,335, filed Jun. 30, 2021, listing Fatma Arzum Simsek-Ege, Kunal R. Parekh, and Beau D. Barry as inventors, for "METHODS OF FORMING MICROELECTRONIC DEVICES, AND RELATED MICROELECTRONIC DEVICES AND ELECTRONIC SYSTEMS." This application is also related to U.S. patent application Ser. No. 17/364,377, filed Jun. 30, 2021, listing Fatma Arzum Simsek-Ege and Kunal R. Parekh as inventors, for "METHODS OF FORMING MICROELECTRONIC DEVICES, AND RELATED MICROELECTRONIC DEVICES AND ELECTRONIC SYSTEMS." This application is also related to U.S. patent application Ser. No. 17/364,476, filed Jun. 30, 2021, listing Fatma Arzum Simsek-Ege and Kunal R. Parekh as inventors, for "METHODS OF FORMING MICROELECTRONIC DEVICES, AND RELATED MICROELECTRONIC DEVICES AND ELECTRONIC SYSTEMS." This application is also related to U.S. patent application Ser. No. 17/364,379, filed Jun. 30, 2021, listing Fatma Arzum Simsek-Ege as inventor, for "METHODS OF FORMING MICROELECTRONIC DEVICES, AND RELATED MICROELECTRONIC DEVICES AND ELECTRONIC SYSTEMS." The disclosure of each of the foregoing documents is hereby incorporated herein in its entirety by reference.

TECHNICAL FIELD

The disclosure, in various embodiments, relates generally to the field of microelectronic device design and fabrication. More specifically, the disclosure relates to methods of forming microelectronic devices and memory devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, volatile memory devices. One type of volatile memory device is a dynamic random access memory (DRAM) device. A DRAM device may include a memory array including DRAM cells arranged rows extending in a first horizontal direction and columns extending in a second horizontal direction. In one design configuration, an individual DRAM cell includes an access device (e.g., a transistor) and a storage node device (e.g., a capacitor) electrically connected to the access device. The DRAM cells of a DRAM device are electrically accessible through digit lines and word lines arranged along the rows and columns of the memory array and in electrical communication with control logic devices within a base control logic structure of the DRAM device.

Control logic devices within a base control logic structure underlying a memory, array of a DRAM device have been used to control operations on the DRAM cells of the DRAM device. Control logic devices of the base control logic structure can be provided in electrical communication with digit lines and word lines coupled to the DRAM cells by way of routing and contact structures. Unfortunately, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the DRAM device.

BRIEF DESCRIPTION OF THE DRAWINGS

FIGS. 2A through 2D are simplified, partial longitudinal cross-sectional views of an array region (FIG. 2A), a digit line exit region (FIG. 2B), a word line exit region (FIG. 2C), and a socket region (FIG. 2D) of the microelectronic device structure shown in FIG. 1 at the processing stage of FIG. 1.

FIGS. 5A through 5D are simplified, partial longitudinal cross-sectional views of the array region (FIG. 4A), the digit line exit region (FIG. 4B), the word line exit region (FIG. 4C), and the socket region (FIG. 4D) shown in FIGS. 2A through 2D, respectively, at another processing stage of the method of forming the microelectronic device following the processing stage of FIGS. 4A through 4D.

FIGS. 9A through 9D are simplified, partial longitudinal cross-sectional views of the array region (FIG. 9A), the digit line exit region (FIG. 9B), the word line exit region (FIG. 9C), and the socket region (FIG. 9D) shown in FIGS. 2A through 2D, respectively, at another processing stage of the method of forming the microelectronic device following the processing stage of FIGS. 8A through 8D.

FIGS. 11A through 11D are simplified, partial longitudinal cross-sectional views of the array region (FIG. 11A), the digit line exit region (FIG. 11B), the word line exit region (FIG. 11C), and the socket region (FIG. 11D) shown in FIGS. 2A through 2D, respectively, at another processing stage of the method of forming the microelectronic device following the processing stage of FIGS. 10A through 10D.

FIGS. 12A through 12D are simplified, partial longitudinal cross-sectional views of the array region (FIG. 12A), the digit line exit region (FIG. 12B), the word line exit region (FIG. 12C), and the socket region (FIG. 12D) shown in FIGS. 2A through 2D, respectively, at another processing stage of the method of forming the microelectronic device following the processing stage of FIGS. 11A through 11D.

FIGS. 13A through 13D are simplified, partial longitudinal cross-sectional views of the array region (FIG. 13A), the digit line exit region (FIG. 13B), the word line exit region (FIG. 13C), and the socket region (FIG. 13D) shown in FIGS. 2A through 2D, respectively, at another processing stage of the method of forming the microelectronic device following the processing stage of FIGS. 12A through 12D.

FIG. 15 is a schematic block diagram of an electronic system, in accordance with an embodiment of the disclosure.

DETAILED DESCRIPTION

Figure 1:
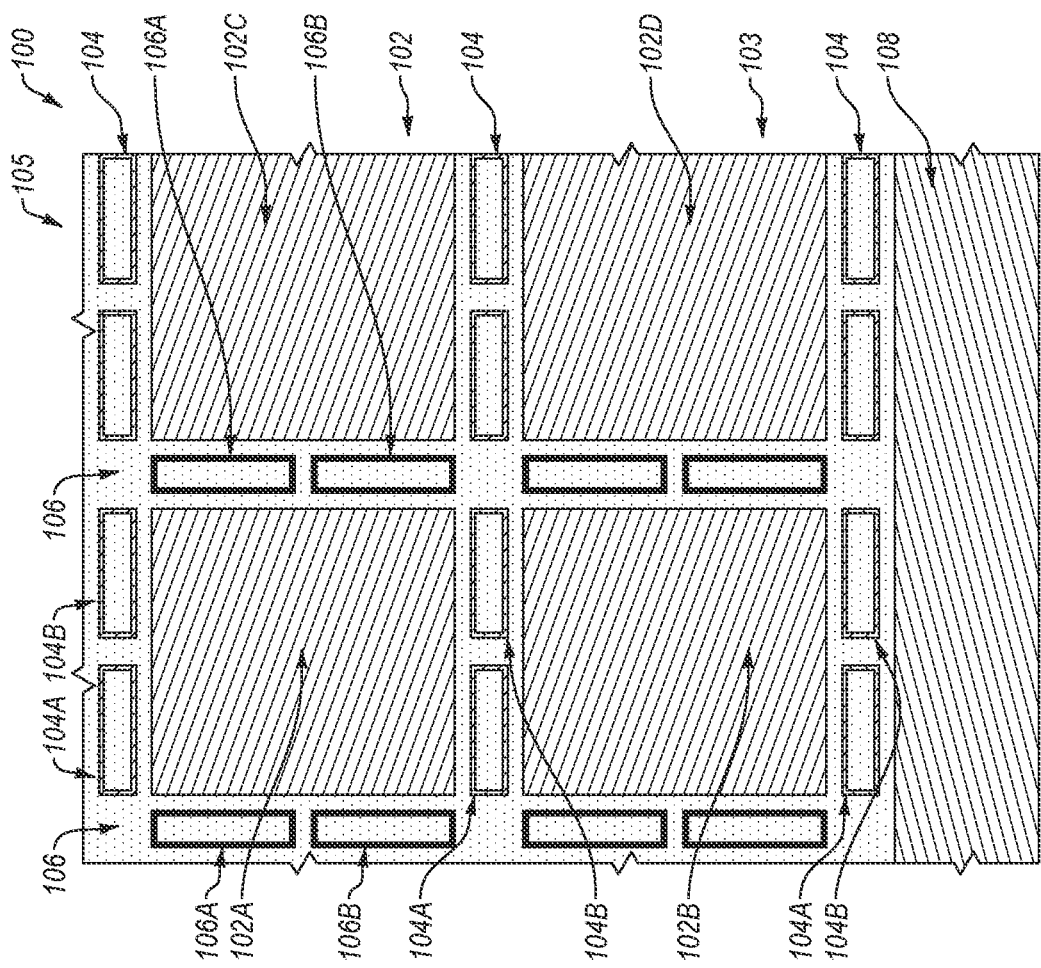
FIG. 1 is a simplified plan view of a microelectronic device structure at a processing stage of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory; conventional non-volatile memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yHz$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yHz$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1 through FIG. 14 are various views (described in further detail below) illustrating different processing stages of a method of forming a microelectronic device (e.g., a memory device, such as a DRAM device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device. With the description provided below, it will be readily apparent to one of ordinary skill in the art that the methods and structures described herein may be used to form various devices and electronic systems.

FIG. 1 shows a simplified plan view of a first microelectronic device structure 100 (e.g., a first wafer) at an early processing stage of a method of forming a microelectronic device (e.g., a memory device, such as a DRAM device), in accordance with embodiments of the disclosure. As shown in FIG. 1, the first microelectronic device structure 100 may be formed to include array regions 102, digit line exit regions 104 (also referred to as "digit line contact socket regions") interposed between pairs of the array regions 102 horizontally neighboring one another in a first horizontal direction (e.g., the Y-direction), word line exit regions 106 (also referred to as "word line contact socket regions") interposed between additional pairs of the array regions 102 horizontally neighboring one another in a second horizontal direction (e.g., the X-direction) orthogonal to the first horizontal direction, and one or more socket regions 108 (also referred to as "back end of line (BEOL) contact socket regions") horizontally neighboring some of the array regions 102 in one or more of the first horizontal direction and the second horizontal direction. The array regions 102, the digit line exit regions 104, the word line exit regions 106, and the socket regions 108 are each described in further detail below.

The array regions 102 of the first microelectronic device structure 100 may comprise horizontal areas of the first microelectronic device structure 100 configured and positioned to have arrays of memory cells (e.g., arrays of DRAM cells) subsequently formed within horizontal boundaries thereof, as described in further detail below. In addition, the array regions 102 may also be configured and positioned to have desirable arrangements of control logic devices subsequently formed within horizontal boundaries thereof, as also described in further detail below. The control logic devices to be formed within the horizontal boundaries of the array regions 102 may be formed to be vertically offset (e.g., in the Z-direction) from the memory cells to be formed within the horizontal boundaries of the array regions 102.

The first microelectronic device structure 100 may be formed to include a desired quantity of the array regions 102. For clarity and ease of understanding of the drawings and related description, FIG. 1 depicts the first microelectronic device structure 100 as being formed to include four (4) array regions 102: a first array region 102A, a second array region 102B, a third array region 102C, and a fourth array region 102D. As shown in FIG. 1, the second array region 102B may horizontally neighbor the first array region 102A in the Y-direction, and may horizontally neighbor the fourth array region 102D in the X-direction; the third array region 102C may horizontally neighbor the first array region 102A in the X-direction, and may horizontally neighbor the fourth array region 102D in the Y-direction; and the fourth array region 102D may horizontally neighbor the third array region 102C in the Y-direction, and may horizontally neighboring the second array region 102B in the Y-direction. In additional embodiments, the first microelectronic device structure 100 is formed to include a different number of array regions 102. For example, the first microelectronic device structure 100 may be formed to include greater than four (4) array regions 102, such as greater than or equal to eight (8) array regions 102, greater than or equal to sixteen (16) array regions 102, greater than or equal to thirty-two (32) array regions 102, greater than or equal to sixty-four (64) array regions 102, greater than or equal to one hundred twenty eight (128) array regions 102, greater than or equal to two hundred fifty six (256) array regions 102, greater than or equal to five hundred twelve (512) array regions 102, or greater than or equal to one thousand twenty-four (1024) array regions 102.

In addition, the first microelectronic device structure 100 may be formed to include a desired distribution of the array regions 102. As shown in FIG. 1, in some embodiments, the first microelectronic device structure 100 is formed to include rows 103 of the array regions 102 extending in the X-direction, and columns 105 of the array regions 102 extending in the Y-direction. The rows 103 of the array regions 102 may, for example, include a first row including the first array region 102A and the third array region 102C, and a second row including the second array region 102B and the fourth array region 102D. The columns 105 of the array regions 102 may, for example, include a first column including the first array region 102A and the second array region 102B, and a second column including the third array region 102C and the fourth array region 102D.

With continued reference to FIG. 1, the digit line exit regions 104 of the first microelectronic device structure 100 may comprise horizontal areas of the first microelectronic device structure 100 configured and positioned to have at least some subsequently formed digit lines (e.g., bit lines, data lines) horizontally terminate therein. For an individual digit line exit region 104, at least some subsequently formed digit lines operatively associated with the array regions 102 flanking (e.g., at opposing boundaries in the Y-direction) the digit line exit region 104 may have ends within the horizontal boundaries of the digit line exit region 104. In addition, the digit line exit regions 104 may also be configured and positioned to include contact structures and routing structures within the horizontal boundaries thereof that are operatively associated with at least some of the subsequently formed digit lines. As described in further detail below, some of the contact structures to be formed within the digit line exit regions 104 may couple the subsequently formed digit lines to control logic circuitry of control logic devices (e.g., sense amplifier (SA) devices) to subsequently be formed within the array regions 102. As shown in FIG. 1, in some embodiments, the digit line exit regions 104 horizontally extend in the X-direction, and are horizontally interposed between horizontally neighboring rows of the array regions 102 in the Y-direction. The digit line exit regions 104 may, for example, horizontally alternate with the rows of the array regions 102 in the Y-direction.

An individual digit line exit region 104 may be divided into multiple subregions. For example, as shown in FIG. 1, an individual digit line exit region 104 may include first digit line exit subregions 104A and second digit line exit subregions 104B. In some embodiments, the first digit line exit subregions 104A horizontally alternate with the second digit line exit subregions 104B in the X-direction. A pair (e.g., two (2)) of horizontally neighboring array regions 102 within an individual column of the array regions 102 may include one (1) of the first digit line exit subregions 104A and one (1) of the second digit line exit subregions 104B positioned horizontally therebetween in the Y-direction. By way of non-limiting example, the first array region 102A and the second array region 102B of a first column of the array regions 102 may include one (1) of the first digit line exit subregions 104A and one (1) of the second digit line exit subregions 104B positioned therebetween in the Y-direction. The one (1) of the first digit line exit subregions 104A and the one (1) of the second digit line exit subregions 104B may be at least partially (e.g., substantially) confined with horizontal boundaries in the X-direction of the first array region 102A and the second array region 102B.

As described in further detail below, an individual first digit line exit subregion 104A may be configured and positioned to facilitate electrical connections between a group of digit lines (e.g., odd digit lines or even digit lines) and a group of control logic devices (e.g., odd SA devices or even SA devices) operatively associated with a portion (e.g., a half portion in the X-direction) of one (1) array region 102 (e.g., the first array region 102A) of a pair of horizontally neighboring array regions 102, and to also facilitate electrical connections between a group of additional digit lines (e.g., additional odd digit lines or additional even digit lines) and a group of additional control logic devices (e.g., additional odd SA devices or additional even SA devices) operatively associated with a corresponding portion (e.g., a corresponding half portion in the X-direction) of an additional array region 102 (e.g., the second array region 102B) of the pair of horizontally neighboring array regions 102. In addition, as also described in further detail below, an individual second digit line exit subregion 104B may be configured and positioned to facilitate electrical connections between a group of further digit lines and a group of further control logic devices operatively associated with another portion (e.g., another half portion in the X-direction) of the one (1) array region 102 (e.g., the first array region 102A), and to also facilitate electrical connections between a group of yet further digit lines and a group of yet further control logic devices operatively associated with a corresponding another portion (e.g., a corresponding another half portion in the X-direction) of the additional array region 102 (e.g., the second array region 102B).

Still referring to FIG. 1, the word line exit regions 106 of the first microelectronic device structure 100 may comprise horizontal areas of the first microelectronic device structure 100 configured and positioned to have at least some subsequently formed word lines (e.g., access lines) horizontally terminate therein. For an individual word line exit region 106, at least some subsequently formed word lines operatively associated with the array regions 102 flanking (e.g., at opposing boundaries in the X-direction) the word line exit region 106 may have ends within the horizontal boundaries of the word line exit region 106. In addition, the word line exit regions 106 may also be configured and positioned to include contact structures and routing structures within the horizontal boundaries thereof that are operatively associated with the subsequently formed word lines. As described in further detail below, some of the contact structures to be formed within the word line exit regions 106 may couple the subsequently formed word lines to control logic circuitry of additional control logic devices (e.g., sub-word line driver (SWD) devices) to subsequently be formed within the array regions 102. As shown in FIG. 1, in some embodiments, the word line exit regions 106 horizontally extend in the Y-direction, and are horizontally interposed between horizontally neighboring columns of the array regions 102 in the X-direction. The word line exit regions 106 may, for example, horizontally alternate with the columns of the array regions 102 in the X-direction.

An individual word line exit region 106 may be divided into multiple subregions. For example, as shown in FIG. 1, an individual word line exit region 106 may include first word line exit subregions 106A and second word line exit subregions 106B. In some embodiments, the first word line exit subregions 106A horizontally alternate with the second word line exit subregions 106B in the Y-direction. A pair (e.g., two (2)) of horizontally neighboring array regions 102 within an individual row of the array regions 102 may include one (1) of the first word line exit subregions 106A and one (1) of the second word line exit subregions 106B positioned horizontally therebetween in the X-direction. By way of non-limiting example, the first array region 102A and the third array region 102C of a first row of the array regions 102 may include one (1) of the first word line exit subregions 106A and one (1) of the second word line exit subregions 106B positioned therebetween in the X-direction. The one (1) of the first word line exit subregions 106A and the one (1) of the second word line exit subregions 106B may be at least partially (e.g., substantially) confined with horizontal boundaries in the Y-direction of the first array region 102A and the third array region 102C.

As described in further detail below, an individual first word line exit subregion 106A may be configured and positioned to facilitate electrical connections between a group of word lines (e.g., odd word lines or even word lines) and a group of control logic devices (e.g., odd SWD devices or even SWD devices) operatively associated with a portion (e.g., a half portion in the Y-direction) of one (1) array region 102 (e.g., the first array region 102A) of a pair of horizontally neighboring array regions 102, and to also facilitate electrical connections between a group of additional word lines (e.g., additional odd word lines or additional even word lines) and a group of additional control logic devices (e.g., additional odd SWD devices or additional even SWD devices) operatively associated with a corresponding portion (e.g., a corresponding half portion in the Y-direction) of a further array region 102 (e.g., the third array region 102C) of the pair of horizontally neighboring array regions 102. In addition, as also described in further detail below, an individual second word line exit subregion 106B may be configured and positioned to facilitate electrical connections between a group of further word lines and a group of further control logic devices operatively associated with another portion (e.g., another half portion in the Y-direction) of the one (1) array region 102 (e.g., the first array region 102A), and to also facilitate electrical connections between a group of yet further word lines and a group of yet further control logic devices operatively associated with a corresponding another portion (e.g., a corresponding another half portion in the Y-direction) of the further array region 102 (e.g., the third array region 102C).

With continued reference to FIG. 1, the socket regions 108 of the first microelectronic device structure 100 may comprise horizontal areas of the first microelectronic device structure 100 configured and positioned to facilitate electrical connections (e.g., by way of contact structures and routing structures formed within horizontal boundaries thereof) between subsequently formed control logic circuitry and additional subsequently formed structures (e.g., BEOL structures), as described in further detail below. The socket regions 108 may horizontally neighbor one or more peripheral horizontal boundaries (e.g., in the Y-direction, in the X-direction) of one or more groups of the array regions 102. For clarity and ease of understanding of the drawings and related description, FIG. 1 depicts the first microelectronic device structure 100 as being formed to include one (1) socket region 108 horizontally neighboring a shared horizontal boundary of the second array region 102B and the fourth array region 102D. However, the first microelectronic device structure 100 may be formed to include one or more of a different quantity and a different horizontal position of socket region(s) 108. As a non-limiting example, the socket region 108 may horizontally neighbor a shared horizontal boundary of a different group of the array regions 102 (e.g., a shared horizontal boundary of the third array region 102C and the fourth array region 102D, a shared horizontal boundary of the first array region 102A and the third array region 102C, a shared horizontal boundary of the first array region 102A and the second array region 102B). As another non-limiting example, the first microelectronic device structure 100 may be formed to include multiple (e.g., a plurality of, more than one) socket regions 108 horizontally neighboring different groups of the array regions 102 than one another. In some embodiments, multiple socket regions 108 collectively substantially horizontally surround (e.g., substantially horizontally circumscribe) the array regions 102.

Figure 2B:
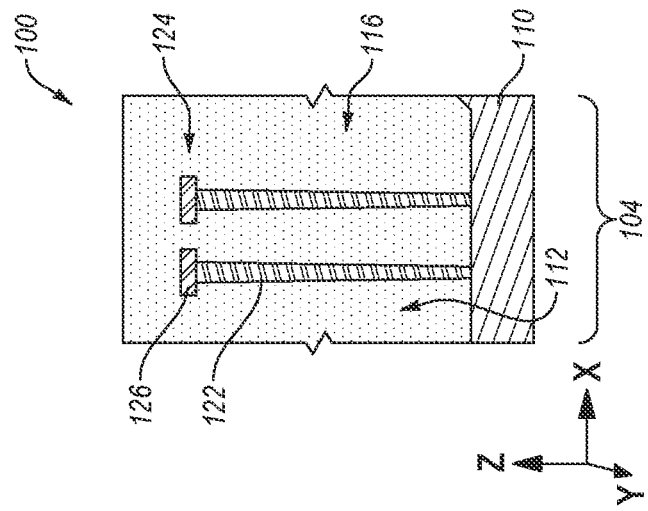
Figure 2A:
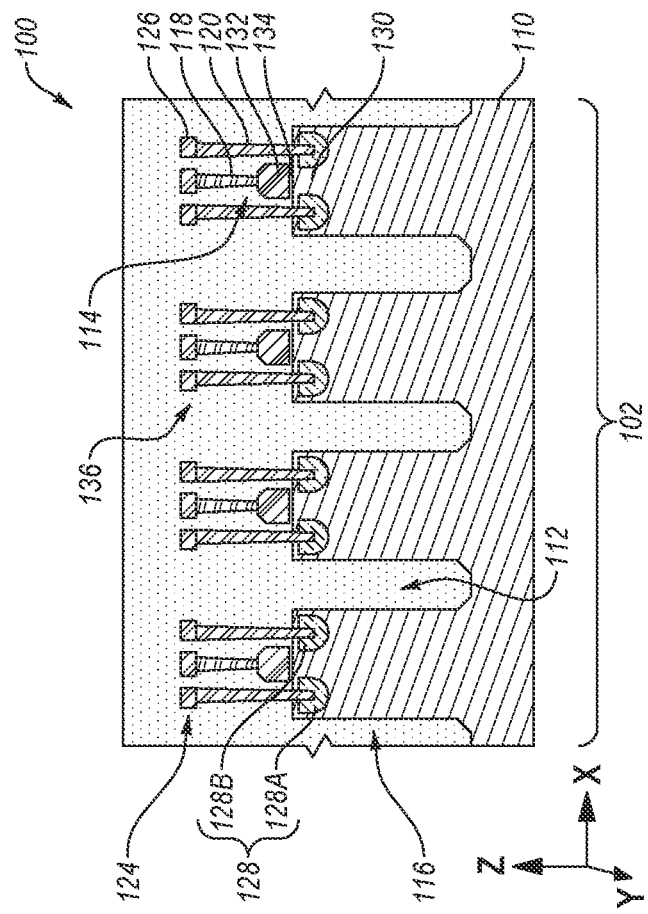

FIGS. 2A through 2D illustrate simplified, partial longitudinal cross-sectional views of different regions of the first microelectronic device structure 100 previously described with reference to FIG. 1. FIG. 2A illustrates a simplified, partial longitudinal cross-sectional view from the perspective of the Y-direction (so as to depict an XZ-plane) of one of the array regions 102 (e.g., the first array region 102A) of the first microelectronic device structure 100 shown in FIG. 1. FIG. 2B illustrates a simplified, partial longitudinal cross-sectional view from the perspective of the Y-direction (so as to depict an XZ-plane) of one of the digit line exit regions 104 of the first microelectronic device structure 100 shown in FIG. 1. FIG. 2C illustrates a simplified, partial longitudinal cross-sectional view from the perspective of the X-direction (so as to depict an YZ-plane) of one of the word line exit regions 106 of the first microelectronic device structure 100 shown in FIG. 1. FIG. 2D illustrates a simplified, partial longitudinal cross-sectional view from the perspective of the X-direction (so as to depict an YZ-plane) of one of socket regions 108 of the first microelectronic device structure 100 shown in FIG. 1.

Referring collectively to FIGS. 2A through 2D, the first microelectronic device structure 100 may be formed to include a first base semiconductor structure 110, filled trenches 112, transistors 114 (FIGS. 2A and 2D), a first isolation material 116, first contact structures 118 (FIGS. 2A and 2D), second contact structures 120 (FIGS. 2A and 2D), third contact structures 122 (FIGS. 2B through 2D), and at least one first routing tier 124 including first routing structures 126. The filled trenches 112 vertically extend (e.g., in the Z-direction) into the first base semiconductor structure 110. The transistors 114 at least partially vertically overlie the first base semiconductor structure 110 and the filled trenches 112. The first contact structures 118 and second contact structures 120 contact the transistors 114. The third contact structures 122 vertically extend through the filled trenches 112 within the digit line exit regions 104 (FIG. 2B), the word line exit regions 106 (FIG. 2C), and socket regions 108 (FIG. 2D) and contact the first base semiconductor structure 110. Some of the first routing structures 126 contact some of the first contact structures 118 (FIGS. 2A and 2D), some other of the first routing structures 126 contact some of the second contact structures 120 (FIGS. 2A and 2D), and yet some other of the first routing structures 126 contact some of the third contact structures 122 (FIGS. 2B, 2C, and 2D). The first isolation material 116 may substantially cover and surround the first base semiconductor structure 110, the transistors 114, the first contact structures 118, the second contact structures 120, the third contact structures 122, and the first routing structures 126.

The first base semiconductor structure 110 comprises a base material or construction upon which additional features (e.g., materials, structures, devices) of the first microelectronic device structure 100 are formed. The first base semiconductor structure 110 may comprise a semiconductor structure (e.g., a semiconductor wafer), or a base semiconductor material on a supporting structure. For example, the first base semiconductor structure 110 may comprise a conventional silicon substrate (e.g., a conventional silicon wafer), or another bulk substrate comprising a semiconductor material. In some embodiments, the first base semiconductor structure 110 comprises a silicon wafer. The first base semiconductor structure 110 may include one or more layers, structures, and/or regions formed therein and/or thereon.

The filled trenches 112 may comprise trenches (e.g., openings, vias, apertures) within the first base semiconductor structure 110 that are at least partially (e.g., substantially) filled with the first isolation material 116. The filled trenches 112 may, for example, be employed as shallow trench isolation (STI) structures within the first base semiconductor structure 110. The filled trenches 112 may be formed to vertically extend partially (e.g., less than completely) through the first base semiconductor structure 110. Each of the filled trenches 112 may be formed to exhibit substantially the same dimensions and shape as each other of the filled trenches 112, or at least one of the filled trenches 112 may be formed to exhibit one or more of different dimensions and a different shape than at least one other of the filled trenches 112. As a non-limiting example, each of the filled trenches 112 may be formed to exhibit substantially the same vertical dimension(s) and substantially the same vertical cross-sectional shape(s) as each other of the filled trenches 112; or at least one of the filled trenches 112 may be formed to exhibit one or more of different vertical dimension(s) and different vertical cross-sectional shape(s) than at least one other of the filled trenches 112. In some embodiments, the filled trenches 112 are all formed to vertically extend to and terminate at substantially the same depth within the first base semiconductor structure 110. In additional embodiments, at least one of the filled trenches 112 is formed to vertically extend to and terminate at a relatively deeper depth within the first base semiconductor structure 110 than at least one other of the filled trenches 112. As another non-limiting example, each of the filled trenches 112 may be formed to exhibit substantially the same horizontal dimension(s) and substantially the same horizontal cross-sectional shape(s) as each other of the filled trenches 112; or at least one of the filled trenches 112 may be formed to exhibit one or more of different horizontal dimension(s) (e.g., relatively larger horizontal dimension(s), relatively smaller horizontal dimension(s)) and different horizontal cross-sectional shape(s) than at least one other of the filled trenches 112. In some embodiments, at least one of the filled trenches 112 is formed to have one or more different horizontal dimensions (e.g., in the X-direction and/or in the Y-direction) than at least one other of the filled trenches 112.

Referring collectively to FIGS. 2A and 2D, the transistors 114 may individually be formed to include conductively doped regions 128, a channel region 130, a gate structure 132, and a gate dielectric material 134. For a transistor 114, the conductively doped regions 128 may be formed within the first base semiconductor structure 110 (e.g., within relatively elevated portions of the first base semiconductor structure 110); the channel region 130 may be within the first base semiconductor structure 110 and may be horizontally interposed between the conductively doped regions 128 thereof; the gate structure 132 may vertically overlie the channel region 130; and the gate dielectric material 134 (e.g., a dielectric oxide) may be vertically interposed (e.g., in the Z-direction) between the gate structure 132 and the channel region 130. The conductively doped regions 128 of an individual transistor 114 may include a source region 128A and a drain region 128B.

Referring collectively to FIGS. 2A and 2D, for an individual transistor 114, the conductively doped regions 128 thereof may comprise semiconductor material of the first base semiconductor structure 110 doped with one or more desired conductivity-enhancing dopants. In some embodiments, the conductively doped regions 128 of the transistor 114 comprise semiconductor material (e.g., silicon) doped with at least one N-type dopant (e.g., one or more of phosphorus, arsenic, antimony, and bismuth). In some of such embodiments, the channel region 130 of the transistor 114 comprises the semiconductor material doped with at least one P-type dopant (e.g., one or more of boron, aluminum, and gallium). In some other of such embodiments, the channel region 130 of the transistor 114 comprises substantially undoped semiconductor material (e.g., substantially undoped silicon). In additional embodiments, for an individual transistor 114, the conductively doped regions 128 thereof comprise semiconductor material (e.g., silicon) doped with at least one P-type dopant (e.g., one or more of boron, aluminum, and gallium). In some of such additional embodiments, the channel region 130 of the transistor 114 comprises the semiconductor material doped with at least one N-type dopant (e.g., one or more of phosphorus, arsenic, antimony, and bismuth). In some other of such additional embodiments, the channel region 130 of the transistor 114 comprised substantially undoped semiconductor material (e.g., substantially undoped silicon).

Still referring collectively to FIGS. 2A and 2D, the gate structures 132 (e.g., gate electrodes) may individually horizontally extend (e.g., in the X-direction) between and be employed by multiple transistors 114. The gate structures 132 may be formed of and include conductive material. The gate structures 132 may individually be substantially homogeneous, or the gate structures 132 may individually be heterogeneous. In some embodiments, the gate structures 132 are each substantially homogeneous. In additional embodiments, the gate structures 132 are each heterogeneous. Individual gate structures 132 may, for example, be formed of and include a stack of at least two different conductive materials.

Still referring to FIGS. 2A and 2D, the first contact structures 118 may individually be formed to vertically extend between and couple the gate structures 132 (and, hence, the transistors 114) to one or more of the first routing structures 126 of the first routing tier 124. The first contact structures 118 may individually be formed of and include conductive material. By way of non-limiting example, the first contact structures 118 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first contact structures 118 are formed of and include W. In additional embodiments, the first contact structures 118 are formed of and include Cu.

As also shown in FIGS. 2A and 2D, the second contact structures 120 may be formed to vertically extend between and couple the conductively doped regions 128 (e.g., the source region 128A, the drain region 128B) of the transistors 114 to some of the first routing structures 126 of the first routing tier 124. The second contact structures 120 may individually be formed of and include conductive material. By way of non-limiting example, the second contact structures 120 may be formed of and include one or more of at least one metal, at least one alloy, and at least one conductive metal-containing material (e.g., a conductive metal nitride, a conductive metal silicide, a conductive metal carbide, a conductive metal oxide). A material composition of the second contact structures 120 may be substantially the same as a material composition of the first contact structures 118, or the material composition of one or more of the second contact structures 120 may be different than the material composition of one or more of the first contact structures 118. In some embodiments, the second contact structures 120 are formed of and include W. In additional embodiments, the second contact structures 120 are formed of and include Cu.

Referring collectively to FIGS. 2B through 2D, at least some of the third contact structures 122 may vertically extend (e.g., in the Z-direction) between some other of the first routing structures 126 and other portions (e.g., relatively vertically recessed portions) of the first base semiconductor structure 110 within (e.g., inside of) the horizontal boundaries (e.g., in the X-direction and the Y-direction) of some of the filled trenches 112, such as some of the filled trenches 112 within the digit line exit regions 104 (FIG. 2B), the word line exit regions 106 (FIG. 2C), and the socket regions 108 (FIG. 2D) of the first microelectronic device structure 100. As shown in FIGS. 2B through 2D, in some embodiments, at least some of the third contact structures 122 vertically extend from the first routing structures 126, through one or more of the filled trenches 112, and to one or more vertically lower surfaces of the first base semiconductor structure 110 within horizontal boundaries of the one or more of the filled trenches 112. As described in further detail below, at least some of the third contact structures 122 may be employed to facilitate electrical connection between some of the first routing structures 126 and one or more features (e.g., structures, materials, devices) to be formed at an opposing side (e.g., a back side, a bottom side) of the first base semiconductor structure 110 following subsequent processing (e.g., subsequent thinning) of the first base semiconductor structure 110. The third contact structures 122 may each individually be formed of and include conductive material. By way of non-limiting example, the third contact structures 122 be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third contact structures 122 are formed of and include W. In additional embodiments, the third contact structures 122 are formed of and include Cu.

Referring collectively to FIGS. 2A through 2D, the first routing structures 126 of the first routing tier 124 may be formed of and include conductive material. By way of non-limiting example, the first routing structures 126 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 126 are formed of and include W. In additional embodiments, the first routing structures 126 are formed of and include Cu. At least some of the first routing structures 126 may be employed as local routing structures of a microelectronic device (e.g., a memory device, such as a DRAM device) of the disclosure.

While FIGS. 2A through 2D depict the first microelectronic device structure 100 as being formed to include a single (e.g., only one) first routing tier 124 including first routing structures 126, the first microelectronic device structure 100 may be formed to include multiple (e.g., more than one) first routing tiers 124 each individually including a desired arrangement (e.g., pattern) of first routing structures 126. By of non-limiting example, the first microelectronic device structure 100 may be formed to include two or more (e.g., three or more) of the first routing tiers 124, wherein different first routing tiers 124 are vertically offset from one another and each individually include a desired arrangement of first routing structures 126 therein. At least some of the first routing structures 126 within at least one of the first routing tiers 124 may be coupled to at least some of the first routing structures 126 within at least one other of the first routing tiers 124 by way of conductive interconnect structures.

With continued collective reference to FIGS. 2A though 2D, the transistors 114, the first contact structures 118, the second contact structures 120, and the first routing structures 126 may form control logic circuitry of various control logic devices 136 (FIGS. 2A and 2D) configured to control various operations of various features (e.g., the memory cells) of a microelectronic device (e.g., a memory device, such as a DRAM device) to be formed through the methods of disclosure. In some embodiments, the control logic devices 136 comprise CMOS circuitry. As a non-limiting example, the control logic devices 136 may include one or more (e.g., each) of charge pumps (e.g., VCCP charge pumps, VNEGWL charge pumps, DVC2 charge pumps), delay-locked loop (DLL) circuitry (e.g., ring oscillators), Vaa regulators, drivers (e.g., main word line drivers, sub word line drivers (SWD)), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, array multiplexers (MUX), error checking and correction (ECC) devices, self-refresh/wear leveling devices, and other chip/deck control circuitry. Different regions (e.g., the array region 102 (FIG. 2A), the socket region 108 (FIG. 2D)) may have different control logic devices 136 formed within horizontal boundaries thereof.

Still referring to collectively to FIGS. 2A through 2D, the first isolation material 116 may be formed on or over surfaces of the first base semiconductor structure 110 inside and outside of the horizontal boundaries of the filled trenches 112. In addition, the first isolation material 116 may be formed on or over surfaces of the transistors 114, the first contact structures 118 (FIGS. 2A and 2D), the second contact structures 120 (FIGS. 2A and 2D), the third contact structures 122 (FIGS. 2B through 2D), and the first routing structures 126. An uppermost vertical boundary (e.g., an uppermost surface) of the first isolation material 116 may vertically overlie uppermost vertical boundaries (e.g., uppermost surfaces) of the first routing structures 126. As described in further detail below, the first isolation material 116 may be employed to attach (e.g., bond) the first microelectronic device structure 100 to a second microelectronic device structure (e.g., a second wafer). The first isolation material 116 may be formed of and include at least one insulative material. By way of non-limiting example, the first isolation material 116 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first isolation material 116 is formed of and includes $SiO_x$ (e.g., $SiO_2$). The first isolation material 116 may be substantially homogeneous, or the first isolation material 116 may be heterogeneous. In some embodiments, the first isolation material 116 is substantially homogeneous. In additional embodiments, the first isolation material 116 is heterogeneous. The first isolation material 116 may, for example, be formed of and include a stack of at least two different dielectric materials.

Figure 3B:
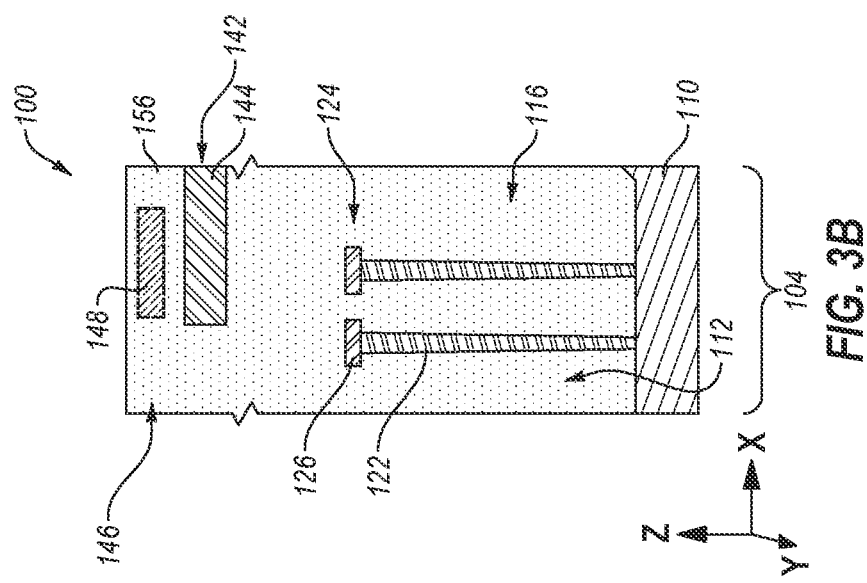
FIGS. 3A through 3D are simplified, partial longitudinal cross-sectional views of the array region (FIG. 3A), the digit line exit region (FIG. 3B), the word line exit region (FIG. 3C), and the socket region (FIG. 3D) shown in FIGS. 2A through 2D, respectively, at another processing stage of the method of forming the microelectronic device following the processing stage of FIGS. 2A through 2D.
Figure 3A:
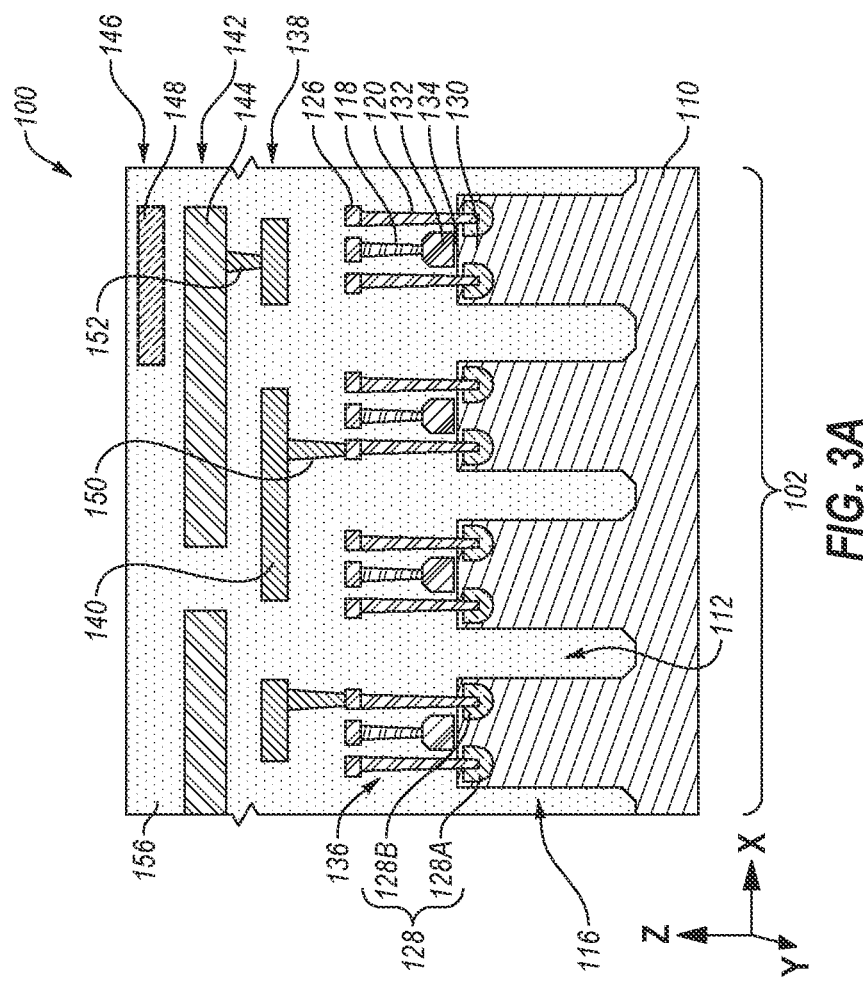
Figure 3D:
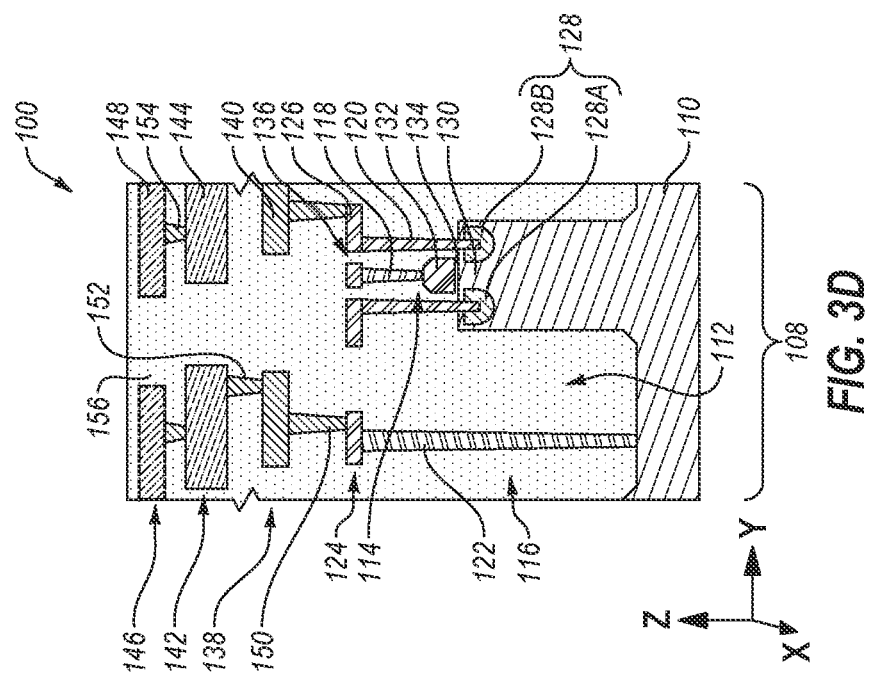
Figure 3C:
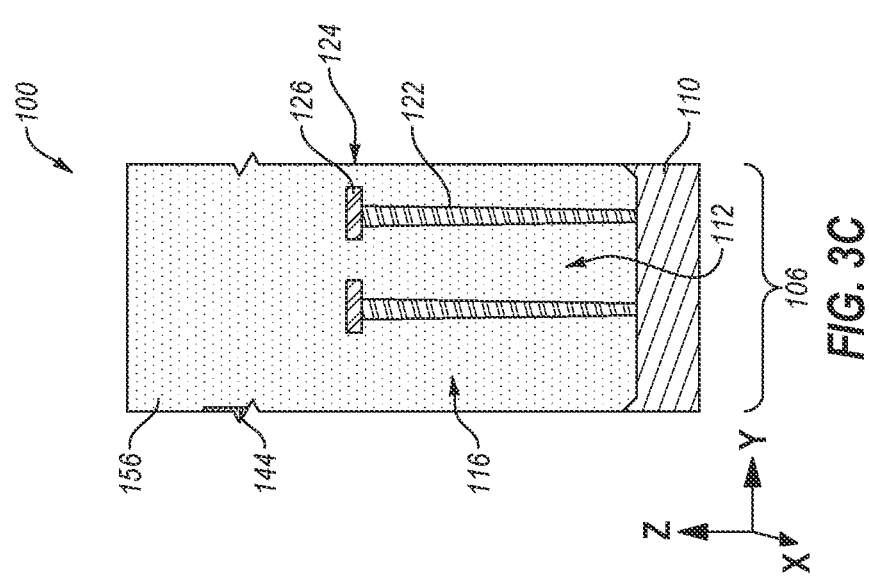
Figure 4B:
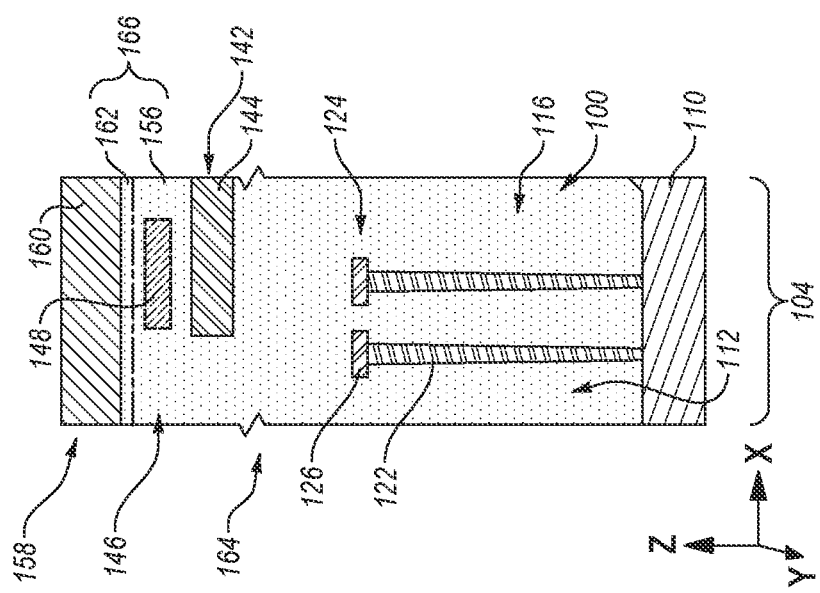
FIGS. 4A through 4D are simplified, partial longitudinal cross-sectional views of the array region (FIG. 4A), the digit line exit region (FIG. 4B), the word line exit region (FIG. 4C), and the socket region (FIG. 4D) shown in FIGS. 2A through 2D, respectively, at another processing stage of the method of forming the microelectronic device following the processing stage of FIGS. 3A through 3D.
Figure 4A:
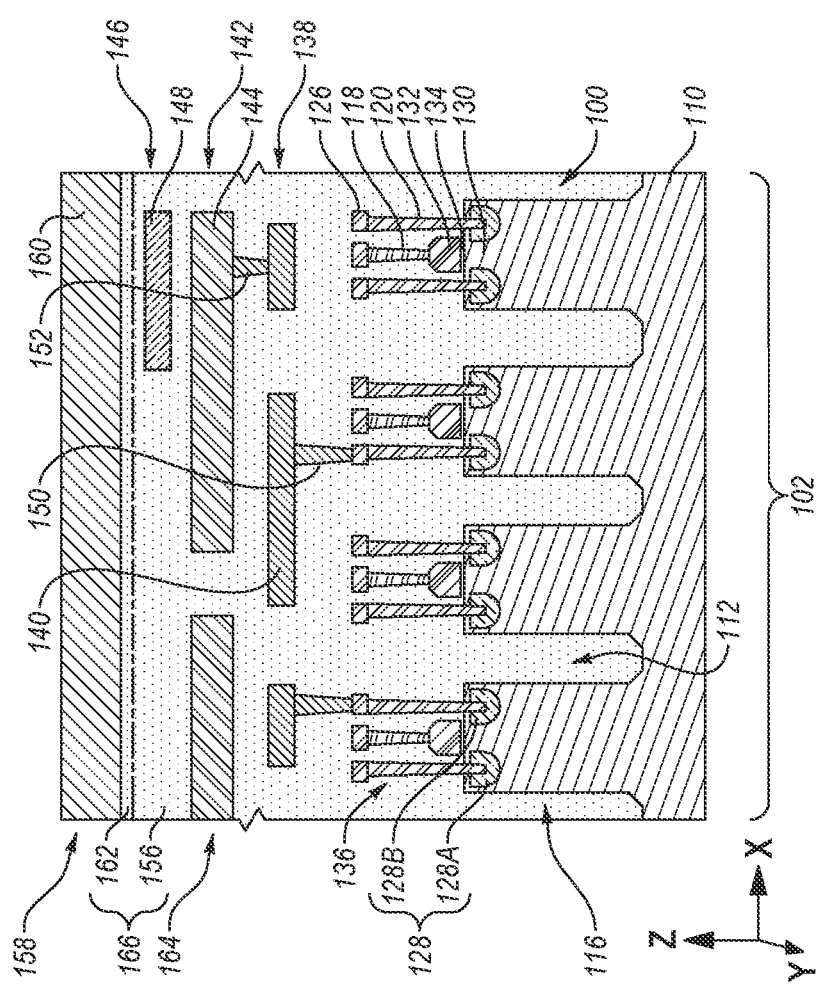
Figure 4D:
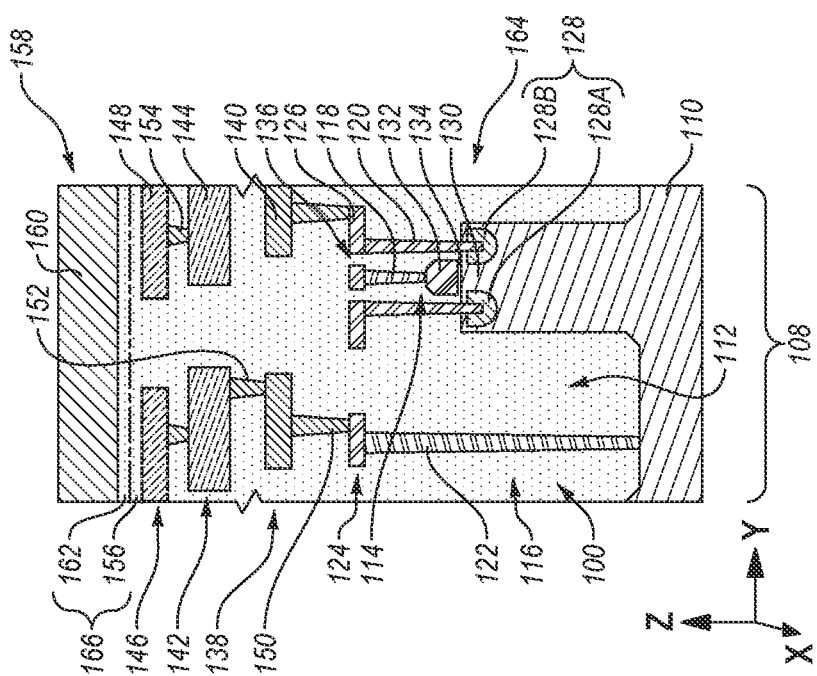
Figure 4C:
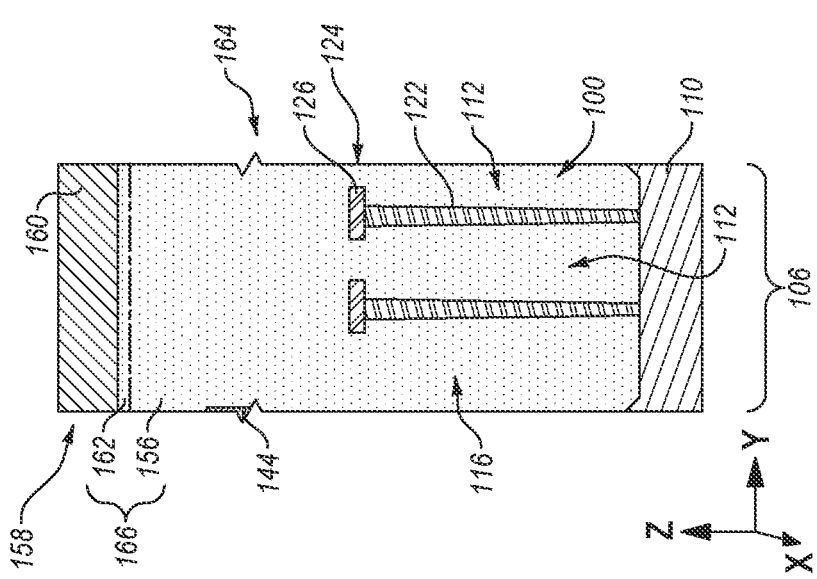

Referring next to FIGS. 3A through 3D, illustrated are simplified, partial longitudinal cross-sectional views, from the directional perspectives previously described, of the array region 102 (FIG. 3A), the digit line exit region 104 (FIG. 3B), the word line exit region 106 (FIG. 3C), and the socket region 108 (FIG. 3D) at a processing stage of the method of forming the microelectronic device following the processing stage previously described with reference to FIGS. 1 and 2A through 2D. As collectively depicted in FIGS. 3A through 3D, BEOL structures may be formed over the first routing tier 124. For example, at least one second routing tier 138 including second routing structures 140 may be formed over the first routing tier 124; at least one third routing tier 142 including third routing structures 144 may be formed over the second routing tier 138; and, optionally, at least one fourth routing tier 146 including fourth routing structures 148 may be formed over the third routing tier 142. One or more of the second routing structures 140 of the second routing tier 138 may be coupled to one or more of the first routing structures 126 of the first routing tier 124 by way of fourth contact structures 150 (FIGS. 3A and 3D). In addition, one or more of the third routing structures 144 of the third routing tier 142 may be coupled to one or more of the second routing structures 140 of the second routing tier 138 by way of fifth contact structures 152 (FIGS. 3A and 3D). Furthermore, if formed, one or more of the fourth routing structures 148 (e.g., one or more conductive pad structures) of the fourth routing tier 146 may be coupled to one or more of the third routing structures 144 of the third routing tier 142 by way of sixth contact structures 154 (FIG. 3D). In additional embodiments, at least some (e.g., all) of the sixth contact structures 154 (FIG. 3D) are omitted (e.g., are not formed), and one or more of the fourth routing structures 148 of the fourth routing tier 146 are formed to directly physically contact one or more of the third routing structures 144 of the third routing tier 142. In further embodiments, the fourth routing tier 146 including the fourth routing structures 148 is not formed at the processing stage described with reference to FIGS. 3A through 3D, and the sixth contact structures 154 (FIG. 3D) are also not formed at the processing stage described with reference to FIGS. 3A through 3D.

The second routing structures 140, the third routing structures 144, the fourth routing structures 148 (if any), the fourth contact structures 150 (FIGS. 3A and 3D), the fifth contact structures 152 (FIGS. 3A and 3D), and the sixth contact structures 154 (FIG. 3D) (if any) may each be formed of and include conductive material. By way of non-limiting example, the second routing structures 140, the third routing structures 144, the fourth routing structures 148, the fourth contact structures 150 (FIGS. 3A and 3D), the fifth contact structures 152 (FIGS. 3A and 3D), and the sixth contact structures 154 (FIG. 3D) may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the second routing structures 140 are each formed of and include W; the third routing structures 144 are each formed of and include Cu; the fourth routing structures 148 are formed of and include Al; and the fourth contact structures 150 (FIGS. 3A and 3D), the fifth contact structures 152 (FIGS. 3A and 3D), and the sixth contact structures 154 (FIG. 3D) are each formed of and include W.

Still referring to collectively to FIGS. 3A through 3D, a second isolation material 156 may be formed on or over portions of at least the first isolation material 116, the second routing structures 140, the third routing structures 144, the fourth routing structures 148 (if any), the fourth contact structures 150, the fifth contact structures 152 (FIGS. 3A and 3D), and the sixth contact structures 154 (FIG. 3D) (if any). The second isolation material 156 may be formed of and include at least one insulative material. In some embodiments, the second isolation material 156 is formed of and includes a dielectric oxide material, such as $SiO_x$ (e.g., $SiO_2$). The second isolation material 156 may be substantially homogeneous, or the second isolation material 156 may be heterogeneous. In some embodiments, the second isolation material 156 is substantially homogeneous. In additional embodiments, the second isolation material 156 is heterogeneous. The second isolation material 156 may, for example, be formed of and include a stack of at least two different dielectric materials.

Referring next to FIGS. 4A through 4D, illustrated are simplified, partial longitudinal cross-sectional views, from the directional perspectives previously described, of the array region 102 (FIG. 4A), the digit line exit region 104 (FIG. 4B), the word line exit region 106 (FIG. 4C), and the socket region 108 (FIG. 4D) at a processing stage of the method of forming the microelectronic device following the processing stage previously described with reference to FIGS. 3A through 3D. As collectively depicted in FIGS. 4A through 4D, a second microelectronic device structure 158 (e.g., a second wafer) including an additional base structure 160 and a third isolation material 162 may be attached to the second isolation material 156 of the first microelectronic device structure 100 to form a first microelectronic device structure assembly 164.

The additional base structure 160 of the second microelectronic device structure 158 comprises a base material or construction upon which additional features (e.g., materials, structures, devices) of the formed. In some embodiments, the additional base structure 160 comprises a wafer. The additional base structure 160 may be formed of and include one or more of semiconductor material (e.g., one or more of a silicon material, such monocrystalline silicon or polycrystalline silicon; silicon-germanium; germanium; gallium arsenide; a gallium nitride; gallium phosphide; indium phosphide; indium gallium nitride; and aluminum gallium nitride), a base semiconductor material on a supporting structure, glass material (e.g., one or more of BSP, PSG, FSG, BPSG, aluminosilicate glass, an alkaline earth boro-aluminosilicate glass, quartz, titania silicate glass, and soda-lime glass), and ceramic material (e.g., one or more of p-AlN, SOPAN, AlN, aluminum oxide (e.g., sapphire; $\alpha$-$Al_2O_3$), and silicon carbide). By way of non-limiting example, the additional base structure 160 may comprise a semiconductor wafer (e.g., a silicon wafer), a glass wafer, or a ceramic wafer. The additional base structure 160 may include one or more layers, structures, and/or regions formed therein and/or thereon.

The third isolation material 162 of the second microelectronic device structure 158 may be formed of and include at least one insulative material. A material composition of the third isolation material 162 may be substantially the same as a material composition of the second isolation material 156 of the first microelectronic device structure 100; or the material composition of the third isolation material 162 may be different than the material composition of the second isolation material 156. In some embodiments, the third isolation material 162 is formed of and includes a dielectric oxide material, such as $SiO_x$ (e.g., $SiO_2$). The third isolation material 162 may be substantially homogeneous, or the third isolation material 162 may be heterogeneous. In some embodiments, the third isolation material 162 is substantially homogeneous. In additional embodiments, the third isolation material 162 is heterogeneous. The third isolation material 162 may, for example, be formed of and include a stack of at least two different dielectric materials.

To attach the second microelectronic device structure 158 to the second isolation material 156 of the first microelectronic device structure 100, the second microelectronic device structure 158 may be vertically inverted (e.g., flipped upside down in the Z-direction), the third isolation material 162 thereof may be provided in physical contact with the second isolation material 156, and the third isolation material 162 and the second isolation material 156 may be exposed to annealing conditions to form bonds (e.g., oxide-to-oxide bonds) between the third isolation material 162 and the second isolation material 156. By way of non-limiting example, the third isolation material 162 and the second isolation material 156 may be exposed to a temperature greater than or equal to about 400° C. (e.g., within a range of from about 400° C. to about 800° C., greater than about 800° C.) to form oxide-to-oxide bonds between the second isolation material 156 and the third isolation material 162. In some embodiments, the second isolation material 156 and the third isolation material 162 are exposed to at least one temperature greater than about 800° C. to form oxide-to-oxide bonds between the second isolation material 156 and the third isolation material 162.

As shown in FIGS. 4A through 4D, bonding the third isolation material 162 to the second isolation material 156 may form a first connected isolation structure 166. In FIGS. 4A through 4D, the third isolation material 162 and the second isolation material 156 of the first connected isolation structure 166 are distinguished from one another by way of a dashed line. However, the third isolation material 162 to the second isolation material 156 may be integral and continuous with one another. Put another way, the first connected isolation structure 166 may be a substantially monolithic structure including the third isolation material 162 as a first region thereof, and the second isolation material 156 as a second region thereof. For the first connected isolation structure 166, the third isolation material 162 thereof may be attached to the second isolation material 156 thereof without a bond line.

Figure 5D:
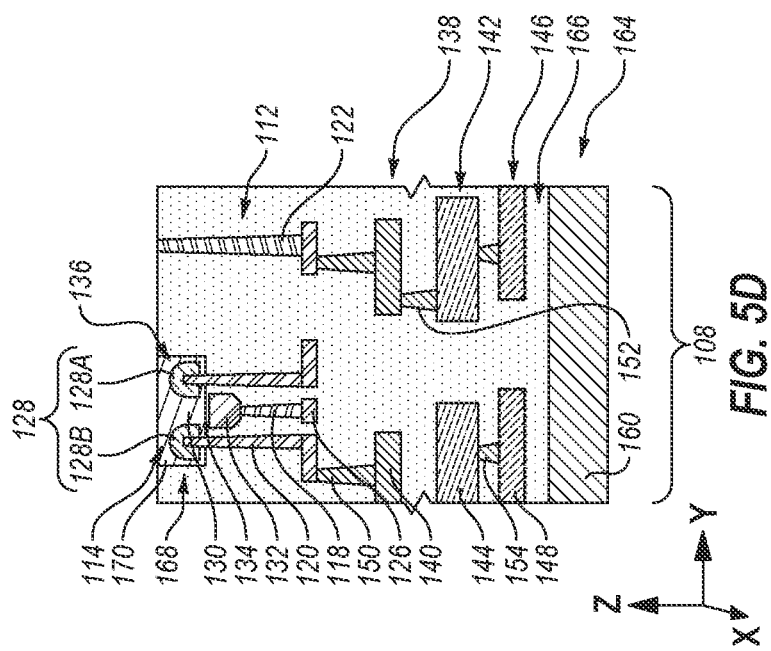
Figure 5C:
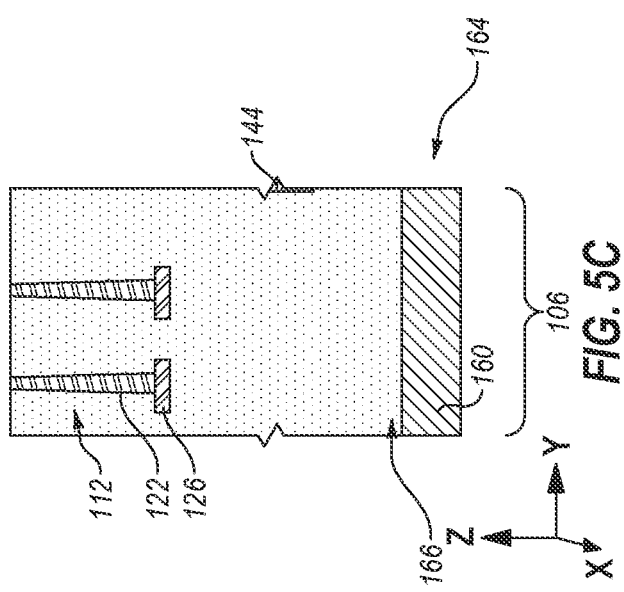

Referring next to FIGS. 5A through 5D, illustrated are simplified, partial longitudinal cross-sectional views, from the directional perspectives previously described, of the array region 102 (FIG. 5A), the digit line exit region 104 (FIG. 5B), the word line exit region 106 (FIG. 5C), and the socket region 108 (FIG. 5D) at a processing stage of the method of forming the microelectronic device following the processing stage previously described with reference to FIGS. 4A through 4D. As collectively depicted in FIGS. 5A through 5D, the first microelectronic device structure assembly 164 may be vertically inverted (e.g., flipped upside down in the Z-direction), and an upper portion of the first base semiconductor structure 110 (FIGS. 4A through 4D) may be removed to expose (e.g., uncover) the first isolation material 116 within the filled trenches 112 (FIGS. 4A through 4D) and form a first semiconductor tier 168 (FIGS. 5A and 5D) including first semiconductor structures 170 separated from one another by remaining portions of the first isolation material 116. As shown in FIGS. 5B through 5D, the material removal process may also partially expose the third contact structures 122. Upper surfaces of the third contact structures 122 may be formed to be substantially coplanar with upper surfaces of the first semiconductor structures 170.

The upper portion of the first base semiconductor structure 110 (FIGS. 4A through 4D) vertically overlying the filled trenches 112 (FIGS. 4A through 4D) following the vertical inversion of the first microelectronic device structure assembly 164 may be removed using at least one conventional wafer thinning process (e.g., a conventional CMP process; a conventional etching process, such as a conventional dry etching process, or a conventional wet etching process). The first semiconductor structures 170 may be formed to exhibit a desired vertical height (e.g., in the Z-direction) through the material removal process. The material removal process may also remove portions (e.g., upper portions following the vertical inversion of the first microelectronic device structure assembly 164) of the first isolation material 116. In addition, the material removal process may remove portions (e.g., upper portions following the vertical inversion of the first microelectronic device structure assembly 164) of the third contact structures 122 (FIGS. 5B through 5C).

Referring next to FIGS. 6A through 6D, illustrated are simplified, partial longitudinal cross-sectional views, from the directional perspectives previously described, of the array region 102 (FIG. 6A), the digit line exit region 104 (FIG. 6B), the word line exit region 106 (FIG. 6C), and the socket region 108 (FIG. 6D) at a processing stage of the method of forming the microelectronic device following the processing stage previously described with reference to FIGS. 5A through 5D. As collectively depicted in FIGS. 6A through 6D, a fourth isolation material 172 may be formed on or over surfaces of the first isolation material 116, the first semiconductor structures 170 (FIGS. 6A and 6D), and the third contact structures 122 (FIGS. 6B through 6D); portions of the fourth isolation material 172 may be removed and contact pad structures 174 may be formed on the third contact structures 122 (FIGS. 6B through 6D); and then a fifth isolation material 176 may be formed on or over surfaces of the fourth isolation material 172 and the contact pad structures 174.

The fourth isolation material 172 may be formed of and include at least one insulative material. A material composition of the fourth isolation material 172 may be substantially the same as a material composition of the first isolation material 116, or the material composition of the fourth isolation material 172 may be different than the material composition of the first isolation material 116. In some embodiments, the fourth isolation material 172 is formed of and includes a dielectric oxide material, such as $SiO_x$ (e.g., $SiO_2$). The fourth isolation material 172 may be substantially homogeneous, or the fourth isolation material 172 may be heterogeneous. In some embodiments, the fourth isolation material 172 is substantially homogeneous. In additional embodiments, the fourth isolation material 172 is heterogeneous. The fourth isolation material 172 may, for example, be formed of and include a stack of at least two different dielectric materials. An upper surface of the fourth isolation material 172 may be formed to be substantially planar.

Figure 6B:
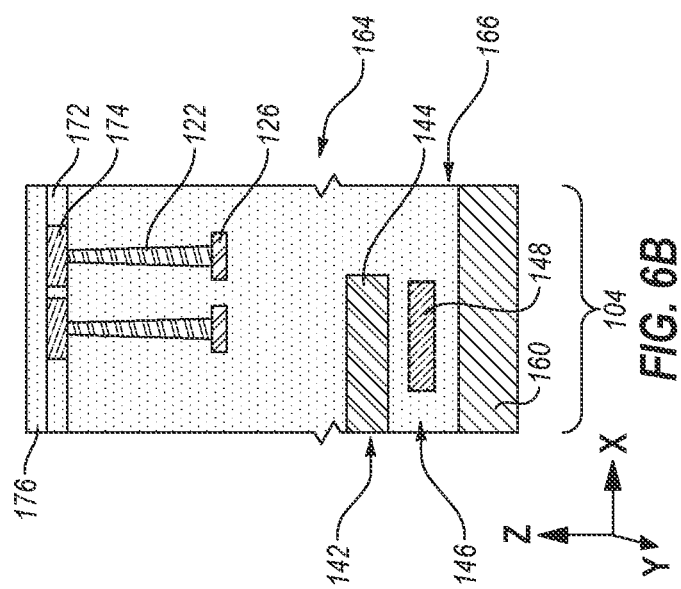
FIGS. 6A through 6D are simplified, partial longitudinal cross-sectional views of the array region (FIG. 6A), the digit line exit region (FIG. 6B), the word line exit region (FIG. 6C), and the socket region (FIG. 6D) shown in FIGS. 2A through 2D, respectively, at another processing stage of the method of forming the microelectronic device following the processing stage of FIGS. 5A through 5D.
Figure 6A:
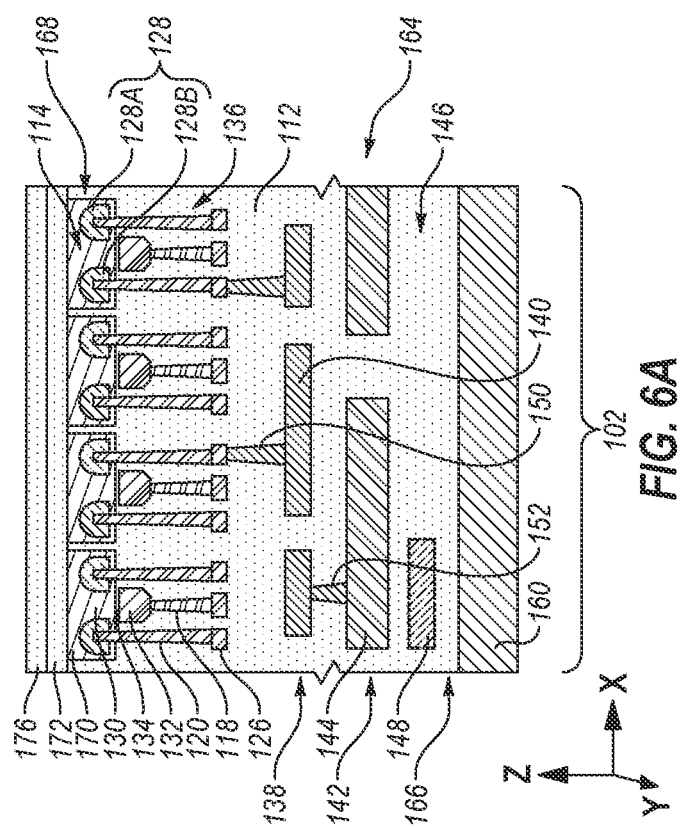
Figure 6D:
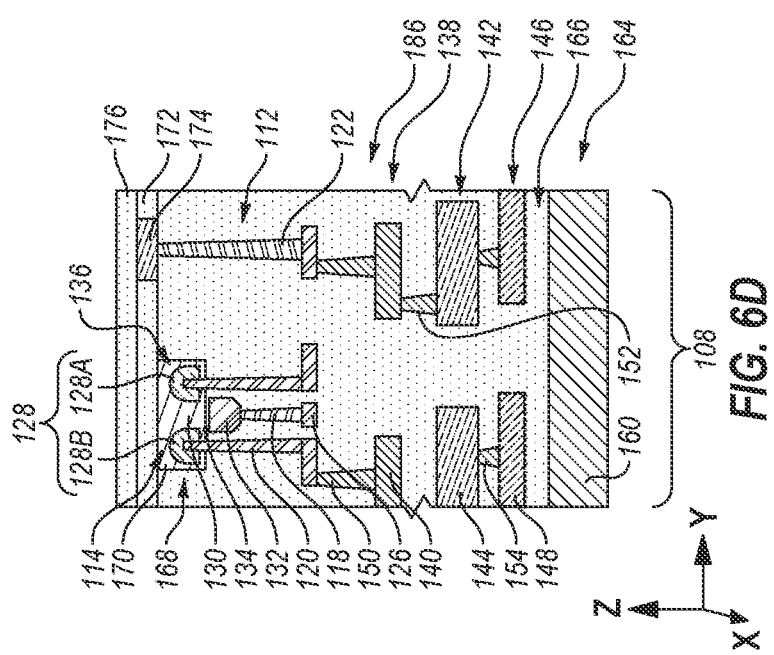
Figure 6C:
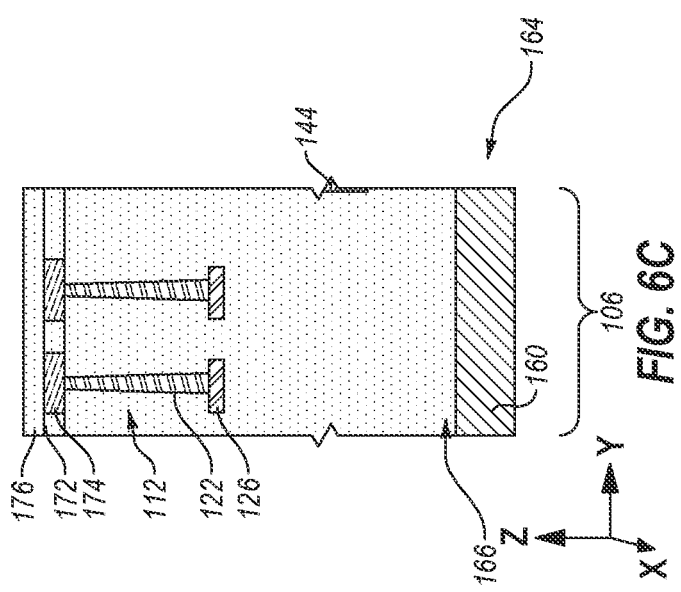

Referring to FIGS. 6B through 6D, the contact pad structures 174 may be formed to physically contact the third contact structures 122. Geometric configurations, horizontal positions, and horizontal spacing of the contact pad structures 174 at least partially depend on the geometric configurations, horizontal positions, and horizontal spacing of the third contact structures 122. Individual contact pad structures 174 may be formed to at least partially horizontally overlap individual third contact structures 122. In some embodiments, each contact pad structure 174 is formed to substantially cover an upper surface of a third contact structure 122 in physical contact therewith. Individual contact pad structures 174 may be formed to have horizontal dimensions (e.g., in the X-direction and in the Y-direction) greater than or equal to corresponding horizontal dimensions of individual third contact structures 122 in physical contact therewith.

The contact pad structures 174 may be formed of and include conductive material. By way of non-limiting example, the contact pad structures 174 may each individually be formed of and include one or more of at least one metal, at least one alloy, and at least one conductive metal-containing material (e.g., a conductive metal nitride, a conductive metal silicide, a conductive metal carbide, a conductive metal oxide). A material composition of each of the contact pad structures 174 may be substantially the same as a material composition of each of the third contact structures 122 (FIG. 6B through 6D), or the material composition of one or more of the contact pad structures 174 may be different than the material composition of one or more of the third contact structures 122 (FIGS. 6B through 6D). In some embodiments, the contact pad structures 174 are each individually formed of and include Cu. In additional embodiments, the contact pad structures 174 are each individually formed of and include W. Each of the contact pad structures 174 may be substantially homogeneous, or one or more of the contact pad structures 174 may individually be heterogeneous. In some embodiments, each of the contact pad structures 174 is substantially homogeneous. In additional embodiments, each of the contact pad structures 174 is heterogeneous. Each contact pad structure 174 may, for example, be formed of and include a stack of at least two different conductive materials.

The fifth isolation material 176 formed to cover the fourth isolation material 172 and the contact pad structures 174 (FIGS. 6B through 6D) may be formed of and include at least one insulative material. A material composition of the fifth isolation material 176 may be substantially the same as a material composition of the fourth isolation material 172, or the material composition of the fifth isolation material 176 may be different than the material composition of the fourth isolation material 172. In some embodiments, the fifth isolation material 176 is formed of and includes a dielectric oxide material, such as $SiO_x$ (e.g., $SiO_2$). The fifth isolation material 176 may be substantially homogeneous, or the fifth isolation material 176 may be heterogeneous. In some embodiments, the fifth isolation material 176 is substantially homogeneous. In additional embodiments, the fifth isolation material 176 is heterogeneous. The fifth isolation material 176 may, for example, be formed of and include a stack of at least two different dielectric materials. As shown in FIGS. 6A through 6D, an upper surface of the fifth isolation material 176 may be formed to be substantially planar.

Figure 7:
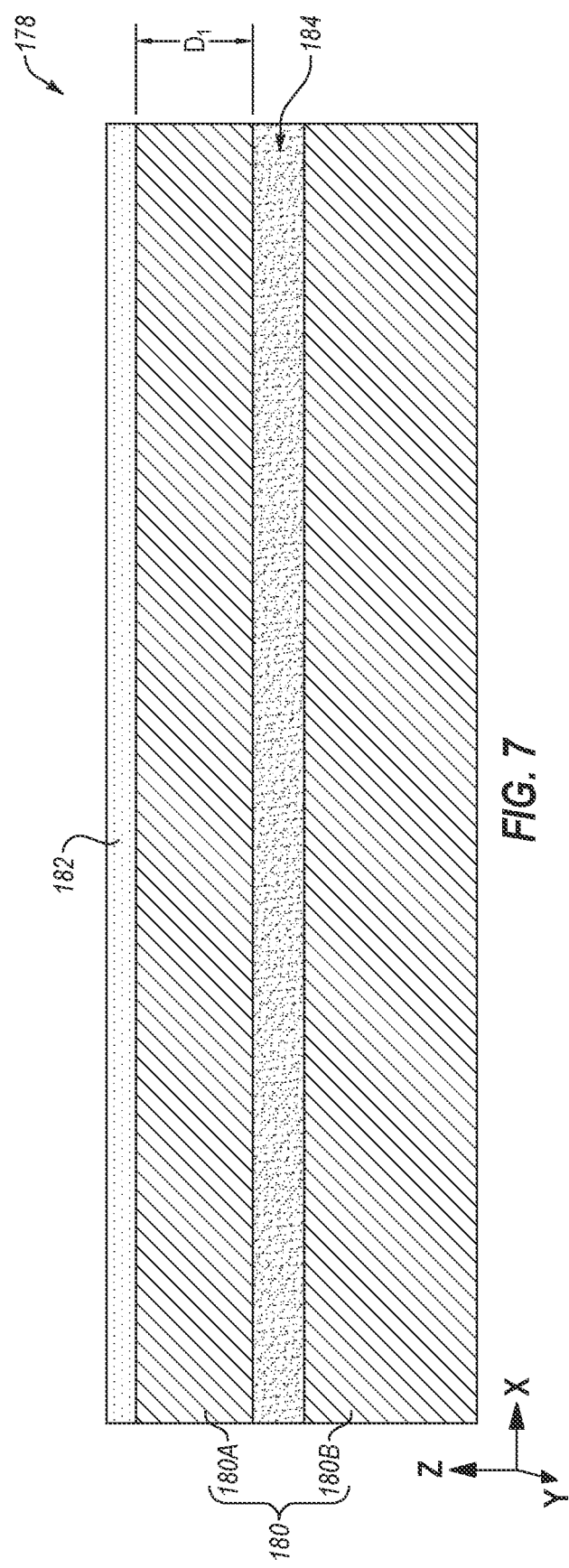
FIG. 7 is a simplified, partial longitudinal cross-sectional view of an additional microelectronic device structure at a processing stage of the method of forming a microelectronic device, in accordance with embodiments of the disclosure.

Referring next to FIG. 7, illustrated is simplified, partial longitudinal cross-sectional view from the perspective of the Y-direction (so as to depict an XZ-plane) of a third microelectronic device structure 178 (e.g., a third wafer) may be formed to include a second base semiconductor structure 180 and a sixth isolation material 182 formed on, over, or within the second base semiconductor structure 180. The third microelectronic device structure 178 may be formed separate from the first microelectronic device structure assembly 164 (FIGS. 6A through 6D). Following separate formation, the third microelectronic device structure 178 may be attached to the first microelectronic device structure assembly 164 (FIGS. 6A through 6D), as described in further detail below with reference to FIGS. 8A through 8D.

The second base semiconductor structure 180 of the third microelectronic device structure 178 comprises a base material or construction upon which additional features (e.g., materials, structures, devices) of the formed. In some embodiments, the second base semiconductor structure 180 comprises a wafer. The second base semiconductor structure 180 may be formed of and include a semiconductor material (e.g., one or more of a silicon material, such monocrystalline silicon or polycrystalline silicon; silicon-germanium; germanium; gallium arsenide; a gallium nitride; gallium phosphide; indium phosphide; indium gallium nitride; and aluminum gallium nitride). By way of non-limiting example, the second base semiconductor structure 180 may comprise a semiconductor wafer (e.g., a silicon wafer). The second base semiconductor structure 180 may include one or more layers, structures, and/or regions formed therein and/or thereon.

As shown in FIG. 7, optionally, the second base semiconductor structure 180 may include at least one detachment region 184 therein configured to promote or facilitate detachment of a portion 180A of the second base semiconductor structure 180 proximate (e.g., adjacent) the sixth isolation material 182 from an additional portion 180B of the second base semiconductor structure 180 relatively more distal from the sixth isolation material 182. By way of non-limiting example, the detachment region 184 may include one more of dopants (e.g., hydrogen), void spaces, and/or structural features (e.g., defects, damage) promoting or facilitating subsequent detachment of the portion 180A from the additional portion 180B, as described in further detail below. A vertical depth Di (e.g., in the Z-direction) of the detachment region 184 within the second base semiconductor structure 180 may correspond to desired vertical height of the portion 180A of the second base semiconductor structure 180. The vertical height of the portion 180A may be selected at least partially based on desired configuration of additional features (e.g., structures, materials, devices) to be formed using the portion 180A of the second base semiconductor structure 180 following the detachment thereof from the additional portion 180B of the second base semiconductor structure 180. In some embodiments, the vertical depth Di of the detachment region 184 (and, hence, the vertical height of the portion 180A of the second base semiconductor structure 180) is within a range of from about 400 nanometers (nm) to about 800 nm. In additional embodiments, the detachment region 184 is absent from the second base semiconductor structure 180. In some of such embodiments, the additional portion 180B of the second base semiconductor structure 180 may subsequently be removed relative to the portion 180A of the second base semiconductor structure 180 through a different process (e.g., a non-detachment-based process, such as a conventional grinding process).

The sixth isolation material 182 of the third microelectronic device structure 178 may be formed of and include at least one insulative material. A material composition of the sixth isolation material 182 of the third microelectronic device structure 178 may be substantially the same as a material composition of the fifth isolation material 176 (FIGS. 6A through 6D) of the first microelectronic device structure assembly 164 (FIGS. 6A through 6D); or the material composition of the sixth isolation material 182 may be different than the material composition of the fifth isolation material 176 (FIGS. 6A through 6D). In some embodiments, the sixth isolation material 182 is formed of and includes a dielectric oxide material, such as $SiO_x$ (e.g., $SiO_2$). The sixth isolation material 182 may be substantially homogeneous, or the sixth isolation material 182 may be heterogeneous. In some embodiments, the sixth isolation material 182 is substantially homogeneous. In additional embodiments, the sixth isolation material 182 is heterogeneous. The sixth isolation material 182 may, for example, be formed of and include a stack of at least two different dielectric materials.

Referring next to FIGS. 8A through 8D, illustrated are simplified, partial longitudinal cross-sectional views, from the directional perspectives previously described, of the array region 102 (FIG. 8A), the digit line exit region 104 (FIG. 8B), the word line exit region 106 (FIG. 8C), and the socket region 108 (FIG. 8D) previously described with reference to FIGS. 2A through 2D at a processing stage of the method of forming the microelectronic device following the processing stage previously described with reference to FIGS. 6A through 6D and following the processing stage previously described with reference to FIG. 7. While the different regions shown in FIGS. 8A through 8D were previously described as different regions of the first microelectronic device structure 100 (FIGS. 1 and 2A through 2D) and of the first microelectronic device structure assembly 164 (FIGS. 6A through 6D) formed by processing the first microelectronic device structure 100 according to the methods of the disclosure, it will be understood that these regions become regions of a microelectronic device of the disclosure formed using the first microelectronic device structure assembly 164 and the third microelectronic device structure 178, as described in further detail below. Thus, these different regions are not limited to the features (e.g., structures, materials, devices) and/or portions of features of the first microelectronic device structure 100 and the first microelectronic device structure assembly 164. Instead, these regions evolve through the methods of the disclosure to encompass and include additional features (e.g., additional structures, additional materials, additional devices), portions of additional features, and/or modified features.

As depicted in FIGS. 8A through 8D, the third microelectronic device structure 178 may be vertically inverted (e.g., flipped upside down in the Z-direction) and the sixth isolation material 182 thereof may be attached (e.g., bonded, such as through oxide-oxide bonding) to the fifth isolation material 176 of the first microelectronic device structure assembly 164 to form a second microelectronic device structure assembly 186. Attaching (e.g., bonding) the sixth isolation material 182 of the third microelectronic device structure 178 to the fifth isolation material 176 of the first microelectronic device structure assembly 164 may form a second connected isolation structure 188 of the second microelectronic device structure assembly 186. Alternatively, the first microelectronic device structure assembly 164 may be vertically inverted (e.g., flipped upside down in the Z-direction) and attached to the third microelectronic device structure 178 to form the second microelectronic device structure assembly 186.

To form the second connected isolation structure 188 of the second microelectronic device structure assembly 186, after physically contacting the fifth isolation material 176 of the first microelectronic device structure assembly 164 with the sixth isolation material 182 of the third microelectronic device structure 178, the first microelectronic device structure assembly 164 and the third microelectronic device structure 178 may be exposed to annealing conditions to form bonds (e.g., oxide-to-oxide bonds) between the fifth isolation material 176 and the sixth isolation material 182. By way of non-limiting example, the fifth isolation material 176 and the sixth isolation material 182 may be exposed to a temperature greater than or equal to about 400° C. (e.g., within a range of from about 400° C. to about 800° C., greater than about 800° C.) to form oxide-to-oxide bonds between the fifth isolation material 176 and the sixth isolation material 182. In some embodiments, the fifth isolation material 176 and the sixth isolation material 182 are exposed to at least one temperature greater than about 800° C. to form oxide-to-oxide bonds between the fifth isolation material 176 and the sixth isolation material 182 and attach the first microelectronic device structure assembly 164 to the third microelectronic device structure 178.

Figure 8B:
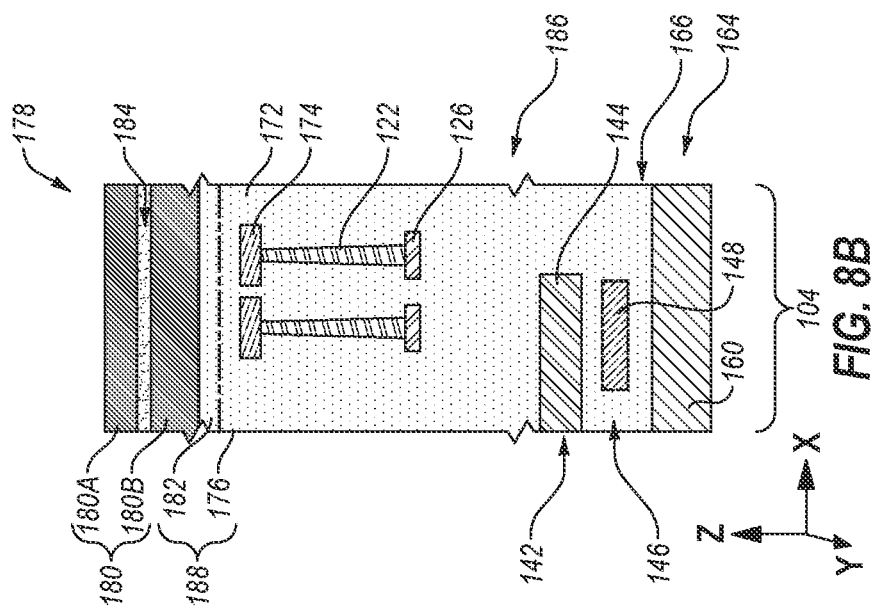
FIGS. 8A through 8D are simplified, partial longitudinal cross-sectional views of the array region (FIG. 8A), the digit line exit region (FIG. 8B), the word line exit region (FIG. 8C), and the socket region (FIG. 8D) shown in FIGS. 2A through 2D, respectively, at another processing stage of the method of forming the microelectronic device following the processing stage of FIGS. 6A through 6D and the processing stage of FIG. 7.
Figure 8A:
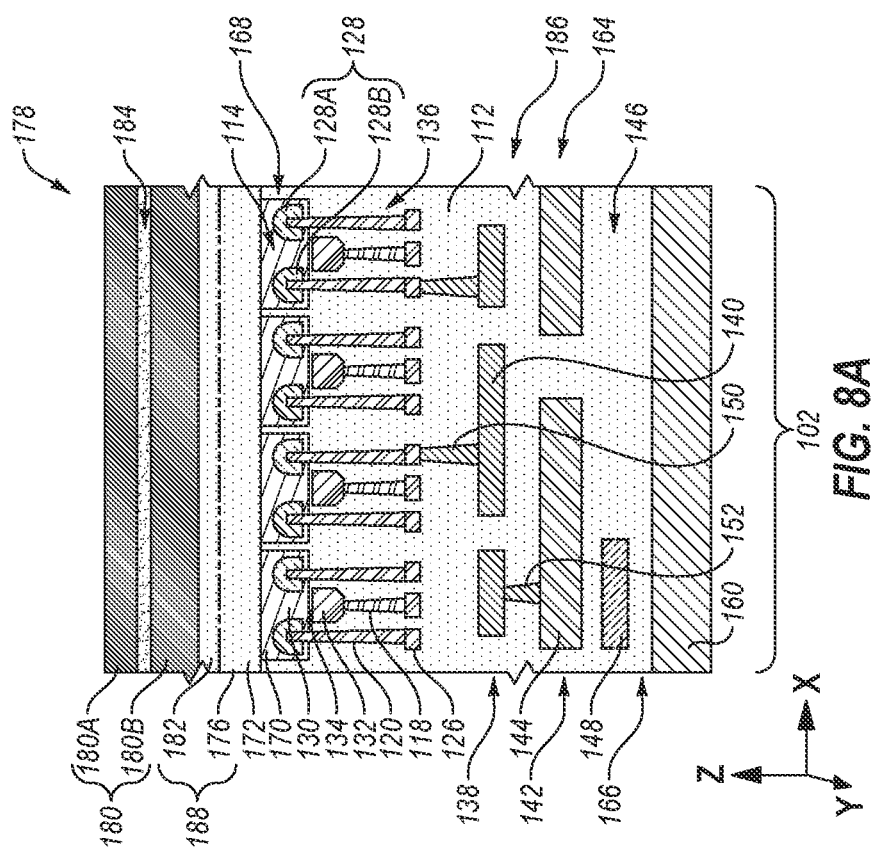
Figure 8D:
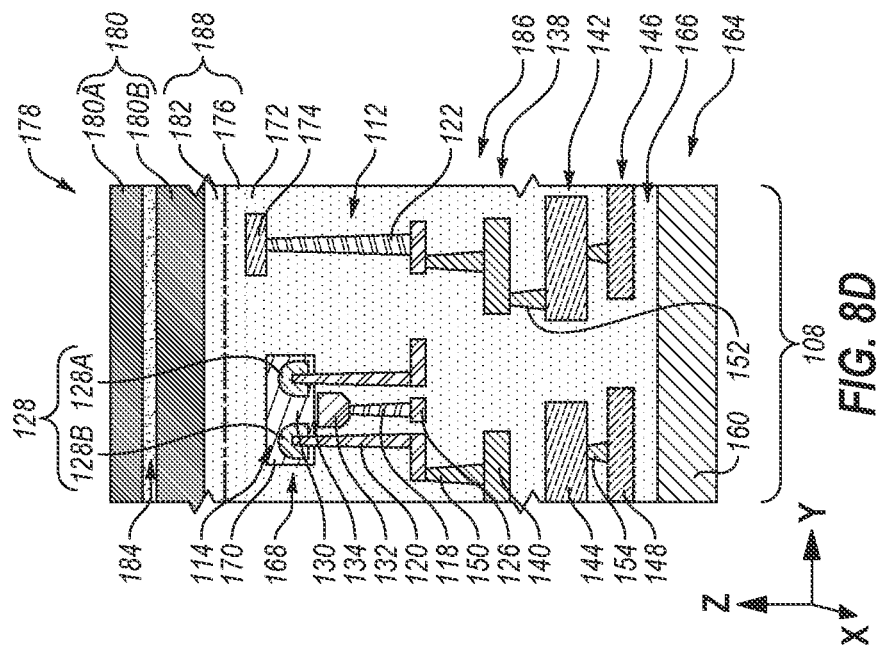
Figure 8C:
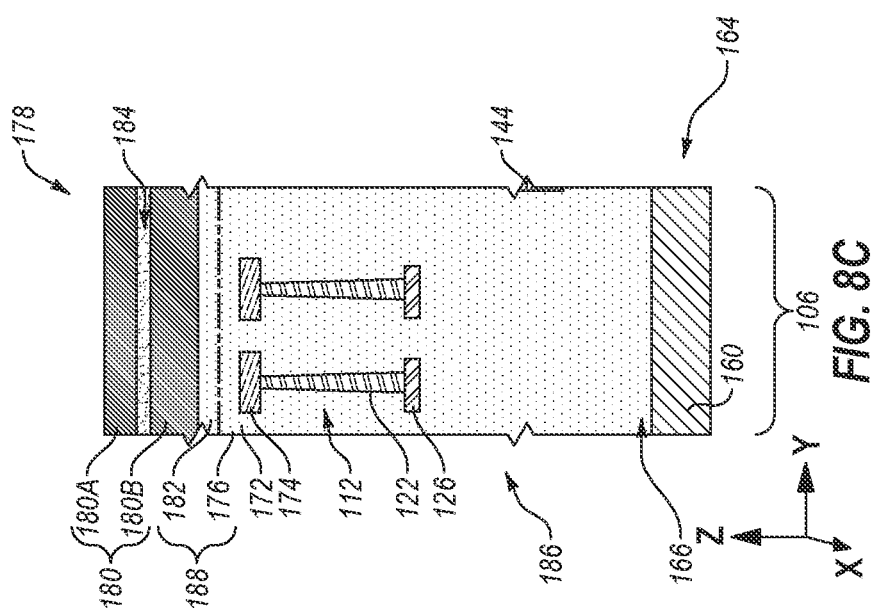

While the fifth isolation material 176 and the sixth isolation material 182 of the second connected isolation structure 188 of the second microelectronic device structure assembly 186 are distinguished from one another in FIGS. 8A through 8D by way of a dashed line in FIGS. 8A through 8B, the fifth isolation material 176 and the sixth isolation material 182 may be integral and continuous with one another. Put another way, the second connected isolation structure 188 may be a substantially monolithic structure including the fifth isolation material 176 as a first region (e.g., a vertically lower region) thereof, and the sixth isolation material 182 as a second region (e.g., a vertically upper region) thereof. For the second connected isolation structure 188, the fifth isolation material 176 thereof may be attached to the sixth isolation material 182 thereof without a bond line.

Still referring to FIGS. 8A through 8D, attaching the third microelectronic device structure 178 to the first microelectronic device structure assembly 164 to form the second microelectronic device structure assembly 186 in the manner described above may facilitate forming individual socket regions 108 (FIG. 8D) to have a relatively reduced horizontal area as compared to conventional microelectronic device configurations. For example, by attaching the third microelectronic device structure 178 to the first microelectronic device structure assembly 164 prior to forming various devices (e.g., access devices, storage node device) and associated additional interconnect features (e.g., contact structures, routing structures) of a microelectronic device of the disclosure, various alignment considerations may be alleviated and the horizontal footprint that would otherwise be needed to account for such alignment considerations may be reduced. The horizontal area of an individual socket region 108 (FIG. 8D) may, for example, be from about 40 percent to about 60 percent smaller than the horizontal area of a conventional socket region of a conventional microelectronic device configuration. Such socket region size reduction may facilitate relatively enhanced areal density for sub-20 nanometer (nm) technology nodes.

Figure 9D:
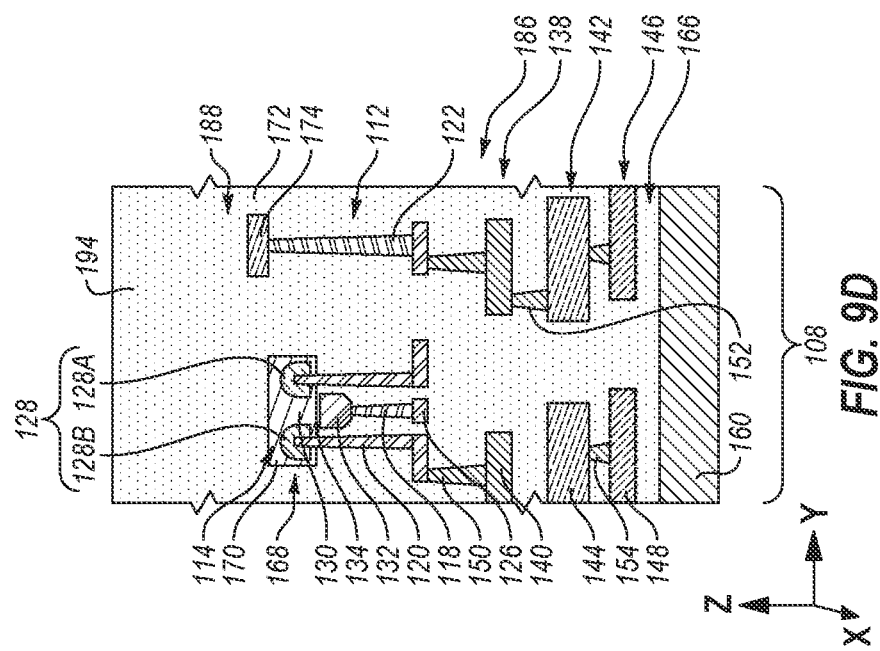
Figure 9C:
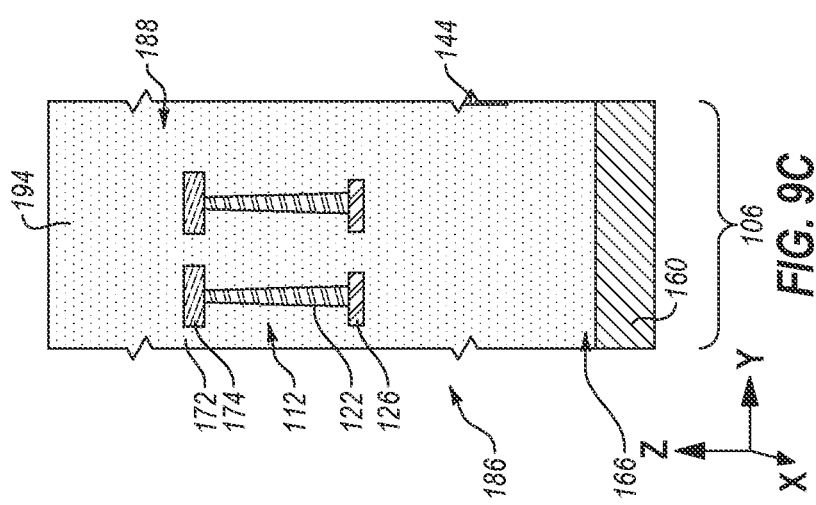

Referring next to FIGS. 9A through 9D, illustrated are simplified, partial longitudinal cross-sectional views, from the directional perspectives previously described, of the array region 102 (FIG. 9A), the digit line exit region 104 (FIG. 9B), the word line exit region 106 (FIG. 9C), and the socket region 108 (FIG. 9D) at a processing stage of the method of forming the microelectronic device following the processing stage previously described with reference to FIGS. 8A through 8D. As depicted in FIGS. 9A through 9D, the additional portion 180B (FIGS. 8A through 8D) of the second base semiconductor structure 180 (FIGS. 8A through 8D) is removed while at least partially maintaining the portion 180A (FIGS. 8A through 8D) of the second base semiconductor structure 180 (FIGS. 8A through 8D), and then the at least partially maintained portion 180A (FIGS. 8A through 8D) may be patterned to form a second semiconductor tier 190 (FIGS. 9A and 9D) including second semiconductor structures 192 (FIGS. 9A and 9D). The second semiconductor structures 192 may be employed to subsequently form additional features (e.g., structures; devices, such as transistors), as described in further detail below. In addition, a seventh isolation material 194 may be formed horizontally adjacent the second semiconductor structures 192 of the second semiconductor tier 190.

The additional portion 180B (FIGS. 8A through 8D) of the second base semiconductor structure 180 (FIGS. 8A through 8D) may be removed using conventional processes (e.g., a detachment process; a wafer thinning process, such as a grinding processes) and conventional processing equipment, which are not described in detail herein. By way of non-limiting example, in some embodiments wherein the second base semiconductor structure 180 (FIGS. 8A through 8D) includes the detachment region 184 (FIGS. 8A through 8D) including one more of dopants (e.g., hydrogen), void spaces, and/or structural features (e.g., defects, damage) promoting or facilitating subsequent detachment of the portion 180A (FIGS. 8A through 8D) from the additional portion 180B (FIGS. 8A through 8D), the second base semiconductor structure 180 (FIGS. 8A through 8D) may be acted upon to effectuate such detachment at or proximate the detachment region 184 (FIGS. 8A through 8D). In addition, parts of the portion 180A (FIGS. 8A through 8D) of the second base semiconductor structure 180 (FIGS. 8A through 8D) maintained following the removal of the additional portion 180B (FIGS. 8A through 8D) of the second base semiconductor structure 180 (FIGS. 8A through 8D) may be further processed (e.g., polished, patterned) to form the second semiconductor structures 192 of the second semiconductor tier 190 using conventional processes (e.g., conventional CMP processes, conventional masking processes, conventional etching processes) and conventional processing equipment, which are also not described in detail herein. A vertical height (e.g., in the Z-direction) of the second semiconductor structures 192 may be less than or equal to the vertical height of the portion 180A (FIGS. 8A through 8D) of the second base semiconductor structure 180 (FIGS. 8A through 8D). In some embodiments, the vertical height of the second semiconductor structures 192 is formed to be less than the vertical height of the portion 180A (FIGS. 8A through 8D) of the second base semiconductor structure 180 (FIGS. 8A through 8D). For example, the vertical height of the second semiconductor structures 192 may be formed to be within a range of from about 100 nm to about 300 nm, such as from about 150 nm to about 250 nm, or about 200 nm.

As collectively depicted in FIGS. 9A through 9D, following the processing of the additional portion 180B (FIGS. 8A through 8D) of the second base semiconductor structure 180 (FIGS. 8A through 8D), some of the regions (e.g., the array region 102 shown in FIG. 9A, the socket region 108 shown in FIG. 9D) include the resulting second semiconductor structures 192, and some other of the regions (e.g., the digit line exit region 104 shown in FIG. 9B, the word line exit region 106 shown in FIG. 9C) are substantially free of the resulting second semiconductor structures 192. For example, the array region 102 shown in FIG. 9A may include some of the second semiconductor structures 192, wherein horizontally neighboring second semiconductor structures 192 are separated from one another by the seventh isolation material 194. As another example, each of the digit line exit region 104 shown in FIG. 9B and the word line exit region 106 shown in FIG. 9C may be substantially free of the second semiconductor structures 192. As collectively illustrated in FIGS. 9A through 9D, in some embodiments, an upper surface of the seventh isolation material 194 is formed to be substantially coplanar with upper surfaces of the second semiconductor structures 192 of the second semiconductor tier 190.

The seventh isolation material 194 may be formed of and include at least one insulative material. A material composition of the seventh isolation material 194 may be substantially the same as a material composition of the second connected isolation structure 188, or the material composition of the seventh isolation material 194 may be different than the material composition of the second connected isolation structure 188. In some embodiments, the seventh isolation material 194 is formed of and includes a dielectric oxide material, such as $SiO_x$ (e.g., $SiO_2$). The seventh isolation material 194 may be substantially homogeneous, or the seventh isolation material 194 may be heterogeneous. In some embodiments, the seventh isolation material 194 is substantially homogeneous. In additional embodiments, the seventh isolation material 194 is heterogeneous. The seventh isolation material 194 may, for example, be formed of and include a stack of at least two different dielectric materials.

Figure 10B:
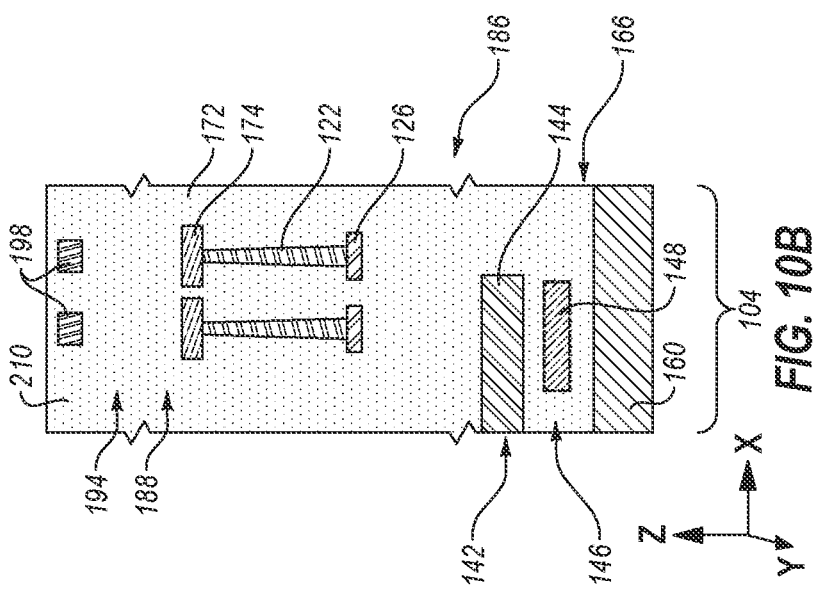
FIGS. 10A through 10D are simplified, partial longitudinal cross-sectional views of the array region (FIG. 10A), the digit line exit region (FIG. 10B), the word line exit region (FIG. 10C), and the socket region (FIG. 10D) shown in FIGS. 2A through 2D, respectively, at another processing stage of the method of forming the microelectronic device following the processing stage of FIGS. 9A through 9D.
Figure 10A:
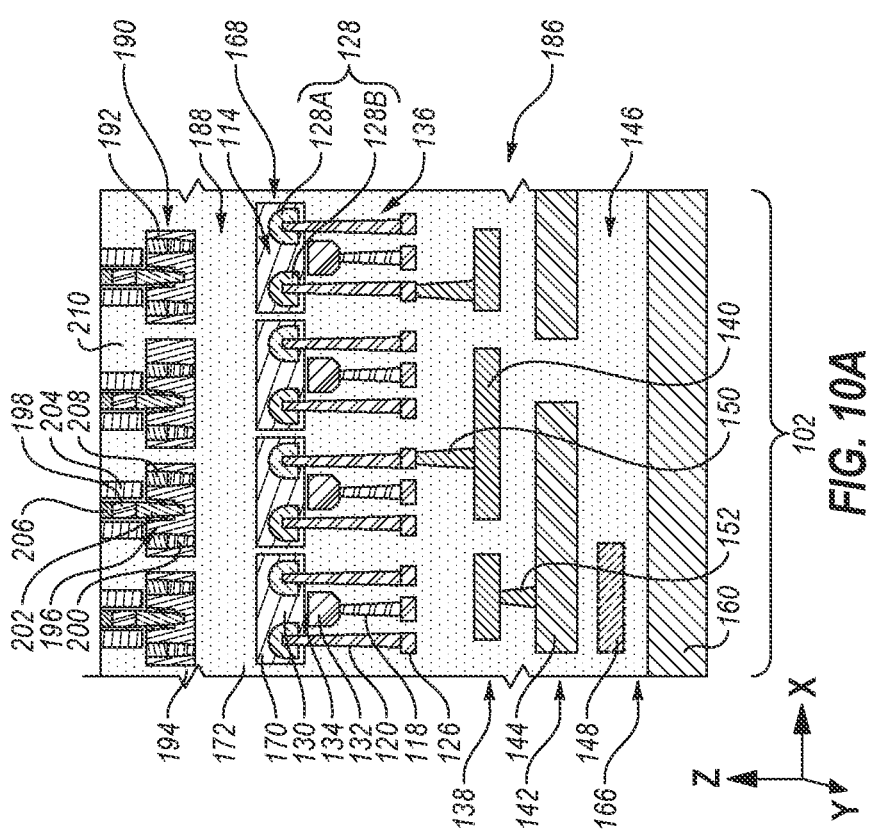
Figure 10D:
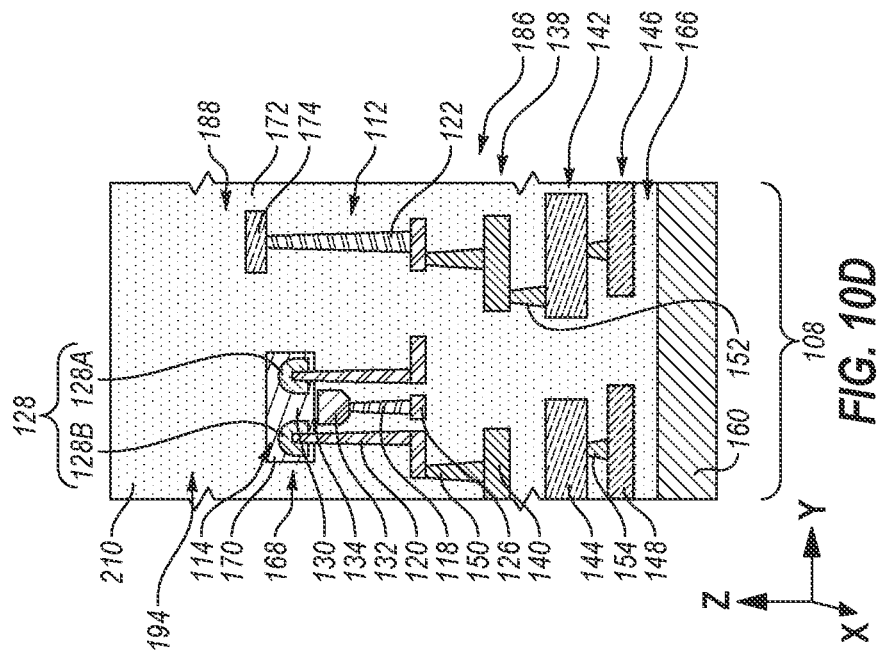
Figure 10C:
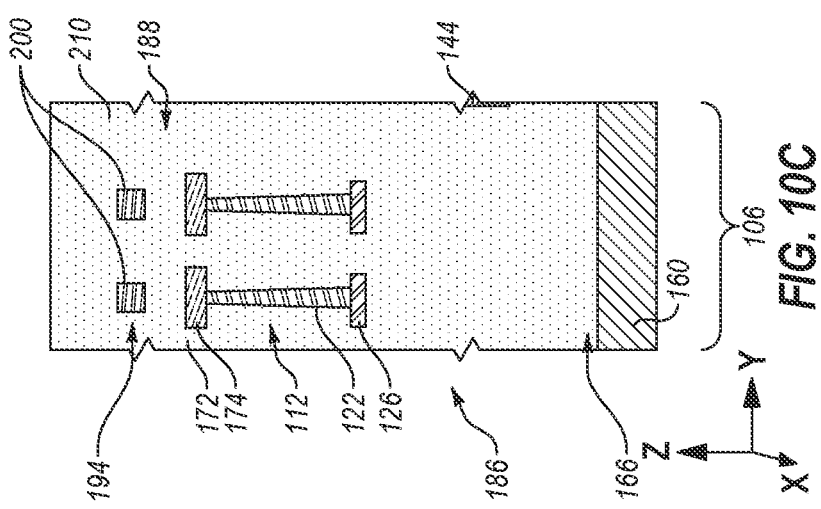

Referring next to FIGS. 10A through 10D, illustrated are simplified, partial longitudinal cross-sectional views, from the directional perspectives previously described, of the array region 102 (FIG. 10A), the digit line exit region 104 (FIG. 10B), the word line exit region 106 (FIG. 10C), and the socket region 108 (FIG. 10D) at a processing stage of the method of forming the microelectronic device following the processing stage previously described with reference to FIGS. 9A through 9D. As collectively depicted in FIGS. 10A through 10D, access devices 196 (FIG. 10A) (e.g., access transistors) may be formed within the array region 102 (FIG. 10A). In addition, digit lines 198 (FIGS. 10A and 10B) (e.g., data lines, bit lines) may be formed to be coupled to the access devices 196 (FIG. 10A) and to horizontally extend in the Y-direction through the array region 102 (FIG. 10A). At least some of the digit lines 198 (FIGS. 10A and 10B) may terminate (e.g., end) within the digit line exit region 104 (FIG. 10B). Furthermore, word lines 200 (e.g., access lines) may be formed to be coupled to the access devices 196 (FIG. 10A) and to horizontally extend in the X-direction through the array region 102 (FIG. 10A). At least some of the word lines 200 (FIGS. 10A and 10C) may terminate within the word line exit region 106 (FIG. 10C).

Referring to FIG. 10A, the access devices 196 formed within the array region 102 may be employed as components of memory cells (e.g., DRAM cells) to be formed within the array region 102. By way of non-limiting example, each access device 196 may individually be formed to include a channel region comprising a portion of one of the second semiconductor structures 192; a source region and a drain region each individually comprising one or more of at least one conductively doped portion of the one second semiconductor structures 192 and/or at least one conductive structure formed in, on, or over the one of the second semiconductor structures 192; and at least one gate structure comprising a portion of at least one of the word lines 200. Each access device 196 may also include a gate dielectric material (e.g., a dielectric oxide material) formed to be interposed between the channel region thereof and the gate structure thereof.

The digit lines 198 may exhibit horizontally elongate shapes extending in parallel in the Y-direction; and the word lines 200 may exhibit horizontally elongate shapes extending in parallel in the X-direction orthogonal to the Y-direction. As used herein, the term "parallel" means substantially parallel. The digit lines 198 and the word lines 200 may each individually be formed of and include conductive material. By way of non-limiting example, the digit lines 198 and the word lines 200 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit lines 198 and the word lines 200 are each individually formed of and include one or more of W, Ru, Mo, and titanium nitride ($TiN_y$). Each of the digit lines 198 and each of the word lines 200 may individually be substantially homogeneous, or one or more of the digit lines 198 and/or one or more of the word lines 200 may individually be substantially heterogeneous. In some embodiments, each of the digit lines 198 and each of the word lines 200 are formed to be substantially homogeneous.

Still referring to FIG. 10A, within the array region 102, additional features (e.g., structures, materials) are also formed on, over, and/or between the access devices 196, the digit lines 198, and the word lines 200. For example, as shown in FIG. 10A, seventh contact structures 202 (e.g., digit line contact structures, also referred to as so-called "bitcon" structures) may be formed to vertically extend between and couple the access devices 196 to the digit lines 198; eighth contact structures 204 (e.g., cell contact structures, also referred to as so-called "cellcon" structures) may be formed in contact with the access devices 196 and may configured and positioned to couple the access devices 196 to subsequently formed storage node devices (e.g., capacitors); dielectric cap structures 206 may be formed on or over the digit lines 198; and additional dielectric cap structures 208 may be formed on or over the word lines 200. The seventh contact structures 202 and the eighth contact structures 204 may individually be formed of and include at least one conductive material. In some embodiments, the seventh contact structures 202 and the eighth contact structures 204 are individually formed of and include one or more of at least one metal (e.g., W), at least one alloy, at least one conductive metal silicide (e.g., one or more of titanium silicide ($TiSi_x$), cobalt silicide ($CoSi_x$), tungsten silicide ($WSi_x$), tantalum silicide ($TaSi_x$), molybdenum silicide ($MoSi_x$), and nickel silicide ($NiSi_x$)), and at least one conductive metal nitride (e.g., one or more of titanium nitride ($TiN_y$), tungsten nitride ($WN_y$), tantalum nitride ($TaN_y$), cobalt nitride ($CoN_y$), molybdenum nitride ($MoN_y$), and nickel nitride ($NiN_y$)). In addition, the dielectric cap structures 206 and the additional dielectric cap structures 208 may individually be formed of and include at least one insulative material. In some embodiments, the dielectric cap structures 206 and the additional dielectric cap structures 208 are individually formed of and include a dielectric nitride material (e.g., $SiN_y$, such as $Si_3N_4$).

Referring to FIG. 10B, within the digit line exit region 104, at least some of the digit lines 198 may horizontally terminate (e.g., end) in the Y-direction. Each of the digit lines 198 horizontally extending through the array region 102 (FIG. 10A) and horizontally terminating within the digit line exit region 104 may be formed to terminate at substantially the same horizontal position in the Y-direction; or at least one of the digit lines 198 horizontally terminating within the digit line exit region 104 may be formed to terminate at a different horizontal position in the Y-direction within the digit line exit region 104 than at least one other of the digit lines 198 horizontally terminating within the digit line exit region 104. In some embodiments, at least some digit lines 198 horizontally neighboring one another in the X-direction have terminal ends (e.g., terminal surfaces) horizontally offset from one another in the Y-direction. Horizontally offsetting the terminal ends of some of the digit lines 198 from the terminal ends of some other of the digit lines 198 within the digit line exit region 104 may, for example, promote or facilitate desirable contact structure arrangements within the digit line exit region 104.

Referring next to FIG. 10C, within the word line exit region 106, at least some of the word lines 200 may horizontally terminate (e.g., end) in the X-direction. Each of the word lines 200 horizontally extending through the array region 102 (FIG. 10A) and horizontally terminating within the word line exit region 106 may be formed to terminate at substantially the same horizontal position in the X-direction; or at least one of the word lines 200 horizontally terminating within the word line exit region 106 may be formed to terminate at a different horizontal position in the X-direction within the word line exit region 106 than at least one other of the word lines 200 horizontally terminating within the word line exit region 106. In some embodiments, at least some word lines 200 horizontally neighboring one another in the Y-direction have terminal ends (e.g., terminal surfaces) horizontally offset from one another in the X-direction. Horizontally offsetting the terminal ends of some of the word lines 200 from the terminal ends of some other of the word lines 200 within the word line exit region 106 may, for example, promote or facilitate desirable contact structure arrangements within the word line exit region 106.

Referring collectively to FIGS. 10A through 10D, an eighth isolation material 210 may be formed on or over portions of at least the access devices 196 (FIG. 6A), the digit lines 198 (FIGS. 6A and 6B), the word lines 200 (FIGS. 6A and 6C), the eighth contact structures 204, and the seventh isolation material 194. The eighth isolation material 210 may be formed of and include at least one insulative material. A material composition of eighth isolation material 210 may be substantially the same as a material composition of the seventh isolation material 194, or the material composition of the eighth isolation material 210 may be different than the material composition of the seventh isolation material 194. In some embodiments, the eighth isolation material 210 is formed of and includes a dielectric oxide material, such as $SiO_x$ (e.g., $SiO_2$). The eighth isolation material 210 may be substantially homogeneous, or the eighth isolation material 210 may be heterogeneous. In some embodiments, the eighth isolation material 210 is substantially homogeneous. In additional embodiments, the eighth isolation material 210 is heterogeneous. The eighth isolation material 210 may, for example, be formed of and include a stack of at least two different dielectric materials.

Figure 11C:
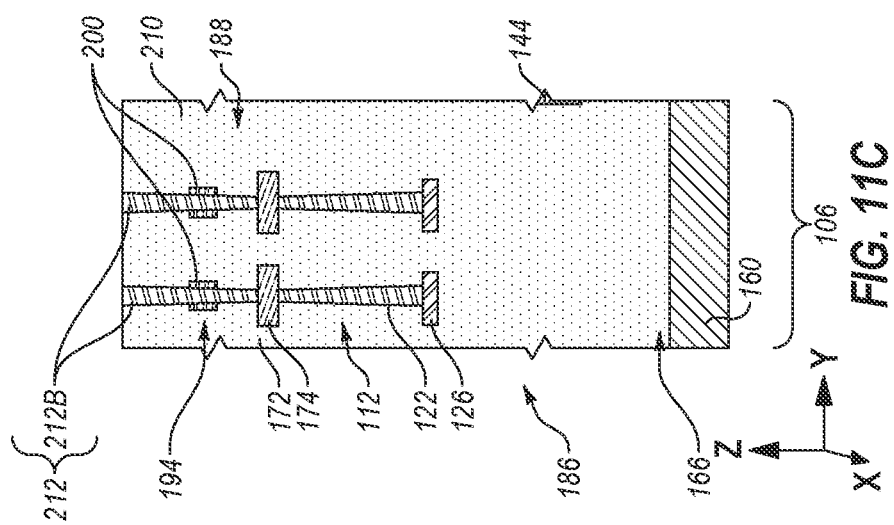
Figure 11D:
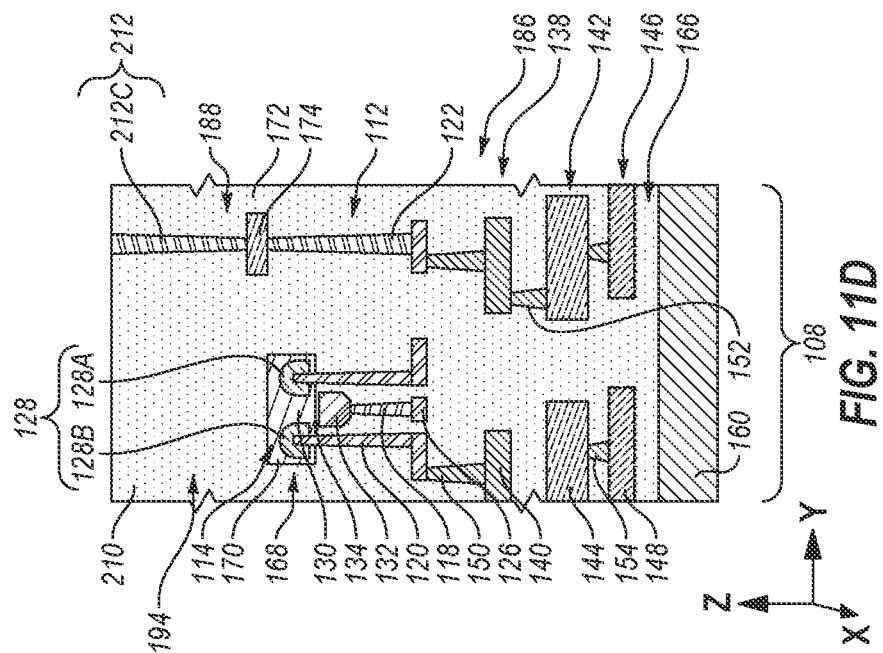

Referring next to FIGS. 11A through 11D, illustrated are simplified, partial longitudinal cross-sectional views, from the directional perspectives previously described, of the array region 102 (FIG. 11A), the digit line exit region 104 (FIG. 11B), the word line exit region 106 (FIG. 11C), and the socket region 108 (FIG. 11D) at a processing stage of the method of forming the microelectronic device following the processing stage previously described with reference to FIGS. 10A through 10D. As collectively depicted in FIGS. 11B through 11D, ninth contact structures 212 may be formed within each of the digit line exit region 104 (FIG. 11B), the word line exit region 106 (FIG. 11C), and the socket region 108 (FIG. 11D). The ninth contact structures 212 may be formed to vertically extend (e.g., in the Z-direction) to and contact the contact pad structures 174. In addition, as described in further detail below, some of the ninth contact structures 212 may be formed to be contact to portions of the digit lines 198 (FIG. 11B) within the digit line exit region 104 (FIG. 11B), and some other of the ninth contact structures 212 may be formed to be contact to portions of the word lines 200 (FIG. 11C) within the word line exit region 106 (FIG. 11C).

Referring to FIG. 11B, within the digit line exit region 104, a first group 212A of the ninth contact structures 212 may be formed to contact at least some of the digit lines 198 horizontally extending (e.g., in the Y-direction) into the digit line exit region 104. Each ninth contact structure 212 of the first group 212A of ninth contact structures 212 may be considered to be a digit line contact structure (e.g., a so-called "edge of array" digit line contact structure). As shown in FIG. 11B, each ninth contact structure 212 of the first group 212A of ninth contact structures 212 may be formed to physically contact and vertically extend completely through an individual digit line 198. For example, within the digit line exit region 104, each ninth contact structure 212 of the first group 212A may be formed to physically contact and vertically extend through each of the eighth isolation material 210, one of the digit lines 198, the seventh isolation material 194, and the second connected isolation structure 188. Outer sidewalls of each ninth contact structure 212 of the first group 212A of the ninth contact structures 212 may physically contact inner sidewalls of an individual digit line 198. In addition, each ninth contact structure 212 of the first group 212A may be formed to vertically terminate on or within one of the contact pad structures 174 located within the digit line exit region 104. Accordingly, each ninth contact structure 212 of the first group 212A may be formed to be coupled to one of the digit lines 198 and to one of the contact pad structures 174.

Referring next to FIG. 11C, within the word line exit region 106, a second group 212B of the ninth contact structures 212 may be formed to contact at least some of the word lines 200 horizontally extending (e.g., in the X-direction) into the word line exit region 106. Each ninth contact structure 212 of the second group 212B of ninth contact structures 212 may be considered to be a word line contact structure (e.g., a so-called "edge of array" word line contact structure). As shown in FIG. 11C, each ninth contact structure 212 of the second group 212B of ninth contact structures 212 may be formed to physically contact and vertically extend completely through an individual word line 200. For example, within the word line exit region 106, each ninth contact structure 212 of the second group 212B may be formed to physically contact and vertically extend through each of the eighth isolation material 210, the seventh isolation material 194, one of the word lines 200, and the second connected isolation structure 188. Outer sidewalls of each ninth contact structure 212 of the second group 212B of the ninth contact structures 212 may physically contact inner sidewalls of an individual word line 200. In addition, each ninth contact structure 212 of the second group 212B may be formed to vertically terminate on or within one of the contact pad structures 174 located within the word line exit region 106. Accordingly, each ninth contact structure 212 of the second group 212B may be formed to be coupled to one of the word lines 200 and to one of the contact pad structures 174.

Referring next to FIG. 11D, within the socket region 108, a third group 212C of the ninth contact structures 212 may be formed to vertically extend to the contact pad structures 174 located within the socket region 108. Each ninth contact structure 212 of the third group 212C of ninth contact structures 212 may be considered to be a deep contact structure (e.g., a deep contact structure to be electrically connected to one or more additional BEOL structures to subsequently be formed). Within the socket region 108, each ninth contact structure 212 of the third group 212C may be formed to physically contact and vertically extend through each of the eighth isolation material 210, the seventh isolation material 194, and the second connected isolation structure 188; and may vertically terminate on or within one of the contact pad structures 174 located within the socket region 108.

Collectively referring again to FIGS. 11B through 11D, the ninth contact structures 212, including the first group 212A (FIG. 11B), the second group 212B (FIG. 11C), and the third group 212C (FIG. 11D) thereof, may be formed of and include conductive material. By way of non-limiting example, the ninth contact structures 212 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the ninth contact structures 212 are each individually formed of and include W. Each of the ninth contact structures 212 may be substantially homogeneous, or one or more of the ninth contact structures 212 may individually be heterogeneous. In some embodiments, each of the ninth contact structures 212 is substantially homogeneous. In additional embodiments, each of the ninth contact structures 212 is heterogeneous. Each ninth contact structure 212 may, for example, be formed of and include a stack of at least two different conductive materials.

Referring next to FIGS. 12A through 12D, illustrated are simplified, partial longitudinal cross-sectional views, from the directional perspectives previously described, of the array region 102 (FIG. 12A), the digit line exit region 104 (FIG. 12B), the word line exit region 106 (FIG. 12C), and the socket region 108 (FIG. 12D) at a processing stage of the method of forming the microelectronic device following the processing stage previously described with reference to FIGS. 11A through 11D. As collectively depicted in FIGS. 12A through 12D, at least one fifth routing tier 214 including fifth routing structures 216 may be formed over the access devices 196 (FIG. 12A) and the ninth contact structures 212 (FIGS. 12B through 12D); storage node devices 218 (e.g., capacitors) may be formed over and in electrical communication with at least some of the fifth routing structures 216 within the array region 102 (FIG. 12A); tenth contact structures 220 may be formed over and in electrical communication with at least some of the ninth contact structures 212 within the socket region 108 (FIG. 12D); and at least one sixth routing tier 222 including sixth routing structures 224 may be formed over the storage node devices 218 and the tenth contact structures 220.

With continued collective reference to FIGS. 12A through 12D, the fifth routing structures 216 of the fifth routing tier 214 may be employed to facilitate electrical communication between additional features (e.g., structures, materials, devices) coupled thereto. The fifth routing structures 216 may each individually be formed of and include conductive material. By way of non-limiting example, the fifth routing structures 216 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fifth routing structures 216 are formed of and include W.

Figure 12B:
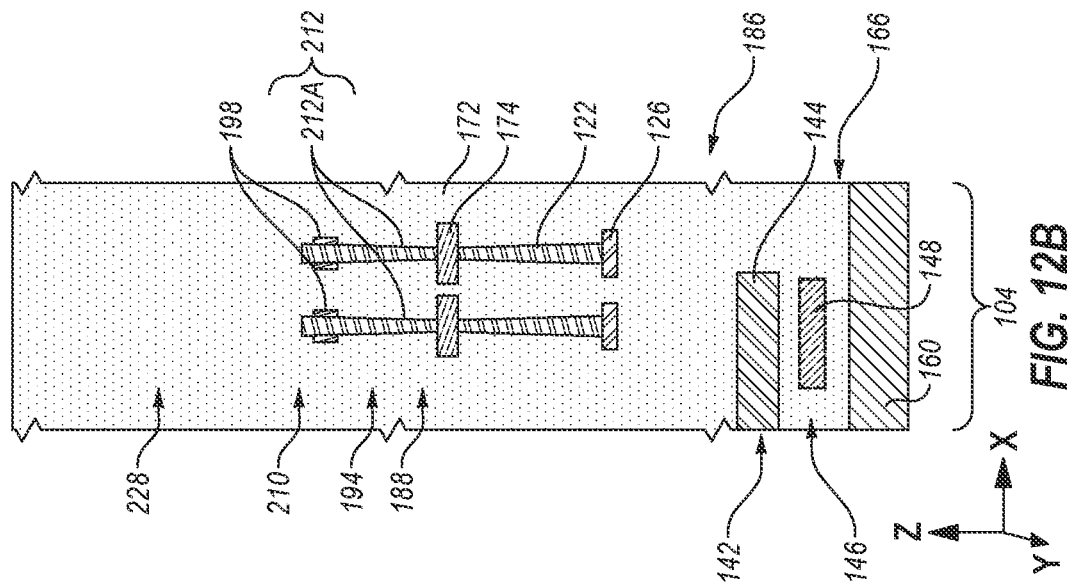
Figure 12A:
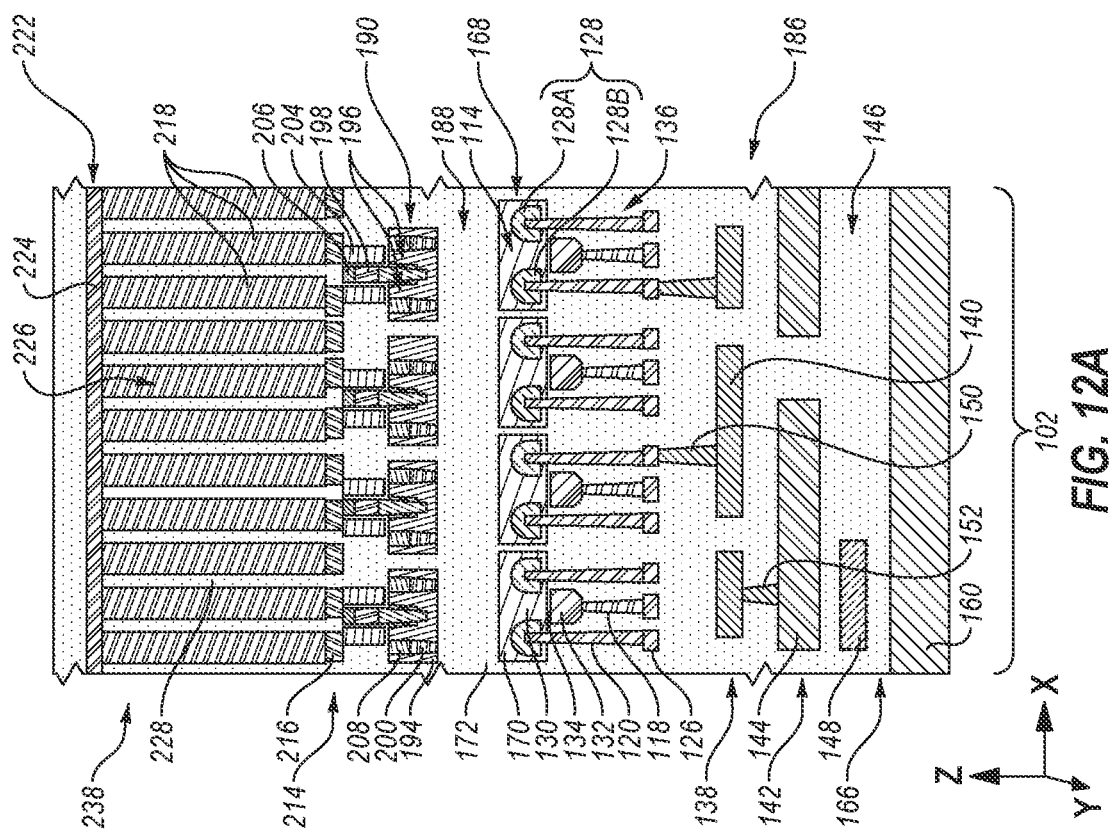

Referring to FIG. 12A, within the array region 102, at least some of the fifth routing structures 216 may be formed and configured to couple the access devices 196 to the storage node devices 218 (e.g., capacitors) to form memory cells 226 (e.g., DRAM cells) within the array region 102. Each memory cell 226 may individually include one of the access devices 196; one of the storage node devices 218; one of the eighth contact structures 204 interposed between the access device 196 and the storage node device 218; and one of the fifth routing structures 216 interposed between the eighth contact structure 204 and the storage node device 218. At least some of the fifth routing structures 216 within the array region 102 may, for example, be configured and employed as redistribution material (RDM) structures (also referred to as "redistribution layer" (RDL) structures) to effectively shift (e.g., stagger, adjust, modify) lateral positions of semiconductor pillars of the access devices 196 to accommodate a desired arrangement (e.g., a hexagonal close packed arrangement) of the storage node devices 218 vertically over and in electrical communication with the access devices 196.

While FIGS. 12A through 12D show the formation of a single (e.g., only one) fifth routing tier 214 (FIG. 12A) including fifth routing structures 216 (FIG. 12A), multiple (e.g., more than one) fifth routing tiers 214 each individually including a desired arrangement (e.g., pattern) of fifth routing structures 216 may be formed. By of non-limiting example, two or more (e.g., three or more) of the fifth routing tiers 214 may be formed, wherein different fifth routing tiers 214 are vertically offset from one another and each individually include a desired arrangement of fifth routing structures 216 therein. At least some of the fifth routing structures 216 within at least one of the fifth routing tiers 214 may be coupled to at least some of the fifth routing structures 216 within at least one other of the fifth routing tiers 214 by way of conductive interconnect structures.

Referring to FIG. 12A, within the array region 102, the storage node devices 218 may individually be formed and configured to store a charge representative of a programmable logic state of the memory cell 226 including the storage node device 218. In some embodiments, the storage node devices 218 comprise capacitors. During use and operation, a charged capacitor may represent a first logic state, such as a logic 1; and an uncharged capacitor may represent a second logic state, such as a logic 0. Each of the storage node devices 218 may, for example, be formed to include a first electrode (e.g., a bottom electrode), a second electrode (e.g., a top electrode), and a dielectric material between the first electrode and the second electrode.

Referring to next to FIG. 12D, within the socket region 108, at least some of the tenth contact structures 220 may be formed to contact at least some of the ninth contact structures 212 within the third group 212C of the ninth contact structures 212. For example, one or more the tenth contact structures 220 may be formed to vertically extend to and terminate on or within one or more of the ninth contact structures 212 located within the socket region 108. The tenth contact structures 220 may individually be formed of and include conductive material. By way of non-limiting example, the tenth contact structures 220 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the tenth contact structures 220 is formed of and includes W. Each of the tenth contact structures 220 may be substantially homogeneous, or one or more of the tenth contact structures 220 may individually be heterogeneous. In some embodiments, each of the tenth contact structures 220 is substantially homogeneous. In additional embodiments, each of the tenth contact structures 220 is heterogeneous. Each tenth contact structure 220 may, for example, be formed of and include a stack of at least two different conductive materials.

As shown in FIG. 12D, within the socket region 108, one or more groups of storage node devices 218 (e.g., capacitors) may, optionally, also be formed. If formed within the socket region 108, the storage node devices 218 may be coupled to at least some of the sixth routing structures 224 positioned within the socket region 108. If formed, the storage node devices 218 may be employed to enhance the performance of a microelectronic device formed through the methods of the disclosure. The storage node devices 218 may, for example, be coupled to and employed to power additional devices (e.g., control logic devices, access devices) of a microelectronic device of the disclosure. In some embodiments, the storage node devices 218 are coupled to and employed to power at least some of the control logic devices 136 (FIG. 12A). The storage node devices 218 formed within socket region 108 may be coupled to BEOL structures of a microelectronic device of the disclosure, as described in further detail below.

Referring collectively to FIGS. 12A through 12D, the sixth routing structures 224 of the sixth routing tier 222 may be employed to facilitate electrical communication between additional features (e.g., structures, materials, devices) coupled thereto. In some embodiments, one or more of the sixth routing structures 224 are formed to horizontally extend between and couple at least some of the storage node devices 218 (and, hence, the memory cells 226) (FIG. 12A) within the array region 102 (FIG. 12A) to one or more of the tenth contact structures 220 (FIG. 12D) within the socket region 108 (FIG. 12D). The sixth routing structures 224 may each be formed of and include conductive material. By way of non-limiting example, the sixth routing structures 224 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the sixth routing structures 224 of the sixth routing tier 222 is formed of and includes W.

With continued reference to FIGS. 12A through 12D, a ninth isolation material 228 may be formed on or over portions of at least the eighth isolation material 210, the fifth routing structures 216 (FIG. 12A), the storage node devices 218 (FIGS. 12A and 12D), the tenth contact structures 220 (FIG. 12D), and the sixth routing structures 224. The ninth isolation material 228 may be formed of and include at least one insulative material. A material composition of the ninth isolation material 228 may be substantially the same as a material composition of the eighth isolation material 210, or the material composition of the ninth isolation material 228 may be different than the material composition of the eighth isolation material 210. In some embodiments, the ninth isolation material 228 is formed of and includes a dielectric oxide material, such as $SiO_x$ (e.g., $SiO_2$). The ninth isolation material 228 may be substantially homogeneous, or the ninth isolation material 228 may be heterogeneous. In some embodiments, the ninth isolation material 228 is substantially homogeneous. In additional embodiments, the ninth isolation material 228 is heterogeneous. The ninth isolation material 228 may, for example, be formed of and include a stack of at least two different dielectric materials.

Referring next to FIGS. 13A through 13D, illustrated are simplified, partial longitudinal cross-sectional views, from the directional perspectives previously described, of the array region 102 (FIG. 13A), the digit line exit region 104 (FIG. 13B), the word line exit region 106 (FIG. 13C), and the socket region 108 (FIG. 13D) at a processing stage of the method of forming the microelectronic device following the processing stage previously described with reference to FIGS. 12A through 12D. As collectively depicted in FIGS. 13A through 13D, additional BEOL structures may be formed over the sixth routing tier 222. For example, at least one seventh routing tier 230 including seventh routing structures 231 may be formed over the sixth routing tier 222; and at least one eighth routing tier 232 including eighth routing structures 233 may be formed over the seventh routing tier 230. One or more of the seventh routing structures 231 of the seventh routing tier 230 may be coupled to one or more of the sixth routing structures 224 of the sixth routing tier 222 by way of eleventh contact structures 234 (FIG. 13D). In addition, one or more of the eighth routing structures 233 (e.g., one or more conductive pad structures) of the eighth routing tier 232 may be coupled to one or more of the seventh routing structures 231 of the seventh routing tier 230 by way of twelfth contact structures 235 (FIG. 13D). In additional embodiments, at least some (e.g., all) of the twelfth contact structures 235 (FIG. 13D) are omitted (e.g., are not formed), and one or more of the eighth routing structures 233 of the eighth routing tier 232 are formed to directly physically contact one or more of the seventh routing structures 231 of the seventh routing tier 230.

The seventh routing structures 231, the eighth routing structures 233, the eleventh contact structures 234 (FIG. 13D), and the twelfth contact structures 235 (FIG. 13D) (if any) may each be formed of and include conductive material. By way of non-limiting example, the seventh routing structures 231, the eighth routing structures 233, the eleventh contact structures 234 (FIG. 13D), and the twelfth contact structures 235 (FIG. 13D) (if any) may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the seventh routing structures 231 are each formed of and include Cu; the eighth routing structures 233 are formed of and include Al; and the eleventh contact structures 234 (FIG. 13D) and the twelfth contact structures 235 (FIG. 13D) are each formed of and include W.

Still referring to collectively to FIGS. 13A through 13D, a tenth isolation material 236 may be formed on or over portions of at least the ninth isolation material 228, the seventh routing structures 231, the eighth routing structures 233, the eleventh contact structures 234 (FIG. 13D), and the twelfth contact structures 235 (FIG. 13D) (if any). The tenth isolation material 236 may be formed of and include at least one insulative material. A material composition of the tenth isolation material 236 may be substantially the same as a material composition of the ninth isolation material 228, or the material composition of the tenth isolation material 236 may be different than the material composition of the ninth isolation material 228. In some embodiments, the tenth isolation material 236 is formed of and includes a dielectric oxide material, such as $SiO_x$ (e.g., $SiO_2$). The tenth isolation material 236 may be substantially homogeneous, or the tenth isolation material 236 may be heterogeneous. In some embodiments, the tenth isolation material 236 is substantially homogeneous. In additional embodiments, the tenth isolation material 236 is heterogeneous. The tenth isolation material 236 may, for example, be formed of and include a stack of at least two different dielectric materials.

With continued reference to FIGS. 13A through 13D, after forming the eighth routing tier 232 including the eighth routing structures 233, the second microelectronic device structure assembly 186 may be subjected to additional processing. By way of non-limiting example, following the formation of the eighth routing tier 232 including the eighth routing structures 233, at least one additional microelectronic device structure assembly may be attached to the second microelectronic device structure assembly 186 to form a relatively larger microelectronic device structure assembly. In some embodiments, the at least one additional microelectronic device structure assembly exhibits a configuration substantially similar to the second microelectronic device structure assembly 186 following the processing stage of FIGS. 13A through 13D. As a non-limiting example, the relatively larger microelectronic device structure assembly may be formed by horizontally aligning and physically contacting one or more of the eighth routing structures 233 (e.g., conductive pad structures) with one or more additional routing structures (e.g., additional conductive pad structures) of an additional microelectronic device structure assembly; and then preforming at least one thermocompression process to form one or more interconnect structures from the one or more eighth routing structures 233 and the one or more additional routing structures. As another non-limiting example, in combination with or as an alternative to the aforementioned non-limiting example, the relatively larger microelectronic device structure assembly may be formed by at least partially removing the additional base structure 160 and the first connected isolation structure 166 to expose at least some of the fourth routing structures 148 (e.g., conductive pad structures) of the fourth routing tier 146; horizontally aligning and physically contacting one or more of the fourth routing structures 148 (e.g., conductive pad structures) with one or more additional routing structures (e.g., additional conductive pad structures) of an additional microelectronic device structure assembly; and then preforming at least one thermocompression process to form one or more interconnect structures from the one or more fourth routing structures 148 and the one or more additional routing structures. In addition, any desirable quantity of additional microelectronic device structure assemblies may be attached to the relatively larger microelectronic device structure assembly by way of substantially similar processing.

While the method of forming a microelectronic device described above with reference to FIGS. 1 and 2A through 13D describes forming the fourth routing tier 146 including the fourth routing structures 148 (e.g., conductive pad structures) at the processing stage previously described with reference to FIGS. 3A through 3D, the disclosure is not so limited. In additional embodiments, the fourth routing tier 146 including the fourth routing structures 148 is formed subsequent to the attachment of the second microelectronic device structure 158 (FIGS. 4A through 4D) to the first microelectronic device structure 100 (FIGS. 4A through 4D). For example, fourth routing tier 146 including the fourth routing structures 148 may be formed during and/or after the formation of the eighth routing tier 232 including the eighth routing structures 233 (e.g., additional conductive pad structures). By way of non-limiting example, following the formation of the eighth routing tier 232 including the eighth routing structures 233, portions of at least the additional base structure 160 and the first connected isolation structure 166 may be removed, and then the fourth routing tier 146 including at least some fourth routing structures 148 in electrical communication with at least some of the third routing structures 144 of the third routing tier 142 may be formed. Thereafter, the resulting microelectronic device structure assembly including the eighth routing tier 232 including the eighth routing structures 233 and the fourth routing tier 146 including the fourth routing structures 148 may be coupled to one or more additional microelectronic device structure assemblies to form a desired, relatively larger microelectronic device structure assembly of the disclosure.

Still referring to FIGS. 13A through 13D, the method described above with reference to FIGS. 1 and 2A through 13D may effectuate the formation of a microelectronic device 238 (e.g., a memory device, such as a DRAM device) including the features (e.g., structures, materials, devices) previously described herein. In some embodiments, the third routing structures 144 and the fourth routing structures 148 are employed as global routing structures for the microelectronic device 238; and/or the seventh routing structures 231 and the eighth routing structures 233 are employed as global routing structures for the microelectronic device 238. The combination of third routing structures 144 and the fourth routing structures 148 and/or the combination of the seventh routing structures 231 and the eighth routing structures 233 may, for example, be configured to receive global signals from an external bus, and to relay the global signals to other features (e.g., structures, devices) of the microelectronic device 238. In addition, referring to FIG. 13D, in some embodiments, at least some of the third routing structures 144, the fourth routing structures 148, the seventh routing structures 231 and the eighth routing structures 233 are formed to be in electrical communication with at least some of the sixth routing structures 224 coupled to the memory cells 226 (FIG. 13A) within the array region 102 (FIG. 13A) by way of at least one deep contact assembly extending between the third routing tier 142 and the seventh routing tier 230. The deep contact assembly may, for example, include some of the contact structures (e.g., at least one of the eleventh contact structures 234, at least one of the tenth contact structures 220, at least one of the ninth contact structures 212, at least one of the third contact structures 122, at least one of the fourth contact structures 150, at least one of the fifth contact structures 152) located within the socket region 108, as well the routing structures within the socket region 108 coupled to the some of the contact structures.

Thus, in accordance with embodiments of the disclosure, method of forming a microelectronic device comprises forming a first microelectronic device structure comprising a first semiconductor structure, control logic circuitry at least partially overlying the first semiconductive structure, first back-end-of-line (BEOL) structures over and in electrical communication with the control logic circuitry, and first isolation material covering the control logic circuitry and the first BEOL structures. A second microelectronic device structure is bonded over the first BEOL structures of the first microelectronic device structure to form a first assembly. The first assembly is vertically inverted. A third microelectronic device structure comprising a second semiconductor structure is bonded over the vertically inverted first microelectronic device structure assembly to form a second assembly. Memory cells comprising portions of the second semiconductor structure are formed after forming the second assembly. Second BEOL structures are formed over the memory cells.

Figure 14:
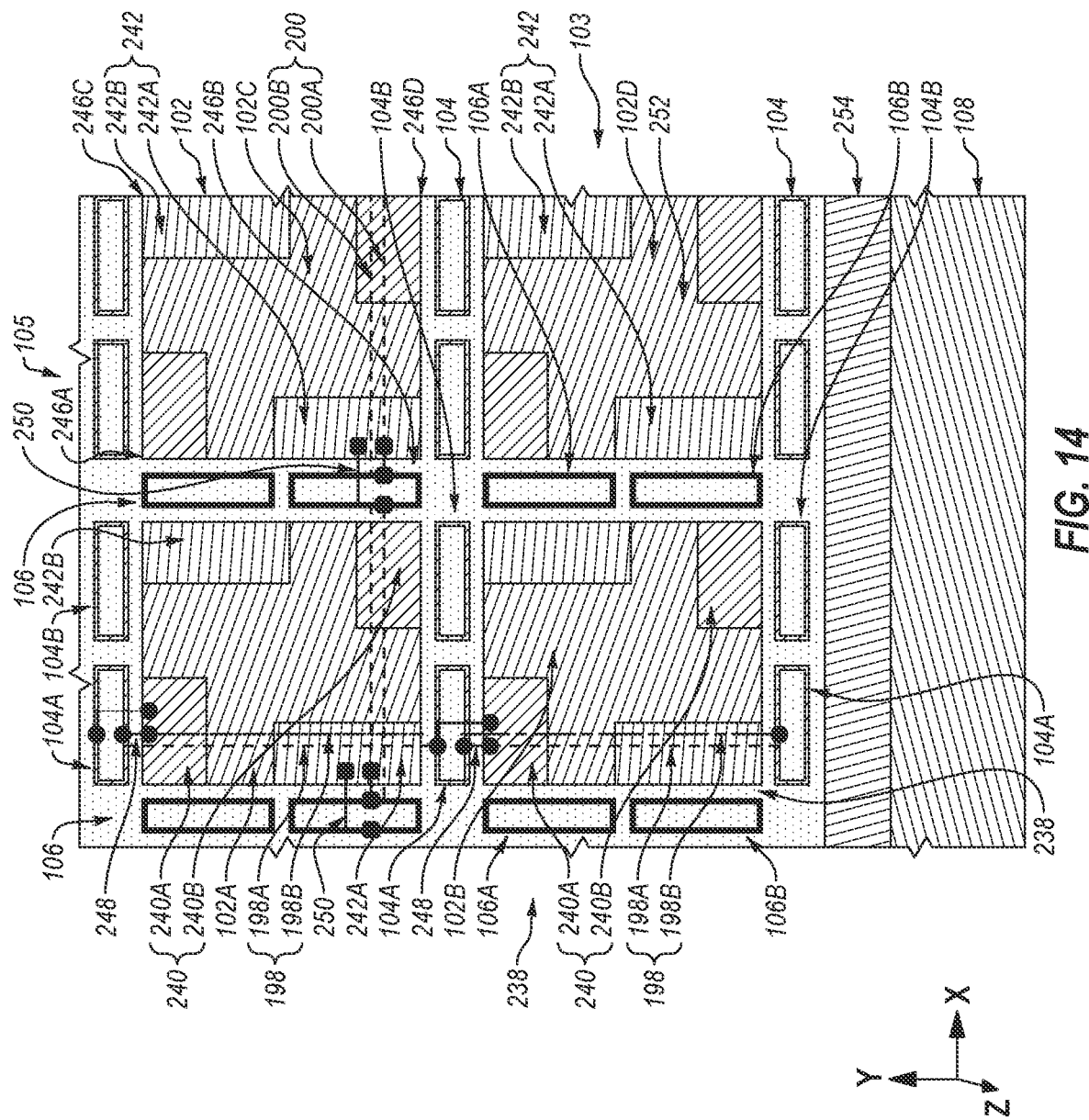
FIG. 14 is a simplified plan view of a microelectronic device, in accordance with an embodiment of the disclosure.

Referring next to FIG. 14, depicted is a simplified plan view of the microelectronic device 238 illustrating an arrangement of different control logic sections (described in further detail below) within individual different regions (e.g., the array regions 102, such as the first array region 102A, the second array region 102B, the third array region 102C, and the fourth array region 102D; the socket regions 108) of the microelectronic device 238, as well as routing arrangements to different control logic devices (e.g., corresponding to the control logic devices 136 (FIG. 13A)) within the different control logic sections, in accordance with embodiments of the disclosure. The different control logic devices of the different control logic sections may be vertically offset from (e.g., in the Z-direction) the memory cells 226 (FIG. 13A) of the microelectronic device 238. In some embodiments, the microelectronic device 238 is oriented such that the different control logic devices of the different control logic sections vertically overlie (e.g., in the Z-direction) the memory cells 226 (FIG. 13A). For example, an orientation of the microelectronic device 238 may be vertically inverted (e.g., flipped) relative to the orientation depicted in FIGS. 13A through 13D. In some embodiments, the microelectronic device 238 is oriented such that the different control logic devices of the different control logic sections vertically underlie (e.g., in the Z-direction) the memory cells 226 (FIG. 13A), as depicted in FIGS. 13A through 13D. At least some of the different control logic devices may be coupled to the memory cells 226 (FIG. 13A) in the manner previously described with reference to FIGS. 13A through 13D. For clarity and ease of understanding the description, not all features (e.g., structures, materials, devices) of the microelectronic device 238 previously described with reference to FIGS. 13A through 13D are illustrated in FIG. 14.

As shown in FIG. 14, within a horizontal area of each array region 102, the microelectronic device 238 may be formed to include a desired arrangement of sense amplifier (SA) sections 240 and sub-word line driver (SWD) sections 242. The SA sections 240 may include SA devices coupled to the digit lines 198 of the microelectronic device 238, as described in further detail below. In some embodiments, the digit lines 198 vertically underlie (e.g., in the Z-direction) the SA devices of the SA sections 240 within the microelectronic device 238. In additional embodiments, the digit lines 198 vertically overlie (e.g., in the Z-direction) the SA devices of the SA sections 240 within the microelectronic device 238. The SWD sections 242 may include SWD devices coupled to the word lines 200 of the microelectronic device 238, as also described in further detail below. In some embodiments, the word lines 200 vertically underlie (e.g., in the Z-direction) the SWD devices of the SWD sections 242 within the microelectronic device 238. In additional embodiments, the word lines 200 vertically overlie (e.g., in the Z-direction) the SWD devices of the SWD sections 242 within the microelectronic device 238.

The SA sections 240 within a horizontal area an individual array region 102 (e.g., the first array region 102A, the second array region 102B, the third array region 102C, or the fourth array region 102D) may include a first SA section 240A and a second SA section 240B. For an individual array region 102, the first SA section 240A and the second SA section 240B may be positioned at or proximate opposite corners (e.g., diagonally opposite corners) of the array region 102 than one another. For example, as shown in FIG. 14, for an individual array region 102, the first SA section 240A may be positioned at or proximate a first corner 246A of the array region 102, and the second SA section 240B may be positioned at or proximate a second corner 246B of the array region 102 located diagonally opposite (e.g., kitty-corner) the first corner 246A.

For each SA section 240 (e.g., the first SA section 240A, the second SA section 240B) within an individual array region 102, the SA devices of the SA section 240 may be coupled to a group of the digit lines 198 horizontally extending (e.g., in the Y-direction) through the array region 102 by way of digit line routing and contact structures 248. The digit line routing and contact structures 248 may, for example, correspond to some of the routing structures (e.g., some of the first routing structures 126 (FIGS. 13A and 13B)), some of the contact pad structures (e.g., some of the some of the contact pad structures 174 (FIG. 13B)), and some of the contact structures (e.g., some of the first group 212A (FIG. 13B) of the ninth contact structures 212 (FIG. 13B), some of the some of the third contact structures 122 (FIG. 13B)) previously described herein.

The SA devices of the SA sections 240 of array regions 102 horizontally neighboring one another in the Y-direction (e.g., the first array region 102A and the second array region 102B; the third array region 102C and the fourth array region 102D) may be coupled to different groups of digit lines 198 than one another. For example, each of the SA sections 240 (e.g., each of the first SA section 240A and the second SA section 240B) of the first array region 102A may include so-called "even" SA devices coupled to even digit lines 198B of the microelectronic device 238 by way of the digit line routing and contact structures 248 associated with the SA sections 240; and each of the SA sections 240 (e.g., each of the first SA section 240A and the second SA section 240B) of the second array region 102B may include so-called "odd" SA devices coupled to odd digit lines 198A of the microelectronic device 238 by way of the digit line routing and contact structures 248 associated with the SA sections 240; or vice versa. The even digit lines 198B of the microelectronic device 238 may horizontally alternate with the odd digit lines 198A of the microelectronic device 238 in the X-direction. The SA devices of each of the SA sections 240 of the first array region 102A may not be coupled to any odd digit lines 198A; and the SA devices of each of the SA sections 240 of the second array region 102B may not be coupled to any even digit lines 198B; or vice versa. Similarly, each of the SA sections 240 (e.g., each of the first SA section 240A and the second SA section 240B) of the third array region 102C horizontally neighboring the first array region 102A in the X-direction may include additional even SA devices coupled to additional even digit lines 198B of the microelectronic device 238 by way of the digit line routing and contact structures 248 associated with the SA sections 240; and each of the SA sections 240 (e.g., each of the first SA section 240A and the second SA section 240B) of the fourth array region 102D horizontally neighboring the second array region 102B in the X-direction may include additional odd SA devices coupled to additional odd digit lines 198A of the microelectronic device 238 by way of the digit line routing and contact structures 248 associated with the SA sections 240; or vice versa.

As shown in FIG. 14, the SA devices (e.g., odd SA devices or even SA devices) within an individual SA section 240 of an individual array region 102 may be coupled to digit lines (e.g., odd digit lines 198A or even digit lines 198B) horizontally extending through the array region 102, and may also be coupled to additional digit lines (e.g., additional odd digit lines 198A or additional even digit lines 198B) horizontally extending through another array region 102 horizontally neighboring the array region 102 in the Y-direction. For example, some odd SA devices within the first SA section 240A of the second array region 102B may be coupled to odd digit lines 198A horizontally extending through the second array region 102B by way of some digit line routing and contact structures 248 extending to and through the first digit line exit subregion 104A horizontally neighboring the second array region 102B in the Y-direction; and some additional odd SA devices within the first SA section 240A of the second array region 102B may be coupled to additional odd digit lines 198A horizontally extending through the first array region 102A by way of some additional digit line routing and contact structures 248 extending to and through the first digit line exit subregion 104A. As another example, some even SA devices within the second SA section 240B of the first array region 102A may be coupled to even digit lines 198B horizontally extending through the first array region 102A by way of some digit line routing and contact structures 248 extending to and through the second digit line exit subregion 104B horizontally neighboring the first array region 102A in the Y-direction; and some additional even SA devices within the second SA section 240B of the first array region 102A may be coupled to additional even digit lines 198B horizontally extending through the second array region 102B by way of some additional digit line routing and contact structures 248 extending to and through the second digit line exit subregion 104B.

With maintained reference to FIG. 14, the SWD sections 242 within a horizontal area an individual array region 102 (e.g., the first array region 102A, the second array region 102B, the third array region 102C, or the fourth array region 102D) may include a first SWD section 242A and a second SWD section 242B. For an individual array region 102, the first SWD section 242A and the second SWD section 242B may be positioned at or proximate different corners than the first SA section 240A and a second SA section 240B. In addition, the corner of the array region 102 associated with first SWD section 242A may oppose (e.g., diagonally oppose) the corner of the array region 102 associated with second SWD section 242B. For example, as shown in FIG. 14, for an individual array region 102, the first SWD section 242A may be positioned at or proximate a third corner 246C of the array region 102, and the second SWD section 242B may be positioned at or proximate a fourth corner 246D of the array region 102 located diagonally opposite (e.g., kitty-corner) the third corner 246C.

For each SWD section 242 (e.g., the first SWD section 242A, the second SWD section 242B) within an individual array region 102, the SWD devices of the SWD section 242 may be coupled to a group of the word lines 200 horizontally extending (e.g., in the X-direction) the array region 102 by way of word line routing and contact structures 250. The word line routing and contact structures 250 may, for example, correspond to some of the routing structures (e.g., some of the first routing structures 126 (FIGS. 13A and 13C)), some of the contact pad structures (e.g., some of the some of the contact pad structures 174 (FIG. 13C)), and some of the contact structures (e.g., some of the second group 212B (FIG. 13C) of the ninth contact structures 212 (FIG. 13C), some of the some of the third contact structures 122 (FIG. 13C)) previously described herein.

The SWD devices of the SWD sections 242 of array regions 102 horizontally neighboring one another in the X-direction (e.g., the first array region 102A and the third array region 102C; the second array region 102B and the fourth array region 102D) may be coupled to different groups of word lines 200 than one another. For example, each of the SWD sections 242 (e.g., each of the first SWD section 242A and the second SWD section 242B) of the first array region 102A may include so-called "even" SWD devices coupled to even word lines 200B of the microelectronic device 238 by way of the word line routing and contact structures 250 associated with the SWD sections 242; and each of the SWD sections 242 (e.g., each of the first SWD section 242A and the second SWD section 242B) of the third array region 102C may include so-called "odd" SWD devices coupled to odd word lines 200A of the microelectronic device 238 by way of the word line routing and contact structures 250 associated with the SWD sections 242; or vice versa. The even word lines 200B of the microelectronic device 238 may horizontally alternate with the odd word lines 200A of the microelectronic device 238 in the Y-direction. The SWD devices of each of the SWD sections 242 of the first array region 102A may not be coupled to any odd word lines 200A; and the SWD devices of each of the SWD sections 242 of the third array region 102C may not be coupled to any even word lines 200B; or vice versa. Similarly, each of the SWD sections 242 (e.g., each of the first SWD section 242A and the second SWD section 242B) of the second array region 102B horizontally neighboring the first array region 102A in the Y-direction may include additional even SWD devices coupled to additional even word lines 200B of the microelectronic device 238 by way of the word line routing and contact structures 250 associated with the SWD sections 242; and each of the SWD sections 242 (e.g., each of the first SWD section 242A and the second SWD section 242B) of the fourth array region 102D horizontally neighboring the third array region 102C in the Y-direction may include additional odd SWD devices coupled to additional odd word lines 200A of the microelectronic device 238 by way of the word line routing and contact structures 250 associated with the SWD sections 242; or vice versa.

As shown in FIG. 14, the SWD devices (e.g., odd SWD devices or even SWD devices) within an individual SWD section 242 of an individual array region 102 may be coupled to word lines (e.g., odd word lines 200A or even word lines 200B) horizontally extending through the array region 102, and may also be coupled to additional word lines (e.g., additional odd word lines 200A or additional even word lines 200B) horizontally extending through another array region 102 horizontally neighboring the array region 102 in the X-direction. For example, some odd SWD devices within the first SWD section 242A of the third array region 102C may be coupled to odd word lines 200A horizontally extending through the third array region 102C by way of some word line routing and contact structures 250 extending to and through the second word line exit subregion 106B horizontally neighboring the third array region 102C in the X-direction; and some additional odd SWD devices within the first SWD section 242A of the third array region 102C may be coupled to additional odd word lines 200A horizontally extending through the first array region 102A by way of some additional word line routing and contact structures 250 extending to and through the second word line exit subregion 106B. As another example, some even SWD devices within the second SWD section 242B of the first array region 102A may be coupled to even word lines 200B horizontally extending through the first array region 102A by way of some word line routing and contact structures 250 extending to and through the first word line exit subregion 106A horizontally neighboring the first array region 102A in the X-direction; and some additional even SWD devices within the second SWD section 242B of the first array region 102A may be coupled to additional even word lines 200B horizontally extending through the third array region 102C by way of some additional word line routing and contact structures 250 extending to and through the first word line exit subregion 106A.

With maintained reference to FIG. 14, within a horizontal area of each array region 102, the microelectronic device 238 may include additional control logic sections individually including additional control logic devices (e.g., control logic devices other than SA devices and SWD devices). For example, for each array region 102, additional control logic sections 252 may be positioned horizontally between (e.g., at relatively more horizontally central positions within the array region 102) the SA sections 240 and the SWD sections 242. The additional control logic sections 252 may include, but are not limited to, column decoder device sections including column decoder device, and main word line (MWD) sections including MWD devices.

Still referring to FIG. 14, within a horizontal area of each socket region 108, the microelectronic device 238 may include further control logic sections 254 individually including further control logic devices (e.g., control logic devices in addition to those located within the horizontal areas of the array regions 102). For example, for each socket region 108, one or more further control logic sections 254 may be positioned horizontally between deep contact structure assemblies (e.g., vertically extending from one or more of the seventh routing structures 231 (FIG. 13D) to one or more of the third routing structures 144 (FIG. 13D)) within the socket region 108 and the array regions 102 horizontally neighboring the socket region 108. At least some of the further control logic devices within the further control logic sections 254 may have different configurations and different operational functions than the control logic devices located within the horizontal areas of the array regions 102. By way of non-limiting example, the further control logic sections 254 may include bank logic sections including bank logic devices.

Thus, in accordance with embodiments of the disclosure, a method of forming a microelectronic device comprises forming a semiconductor wafer comprising a semiconductor material, trenches within the semiconductor material, control logic devices overlying the semiconductor material, routing structures overlying the control logic devices, and contact structures extending from the semiconductor material to some of the routing structures. An additional wafer is attached to the semiconductor wafer using oxide-oxide bonding to form an assembly. The assembly is vertically inverted. Portions of semiconductor material are removed to expose portions of the contact structures after vertically inverting the assembly. Contact pad structures are formed on the exposed portions of the contact structures. An additional semiconductor wafer comprising an additional semiconductor material is attached to the assembly using additional oxide-oxide bonding after forming the contact pad structures. Access devices are formed using portions of the additional semiconductor material. Word lines and digit lines operatively associated with the access devices are formed. Additional contact structures are formed to penetrate the word lines and the digit lines and to extend to some of the contact pad structures. Further contact structures are formed to extend to some other of the contact pad structures. Storage node devices overlying and coupled to the access devices are formed. Additional routing structures are formed over the storage node devices. At least some of the additional routing structures are coupled to the further contact structures.

Furthermore, in accordance with embodiments of the disclosure, a microelectronic device comprises array regions, digit line exit regions, and word line exit regions. The array regions individually comprise memory cells comprising access devices and storage node devices, digit lines coupled to the access devices and extending in a first direction, word lines coupled to the access devices and extending in a second direction orthogonal to the first direction, and control logic devices vertically offset from and in electrical communication with the memory cells. The digit line exit regions horizontally alternate with the array regions in the first direction and individually comprise: portions of the digit lines extending beyond the array regions adjacent thereto; contact pad structures underlying the portions of the digit lines; digit line contact structures extending through at least some of the portions of the digit lines to the contact pad structures; routing structures underlying the contact pad structures and in electrical communication with some of the control logic devices; and contact structures extending from the contact pad structures to the routing structures. The word line exit regions horizontally alternate with the array regions in the second direction and individually comprise: portions of the word lines extending beyond the array regions adjacent thereto; additional contact pad structures underlying the portions of the word lines; word line contact structures extending through at least some of the portions of the word lines to the additional contact pad structures; additional routing structures underlying the additional contact pad structures and in electrical communication with some other of the control logic devices; and additional contact structures extending from the additional contact pad structures to the additional routing structures.

Microelectronic devices (e.g., the microelectronic device 238 (FIGS. 13A through 13D and FIG. 14)) in accordance with embodiments of the disclosure may be used in embodiments of electronic systems of the disclosure. For example, FIG. 15 is a block diagram illustrating an electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 300 includes at least one memory device 302. The memory device 302 may comprise, for example, a microelectronic device (e.g., the microelectronic device 238 (FIGS. 13A through 13D and FIG. 14)) previously described herein. The electronic system 300 may further include at least one electronic signal processor device 304 (often referred to as a "microprocessor"). The electronic signal processor device 304 may, optionally, comprise a microelectronic device (e.g., the microelectronic device 238 (FIGS. 13A through 13D and FIG. 14)) previously described herein. While the memory device 302 and the electronic signal processor device 304 are depicted as two (2) separate devices in FIG. 15, in additional embodiments, a single (e.g., only one) memory/processor device having the functionalities of the memory device 302 and the electronic signal processor device 304 is included in the electronic system 300. In such embodiments, the memory/processor device may include a microelectronic device (e.g., the microelectronic device 238 (FIGS. 13A through 13D and FIG. 14)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably connected to the input device and the output device, and a memory device operably connected to the processor device. The memory device comprises memory array regions, a digit line contact region between two of the memory array regions neighboring one another in a first direction, and a word line contact region between two other of the memory array regions neighboring one another in a second direction perpendicular to the first direction. The memory array regions each comprise dynamic random access memory (DRAM) cells, digit lines coupled to the DRAM cells, word lines coupled to the DRAM cells, and control logic devices vertically offset from and electrical communication with the DRAM cells. The digit line contact region comprises: end portions of some of the digit lines extending past horizontal areas of the two of the memory array regions; conductive pads vertically underlying the some of the digit lines; digit line contacts vertically extending through the end portions of the some of the digit lines to the conductive pads; conductive routing vertically underlying the conductive pads; and conductive contacts vertically extending from the conductive pads to the conductive routing. The word line contact region comprises: end portions of some of the word lines extending past horizontal areas of the two other of the memory array regions; additional conductive pads vertically underlying the some of the word lines; word line contacts vertically extending completely through the end portions of the some of the word lines to the additional conductive pads; additional conductive routing vertically underlying the additional conductive pads; and additional conductive contacts vertically extending from the additional conductive pads to the additional conductive routing.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A method of forming a microelectronic device, comprising:
    forming a first microelectronic device structure comprising a first semiconductor structure, a control logic circuitry at least partially overlying the first semiconductor structure, first back-end-of-line (BEOL) structures over and in electrical communication with the control logic circuitry, and a first isolation material covering the control logic circuitry and the first BEOL structures;
    bonding a second microelectronic device structure over the first BEOL structures of the first microelectronic device structure to form a first assembly;
    vertically inverting the first assembly;
    bonding a third microelectronic device structure comprising a second semiconductor structure over the vertically inverted first assembly to form a second assembly;
    forming memory cells comprising portions of the second semiconductor structure after forming the second assembly; and
    forming second BEOL structures over the memory cells.

2. The method of claim 1, wherein bonding a second microelectronic device structure over the first BEOL structures of the first microelectronic device structure comprises bonding a second isolation material of the second microelectronic device structure to the first isolation material of the first microelectronic device structure.

3. The method of claim 1, further comprising forming the first microelectronic device structure to further comprise conductive contact structures within contact regions horizontally offset from a region including the control logic circuitry.

4. The method of claim 3, further comprising, after vertically inverting the first assembly:
   thinning the first semiconductor structure to expose the first isolation material and the conductive contact structures;
   forming conductive contact pad structures on the conductive contact structures; and
   forming a second isolation material over the conductive contact pad structures and remaining portions of the first semiconductor structure.

5. The method of claim 4, wherein bonding a third microelectronic device structure comprising a second semiconductor structure over the vertically inverted first assembly comprises bonding a third isolation material of the third microelectronic device structure to the second isolation material.

6. The method of claim 5, wherein forming memory cells comprises:
   forming access devices using the portions of the second semiconductor structure; and
   forming storage node devices over and in electrical communication with the access devices to form the memory cells, each of the memory cells individually comprising one of the access devices and one of the storage node devices.

7. The method of claim 6, wherein forming access devices comprises:
   removing a section of the second semiconductor structure after forming the second assembly;
   patterning a remaining section of the second semiconductor structure to form the portions of the second semiconductor structure;
   forming word lines extending through the portions of the second semiconductor structure in a first horizontal direction; and
   forming digit lines vertically overlying the word lines and the portions of the second semiconductor structure and horizontally extending in a second horizontal direction orthogonal to the first horizontal direction, first digit line contact structures vertically extending from the digit lines and to the portions of the second semiconductor structure.

8. The method of claim 7, wherein forming storage node devices over and in electrical communication with the access devices comprises:
   forming additional contact structures on the portions of the second semiconductor structure;
   forming conductive routing structures on the additional contact structures; and
   forming the storage node devices on the conductive routing structures, the storage node devices at least partially horizontally offset from the additional contact structures.

9. The method of claim 7, further comprising:
   forming second digit line contact structures vertically extending through the digit lines and to some of the conductive contact pad structures; and
   forming word line contact structures vertically extending through the word lines and to some other of the conductive contact pad structures.

10. The method of claim 1, further comprising:
    forming the first BEOL structures of the first microelectronic device structure to comprise conductive routing structures over and in electrical communication with the control logic circuitry, and conductive pad structures over and in electrical communication with the conductive routing structures; and
    forming the second BEOL structures to comprise additional conductive routing structures over the memory cells and in electrical communication with the control logic circuitry, and additional conductive pad structures over and in electrical communication with the additional conductive routing structures.

11. The method of claim 10, further comprising:
    forming the conductive routing structures and the additional conductive routing structures to each comprise copper; and
    forming the conductive pad structures and the additional conductive pad structures to each comprise aluminum.

12. A method of forming a microelectronic device, comprising:
    forming a semiconductor wafer comprising a semiconductor material, trenches within the semiconductor material, control logic devices overlying the semiconductor material, routing structures overlying the control logic devices, and contact structures extending from the semiconductor material to some of the routing structures;
    attaching an additional wafer to the semiconductor wafer using oxide-oxide bonding to form an assembly;
    vertically inverting the assembly;
    removing portions of the semiconductor material to expose portions of the contact structures after vertically inverting the assembly;
    forming contact pad structures on the exposed portions of the contact structures;
    attaching an additional semiconductor wafer comprising an additional semiconductor material to the assembly using additional oxide-oxide bonding after forming the contact pad structures;
    forming access devices using portions of the additional semiconductor material;
    forming word lines and digit lines operatively associated with the access devices;
    forming additional contact structures penetrating the word lines and the digit lines and extending to some of the contact pad structures;
    forming further contact structures extending to some other of the contact pad structures;
    forming storage node devices over and coupled to the access devices; and
    forming additional routing structures over the storage node devices, at least some of the additional routing structures coupled to the further contact structures.

13. The method of claim 12, wherein forming access devices using portions of the additional semiconductor material comprises:
    removing an upper region of the additional semiconductor material after attaching the additional semiconductor wafer to the assembly;
    patterning a lower region of the additional semiconductor material to form discrete semiconductor structures; and removing portions of the discrete semiconductor structures to form semiconductor pillars serving as channel structures for the access devices.

14. The method of claim 13, wherein forming word lines and digit lines operatively associated with the access devices comprises:
forming the word lines to horizontally neighbor the semiconductor pillars and to extend in a first horizontal direction; and
forming the digit lines to vertically overlie and horizontally neighbor the semiconductor pillars and to extend in a second horizontal direction perpendicular to the first horizontal direction, digit line contact structures extending from the discrete semiconductor structures to the digit lines.

15. The method of claim 12, further comprising forming the routing structures of the semiconductor wafer to comprise:
tungsten routing structures over and in electrical communication with transistors of the control logic devices; and
copper routing structures over and in electrical communication with the tungsten routing structures.

16. The method of claim 15, further comprising forming the routing structures of the semiconductor wafer to further comprise aluminum pad structures over and in electrical communication with the copper routing structures.

17. The method of claim 15, further comprising forming the additional routing structures to comprise:
additional tungsten routing structures over the storage node devices;
additional copper routing structures over and in electrical communication with the tungsten routing structures; and
aluminum pad structures over and in electrical communication with the additional copper routing structures.

18. A microelectronic device, comprising:
array regions individually comprising:
memory cells comprising access devices and storage node devices;
digit lines coupled to the access devices and extending in a first direction;
word lines coupled to the access devices and extending in a second direction orthogonal to the first direction; and
control logic devices vertically offset from and in electrical communication with the memory cells;
digit line exit regions horizontally alternating with the array regions in the first direction and individually comprising:
portions of the digit lines extending beyond the array regions adjacent thereto;
contact pad structures underlying the portions of the digit lines;
digit line contact structures extending through at least some of the portions of the digit lines to the contact pad structures;
routing structures underlying the contact pad structures and in electrical communication with some of the control logic devices; and
contact structures extending from the contact pad structures to the routing structures; and
word line exit regions horizontally alternating with the array regions in the second direction and individually comprising:
portions of the word lines extending beyond the array regions adjacent thereto;
additional contact pad structures underlying the portions of the word lines;
word line contact structures extending through at least some of the portions of the word lines to the additional contact pad structures;
additional routing structures underlying the additional contact pad structures and in electrical communication with some other of the control logic devices; and
additional contact structures extending from the additional contact pad structures to the additional routing structures.

19. The microelectronic device of claim 18, further comprising:
first back-end-of-line (BEOL) structures overlying the memory cells and the control logic devices and in electrical communication with one or more deep contact assemblies in electrical communication with one or more of the control logic devices; and
second BEOL structures underlying the memory cells and the control logic devices and in electrical communication with the one or more deep contact assemblies.

20. The microelectronic device of claim 19, wherein:
the first BEOL structures comprise:
first routing structures comprising copper overlying the memory cells and the control logic devices; and
first pad structures comprising aluminum overlying and coupled to the first routing structures; and
the second BEOL structures comprise:
second routing structures comprising copper underlying the memory cells and the control logic devices; and
second pad structures comprising aluminum underlying and coupled to the second routing structures.

21. The microelectronic device of claim 19, further comprising socket regions horizontally offset from the array regions, the digit line exit regions, and the word line exit regions, the socket regions individually comprising the one or more deep contact assemblies.

22. The microelectronic device of claim 21, wherein the socket regions further comprise additional control logic devices having different configurations and operational functions than the control logic devices.

23. The microelectronic device of claim 22, wherein the socket regions further comprise capacitors in electrical communication with one or more of at least some of the control logic devices and at least some of the additional control logic devices.

24. The microelectronic device of claim 18, wherein the control logic devices within each array region of the array regions comprise:
sense amplifier devices within multiple sense amplifier regions positioned proximate corners of the array region diagonally opposing one another; and
sub-word line driver devices within multiple sub-word line driver regions positioned proximate additional corners of the array region diagonally opposing one another.

25. The microelectronic device of claim 24, wherein, for each sense amplifier region of the multiple sense amplifier regions within the array region:
some of the sense amplifier devices within the sense amplifier region are in electrical communication with some of the digit lines extending through the array region; and
some other of the sense amplifier devices within the sense amplifier region are in electrical communication with some of the digit lines extending through an additional one of the array regions neighboring the array region.

26. The microelectronic device of claim 25, wherein:
the some of the sense amplifier devices are in electrical communication with the some of the digit lines extending through the array region by way of some of the digit line contact structures, some of the contact pad structures, some of the contact structures, and some of the routing structures within one of the digit line exit regions interposed between the array region and the additional one of the array regions; and
the some other of the sense amplifier devices are in electrical communication with the some of the digit lines horizontally extending through the additional one of the array regions by way of some other of the digit line contact structures, some other of the contact pad structures, some other of the contact structures, and some other of the routing structures within the one of the digit line exit regions.

27. The microelectronic device of claim 24, wherein, for each sub-word line driver region of the multiple sub-word line driver regions within the array region:
some of the sub-word line driver devices within the sub-word line driver region are in electrical communication with some of the word lines extending through the array region; and
some other of the sub-word line driver devices within the sub-word line driver region are in electrical communication with some of the word lines extending through an additional one of the array regions neighboring the array region.

28. The microelectronic device of claim 27, wherein:
the some of the sub-word line driver devices are in electrical communication with the some of the word lines extending through the array region by way of some of the word line contact structures, some of the additional contact pad structures, some of the additional contact structures, and some of the additional routing structures within one of the word line exit regions interposed between the array region and the additional one of the array regions; and
the some other of the sub-word line driver devices are in electrical communication with the some of the word lines extending through the additional one of the array regions by way of some other of the word line contact structures, some other of the additional contact pad structures, some other of the additional contact structures, and some other of the additional routing structures within the one of the word line exit regions.

29. The microelectronic device of claim 18, wherein each of the contact pad structures and each of the additional contact pad structures comprise copper.

30. An electronic system, comprising:
an input device;
an output device;
a processor device operably connected to the input device and the output device; and
a memory device operably connected to the processor device and comprising:
memory array regions each comprising dynamic random access memory (DRAM) cells, digit lines coupled to the DRAM cells, word lines coupled to the DRAM cells, and control logic devices vertically offset from and in electrical communication with the DRAM cells;
a digit line contact region between two of the memory array regions neighboring one another in a first direction, the digit line contact region comprising:
end portions of some of the digit lines extending past horizontal areas of the two of the memory array regions;
conductive pads vertically underlying the some of the digit lines;
digit line contacts vertically extending through the end portions of the some of the digit lines to the conductive pads;
conductive routing vertically underlying the conductive pads; and
conductive contacts vertically extending from the conductive pads to the conductive routing; and
a word line contact region between two other of the memory array regions neighboring one another in a second direction perpendicular to the first direction, the word line contact region comprising:
end portions of some of the word lines extending past horizontal areas of the two other of the memory array regions;
additional conductive pads vertically underlying the some of the word lines;
word line contacts vertically extending completely through the end portions of the some of the word lines to the additional conductive pads;
additional conductive routing vertically underlying the additional conductive pads; and
additional conductive contacts vertically extending from the additional conductive pads to the additional conductive routing.

* * * * *

UNITED STATES PATENT AND TRADEMARK OFFICE
CERTIFICATE OF CORRECTION

PATENT NO. : 11,776,925 B2
APPLICATION NO. : 17/364429
DATED : October 3, 2023
INVENTOR(S) : Fatma Arzum Simsek-Ege It is certified that error appears in the above-identified patent and that said Letters Patent is hereby corrected as shown below:

In the Specification

| Column 2, | Line 12, | change "a memory, array of" to --a memory array of-- |
| Column 15, | Line 60, | change "Vaa regulators," to --$V_{dd}$ regulators,-- |
| Column 20, | Line 61, | change "(FIG. 6B through 6D)," to --(FIGS. 6B through 6D),-- |
| Column 22, | Line 7, | change "depth Di" to --depth $D_1$-- |
| Column 22, | Line 18, | change "depth Di" to --depth $D_1$-- |

Signed and Sealed this
Sixth Day of February, 2024

Katherine Kelly Vidal
*Director of the United States Patent and Trademark Office*